United States Patent [19]

Mitsuishi et al.

[11] Patent Number: 5,736,948
[45] Date of Patent: Apr. 7, 1998

[54] SEMICONDUCTOR INTEGRATED CIRCUIT DEVICE AND CONTROL SYSTEM

[75] Inventors: Naoki Mitsuishi, Kodaira; Hiroyuki Kobayashi, Higashimurayama; Hiroshi Saito, Koganei; Mitsumasa Satoh, Ome, all of Japan

[73] Assignee: Hitachi, Ltd., Tokyo, Japan

[21] Appl. No.: 592,974

[22] Filed: Jan. 29, 1996

[30] Foreign Application Priority Data

Mar. 20, 1995 [JP] Japan ................. 7-085928

[51] Int. Cl.[6] ................. H03M 1/00
[52] U.S. Cl. ................. 341/141; 341/142; 341/156; 341/159
[58] Field of Search ................. 341/141, 142, 341/155, 181, 158, 159, 164, 165, 156

[56] References Cited

U.S. PATENT DOCUMENTS

| | | | |
|---|---|---|---|
| 4,745,393 | 5/1988 | Tsukada et al. | 340/347 AD |
| 5,281,866 | 1/1994 | Rundel | 307/296.3 |
| 5,293,167 | 3/1994 | Campbell, Jr. et al. | 341/141 |
| 5,471,210 | 11/1995 | Wingender et al. | 341/156 |
| 5,581,254 | 12/1996 | Rundel | 341/155 |

FOREIGN PATENT DOCUMENTS

| | | |
|---|---|---|
| 60-124125 | of 1985 | Japan . |
| 61-292420 | of 1986 | Japan . |
| 62-110320 | of 1987 | Japan . |
| 1-134619 | of 1989 | Japan . |

*Primary Examiner*—Marc S. Hoff
*Assistant Examiner*—Jason L.W. Kost
*Attorney, Agent, or Firm*—Loudermilk & Associates

[57] ABSTRACT

In a semiconductor integrated circuit device having an A/D converter incorporated therein, a plurality of input channels are provided and input analog signals supplied therefrom are respectively held by a plurality of sample-to-hold circuits. The analog signals are simultaneously sampled by using such a pipeline operation that a first sampling is performed so that an analog signal held by the first sampling is A/D-converted and a second sampling is performed so that an analog signal held by the second sampling is A/D-converted, and the plurality of sample-to-hold circuits.

6 Claims, 33 Drawing Sheets

SELECT/SCAN MODE (SELECT CHANNEL 1)

GROUP/SCAN MODE (SELECT CHANNELS 0 TO 2)

BUFFER OPERATION: SELECT/SCAN MODE

BUFFER OPERATION: GROUP/SCAN MODE

SIMULTANEOUS SAMPLING OPERATION:GROUP/SINGLE MODE

SIMULTANEOUS SAMPLING OPERATION: GROUP/SCAN MODE

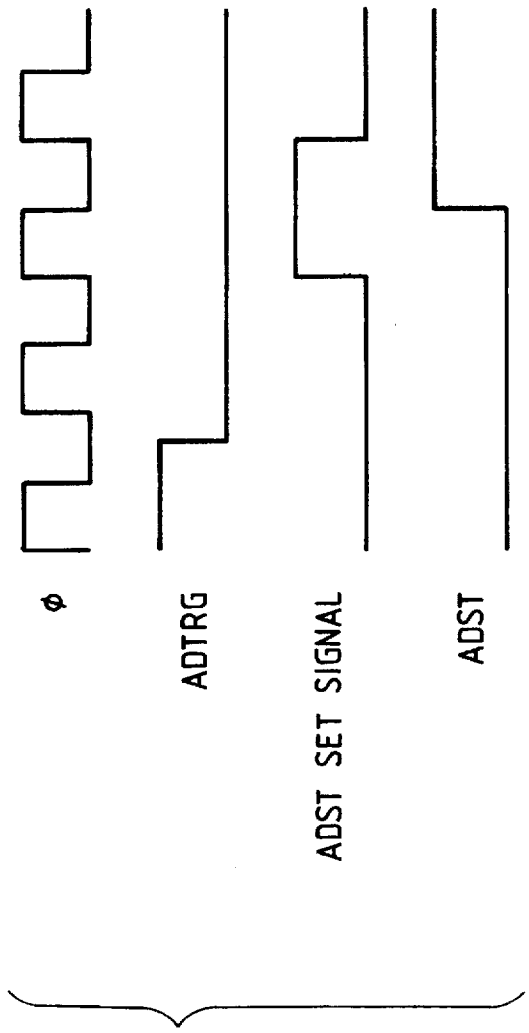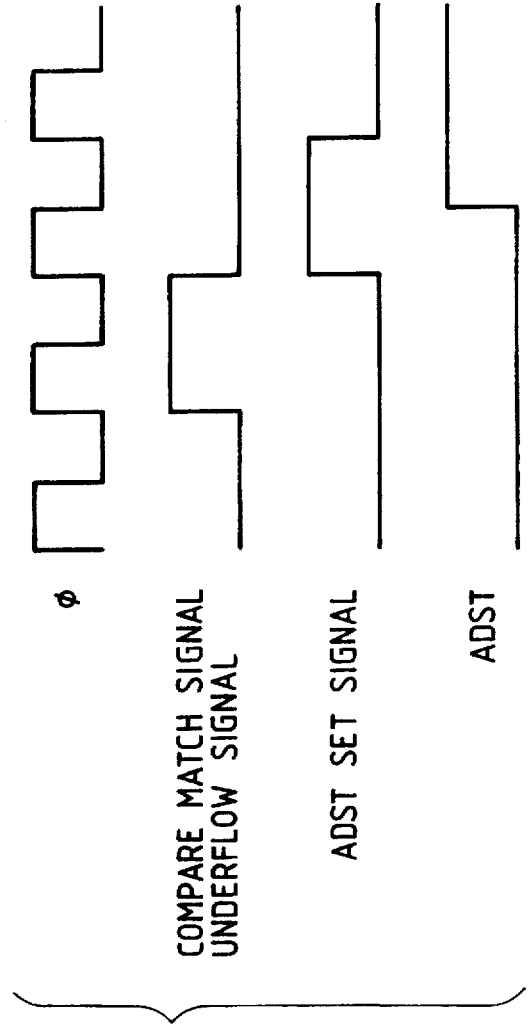
FIG. 32(A)
FIG. 32(B)

FIG. 34
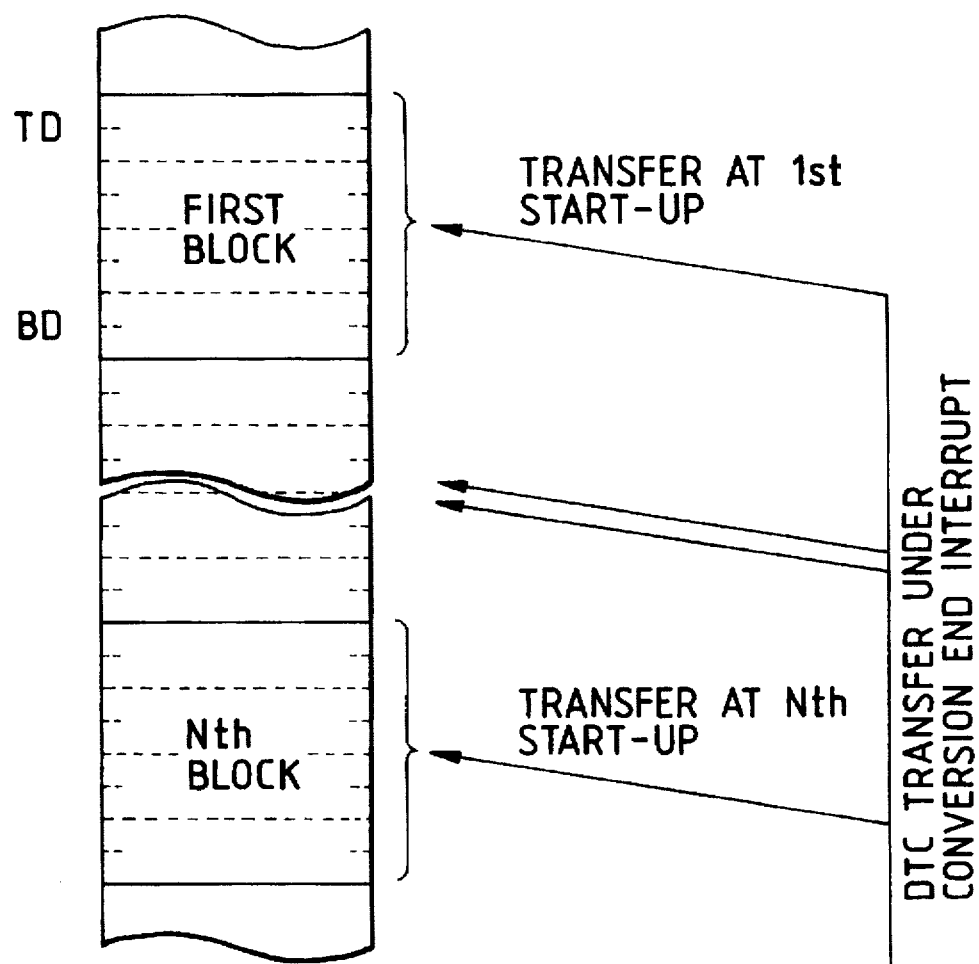
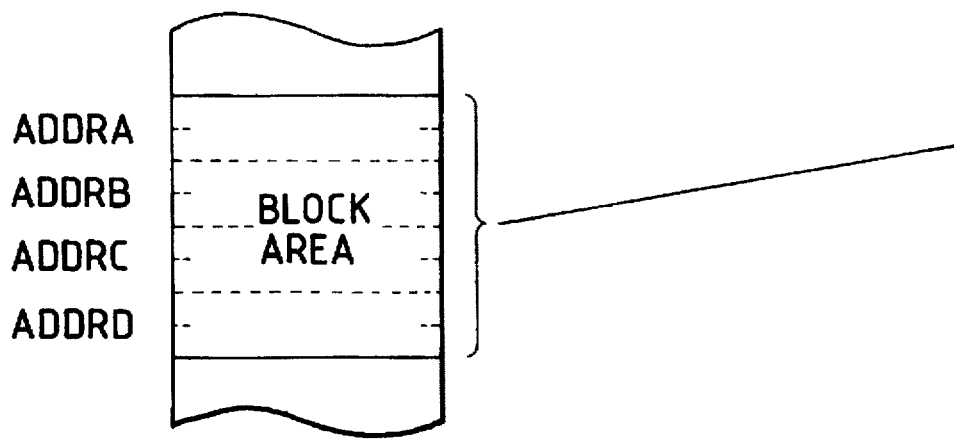

SEMICONDUCTOR INTEGRATED CIRCUIT DEVICE AND CONTROL SYSTEM

BACKGROUND OF THE INVENTION

The present invention relates to a semiconductor integrated circuit device and a control system, and particularly to a technique effective for use in a single chip microcomputer having an analog-to-digital converter incorporated therein and a control system using the single chip microcomputer.

As has been described in the "LSI Handbook" published by Kabushiki Kaisha Ohm, Nov. 30, 1984, pp. 540–541, a single chip microcomputer has been shown wherein functional blocks such as a program holding ROM (Read Only Memory), a data holding RAM (Random Access Memory), an input/output circuit for inputting and outputting data, etc. are formed on a single semiconductor substrate with a central processing unit (CPU) as the center. The input/output circuit includes an A/D (Analog/Digital) converter. As an example of a single chip microcomputer having the A/D converter incorporated therein, there is known one disclosed in the "H8/3003 Hardware Manual" published by Hitachi, Ltd., March 1993.

As an example of a high-speed A/D converter, there are known ones disclosed in Japanese Patent Application Laid-Open Nos. 60-124125 and 2-126726, for example. The high-speed A/D converter includes a plurality of sample-to-hold circuits and is speeded up by adopting a common A/D converter circuit and a pipeline (that the conversion of the result of the previous sampling and the next sampling are simultaneously performed, in other words, the sampling circuits are alternately activated). As a subrange type A/D conversion system, there is known one disclosed in Japanese Patent Application Laid-Open No. 4-176215, for example, which has been speeded up by performing partial flash conversion without so increasing a circuit scale.

SUMMARY OF THE INVENTION

A plurality of analog input channels provided within an A/D converter incorporated in a single chip microcomputer differ from one another according to systems using these analog input channels. When a motor is controlled, for example, a value obtained by voltage-converting a motor drive current is inputted. If the motor is under the control of three phases, then the number of analog inputs needs 3 to 6 channels. If the values of currents corresponding to two phases alone may be detected, then the number of analog inputs may be two channels. It is necessary for the system to input an atmospheric temperature, a motor temperature, etc. as analogs. When it is desired to drive the motor based on the output of a timer incorporated in the system, it is desirable that the drive current of the motor is measured in a short time from desired timing of the timer. When the value of a current corresponding to a third phase is determined by calculation, it is desirable that the current values of the two phases to be measured are calculated so as to obtain analog values at the same point in time, i.e., they are simultaneously sampled. By speeding up an A/D conversion operation and simultaneously obtaining a plurality of analog inputs, the current values can be obtained more accurately in the predetermined timing of the timer and the accuracy of control on the driving of the motor can be improved. On the other hand, the frequency of detection of the atmospheric temperature, the motor temperature, etc. may be reduced and performed in timing independent of driving timing of the motor.

Necessary resolutions often differ from each other according to input analog values. For example, the motor drive current needs a 10-bit resolution but there are cases where a 8-bit resolution is sufficient for the atmospheric temperature and the like. Since the result of conversion is rightmost-aligned in the example of the single chip microcomputer having the A/D converter incorporated therein, only high-order bytes may be read when the 8-bit resolution is obtained. When the 10-bit resolution is needed, two bytes may be read. When, however, the result of A/D conversion corresponding to 10 bits is processed as other 10-bit data, for example, any one of them must be shifted by 6 bits. When the processing on the shift of such a data bit is performed by software, a burden imposed thereon cannot be necessarily neglected.

It is convenient if startups for the A/D conversion operation based on software and an external trigger terminal used as factors for starting up the A/D conversion operation can be selected. Further, convenience is offered if the A/D conversion operation is started up even by a compare match of the timer in order to make general versatility. When the motor is controlled based on a waveform output resultant from the compare match of the timer, the utilization of such a compare match is rendered effective in simultaneously monitoring motor drive currents. As conversion modes, can be considered a mode for performing one A/D conversion alone, a repeatedly A/D-converting mode, a mode for A/D-converting one channel, a mode for continuously A/D-converting a plurality of channels, etc.

When the plurality of input channels, start-up factors and conversion modes are included, they are correlated with one another in a system using a microcomputer. In the example of the above motor, for example, the values of a plurality of channels each inputted with the value obtained by voltage-converting the motor drive current are started up under the compare match of the timer and input analog signals supplied to the plurality of channels are A/D-converted. It is inconvenient even when a decision is made as to the result of A/D conversion on a single drive current and a decision is made as to the result of A/D conversion based on other start-up factors. On the other hand, input analog signals supplied to channels inputted with an atmospheric temperature, a motor temperature, etc. are respectively independently A/D-converted in timing independent of the drive timing of the motor, e.g., by software.

Further, an interrupt is triggered at the completion of the A/D conversion so that a so-called data transfer controller DTC is started up. Thus, the result of A/D conversion can be transferred to a memory (Random Access Memory; RAM) by the so-called data transfer controller DTC. When, however, the A/D conversion is repeatedly effected on a plurality of channels in a so-called scan mode, an A/D conversion end interrupt is produced upon completion of the conversion of all the designated channels, so that the data transfer controller DTC is started up. On the other hand, the A/D converter starts A/D conversion again from the first channel. The time between the start-up of the data transfer controller DTC and the execution of actual data transfer varies according to other operating conditions. In the example of the single chip microcomputer, however, 35 states are necessary for the data transfer. An A/D conversion time per channel of the A/D converter in the single chip microcomputer corresponds to 135 states. When it is however desired to make the A/D conversion time faster than a data transfer time of the single chip microcomputer (faster than 35 states) while the data transfer time of the single chip microcomputer remains at 35 states, there is a possibility that the next A/D conversion operation is completed before the reading of the result of A/D conversion by the data transfer controller DTC. For example, a first channel of a plurality of channels becomes the result of A/D conversion corresponding to a second time and others become the result of A/D conversion corresponding to a first time, thus resulting in the potential that the first result of A/D conversion on the first channel is lost.

No consideration is given to the fact that the high-speed A/D converter is incorporated in the single chip microcomputer. An object of the A/D converter is to convert a single address input continuously and at high speed. Even if the analog input A/D-converted continuously and at high speed exists as plural, no consideration is given to the fact that a decision is made as to the plurality of different analog inputs. Even if a plurality of sampling circuits exist, they are not effectively used in the application field that eliminates the need for the continuous and high-speed A/D conversion. Various cases about the analog inputs employed in the single chip microcomputer or the like are considered wherein necessary resolutions differ from one another every analog inputs, the analog inputs need continuous or single A/D conversion, a pipeline operation is made useless, the analog inputs can be processed at high speed, the sample-to-hold circuits or the like come to nothing, and relative values of a plurality of analog inputs become important.

The result of conversion by the A/D converter must be processed by CPUs. The result of conversion based on transferred data values is read, for example, for temporary saving of the result of conversion. The CPUs are not always able to read and process the result of conversion according to the state of operation of the DTC. When the result of conversion by the A/D converter is read by each CPU, the aforementioned single chip microcomputer needs 6 states to execute a command. When the conversion operation of the A/D converter is made fast, the time necessary for the conversion operation becomes a time equivalent to the time necessary for the read operation of each CPU, thereby causing inconvenience that the CPU cannot execute other processes. Thereafter, the CPU performs desired data processing based on the result of reading. It is necessary to reduce burdens necessary for the reading and processing in order to speed up the entire single chip microcomputer. It is desirable that the current to be consumed by an A/D converter incorporated in a semiconductor integrated circuit device is small.

An object of the present invention is to provide a semiconductor integrated circuit device incorporating therein an A/D converter simple in structure and suitable for the variety of uses, and a control system. The above and other objects and new features of the present invention will become apparent from the following description of the present specification and the accompanying drawings.

A summary of typical ones of the invention disclosed in the present application will be briefly described as follows:

(1) In a semiconductor integrated circuit device having an A/D converter incorporated therein, a plurality of input channels are provided and input analog signals inputted from the respective channels are respectively held by a plurality of sample-to-hold circuits associated with the respective channels. The analog signals are simultaneously sampled by using a pipeline operation that a first sampling is performed so that an analog signal held by this sampling is A/D-converted and a second sampling is performed so that an analog signal held by this sampling is next A/D-converted, and the plurality of sample-to-hold circuits.

(2) In the semiconductor integrated circuit device incorporating the A/D converter therein, the A/D converter includes a normal mode for performing an A/D conversion operation in immediate response to a start-up signal and a standby mode for causing only the necessary minimum bias current to flow and performing an A/D conversion operation after the elapse of a predetermined time interval between the input of the start-up signal and its stable operation.

(3) An output supplied to an internal bus is brought into alignment with the most significant bit or least most significant bit in association with a bus size upon reading the result of A/D conversion.

(4) In the semiconductor integrated circuit device having the A/D converter incorporated therein, when a repeated conversion operation is performed, a new A/D conversion operation is stopped till the completion of the reading of data about the result of A/D conversion.

According to the above means:

(1) Since the A/D converter can perform parallel processing on a plurality of input data and effectively eliminate a sampling time by performing a pipeline process, an A/D conversion operation can be speeded up when the plurality of analog input signals are continuously A/D-converted. By simultaneously holding the plurality of analog input signals and thereafter successively A/D-converting them, the reliability of a control operation that relative values of a plurality of analog values are regarded as important, can be increased without increasing a circuit scale.

(2) Less power consumption can be provided by a reasonable A/D conversion operation commensurate with a converted input signal without imposing any burden on a central processing unit.

(3) The result of A/D conversion can be efficiently captured without imposing any burden on the central processing unit.

(4) The mutual relationship between a plurality of converted data can be maintained when the repeated A/D conversion operation is made.

BRIEF DESCRIPTION OF THE DRAWINGS

The invention will be described with reference to the accompanying drawings wherein:

FIG. 32 is a timing chart for describing a start-up operation of the A/D converter by an external input and a timer;

FIG. 34 is an address map for reading addresses from the A/D converter by a data transfer controller employed in the present invention under its block transfer mode.

DETAILED DESCRIPTION OF THE PREFERRED EMBODIMENTS

Figure 1:
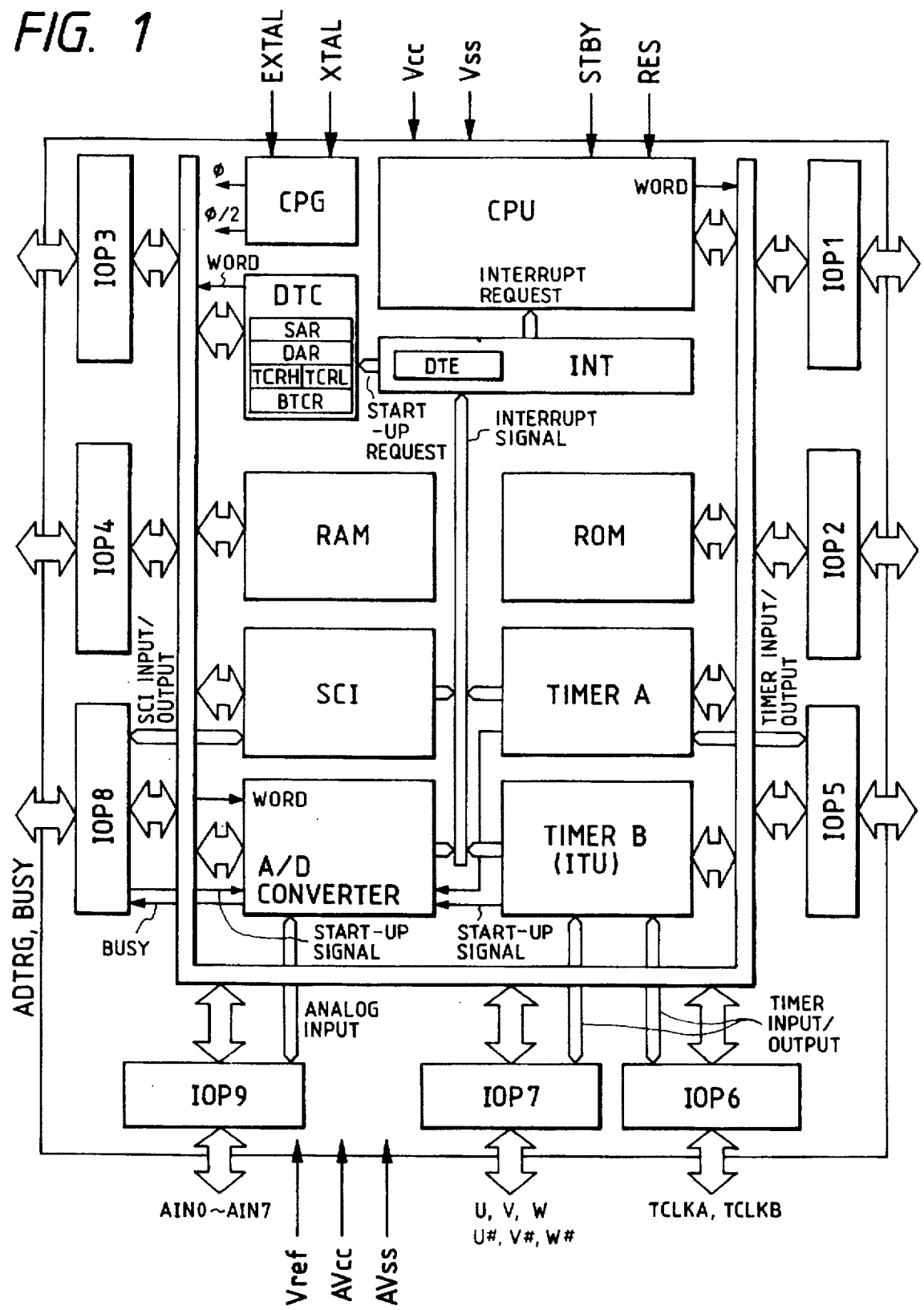
FIG. 1 is a block diagram showing one embodiment of a single-chip microcomputer to which the present invention is applied.

FIG. 1 is a block diagram showing one embodiment of a single chip microcomputer to which the present invention is applied. Respective circuit blocks shown in the same drawing are formed on a single semiconductor substrate such as monocrystalline silicon by a known semiconductor integrated circuit manufacturing technique.

The single chip microcomputer according to the present embodiment comprises a central processing unit CPU, a clock generating circuit CPG, a data transfer controller DTC, an interrupt controller INT, a read only memory ROM having programs and the like stored therein, a random access memory RAM used for temporarily storing data therein, timers A and B (ITU), a serial communication interface SCI, an A/D converter, and respective functional blocks or modules of first through ninth input/output ports IOP1 through IOP9. The functional blocks or modules are electrically mutually connected to one another by an internal bus. The internal bus may include a control bus for transmitting a read signal and a write signal as well as an address bus and a data bus. Further, the internal bus may also include a bus for a bus size signal (WORD) or a system clock or the like. The functional blocks or modules are read/written by the central processing unit CPU or the data transfer controller DTC through the internal bus. Although no particular limitation is imposed on the internal bus, the width of the internal bus is composed of 16 bits.

In the single chip microcomputer according to the present invention, terminals for a ground potential Vss, a source voltage Vcc, an analog ground potential AVss, an analog source voltage AVcc, an analog reference voltage Vref are provided as power terminals. As other dedicated control terminals, there are provided terminals for reset RES, standby STBY, mode control MD0 and MD1, clock inputs EXTAL and XTAL, etc.

The individual input/output ports also serve as the address bus, data bus and terminals for a bus control signal or inputs and outputs of the timers, serial communication interface SCI and A/D converter. Namely, the timers, serial communication interface SCI and A/D converter respectively have input/output signals and perform input/output operations on the outside through the terminals doubled as the input/output ports. For example, the fifth port IOP5, the sixth port IOP6 and the seventh port IOP7 respectively double as input/output terminals (signals outputted from the timer B include U, V and W and U#, V# and W# and signals inputted to the timer B include TCLKA and TCLKB) of the timers A and B. The eighth port IOP8 also serves as the input/output terminal of the serial communication interface SCI. The ninth port IOP9 doubles as terminals for analog data inputs AIN0 through AIN7. Further, the eighth port IOP8 also serves as terminals for an external trigger signal ADTRG and a busy signal BUSY.

Compare match signals, overflow signals and underflow signals produced from the timers A and B are supplied to the A/D converter as A/D conversion start trigger start-up signals. An interrupt signal is outputted from each of the A/D converter, the timers A and B and the serial communication interface SCI. In response to the interrupt signal, the interrupt controller INT controls whether an interrupt request signal should be supplied to the central processing unit CPU or a start-up request signal should be supplied to the data transfer controller DTC, based on the designation of a predetermined register or the like. This switching is carried out based on a DTE bit. Namely, when an interrupt factor occurs in a state in which the DTE bit has been set to "1", the start-up request signal is issued to the data transfer controller DTC. Further, when the transfer of data by the data transfer controller DTC is performed, the interrupt request is automatically cleared. On the other hand, when an interrupt factor takes place in a state in which the DTE bit has been cleared to "0", a start-up request signal is issued to the central processing unit CPU, which in turn performs a desired data process and clears a bit indicative of the interrupt factor after the desired data process.

Assuming that a transfer counter is set to 0, for example when a predetermined condition is established upon transfer of data by the data transfer controller DTC, the corresponding DTE bit is cleared to "0" without clearing the bit indicative of the interrupt factor to thereby cause the central processing unit CPU to trigger an interrupt request. Separate vectors and separate DTE bits are assigned to their corresponding interrupt factors.

A direct memory access controller DMAC or the like may be used as the data transfer device or controller in addition to the data transfer controller DTC described above. As one example of the aforementioned data transfer controller DTC, may be used one described in, for example, the "H8/532 Hardware Manual" published by Hitachi, Ltd., December 1988. As one example of the direct memory access controller DMAC, may be utilized one described in, for example, the "H8/3003 Hardware Manual" published by Hitachi, Ltd., March 1993.

As has been described in the "H8/3003 Hardware Manual" or Japanese Patent Application No. 4-137954, each of the data transfer devices or controllers (DTC/DMAC) makes it possible to transfer a plurality of units of data in one start-up, i.e., allows a so-called block transfer mode. Each of the data transfer controllers includes a source address register SAR, a destination address register DAR, a block size counter TCRH, a block size holding register TCRL and a block transfer counter BTCR and transfers data in block units.

The timer B (ITU; integrated Timer Unit) includes timer counters and compare registers (GRA through GRD) and up/down counts with the timer counters 0 to GRA (value set to register GRA). When the count is brought to 0 by downcount, the timer B generates an underflow signal. When the count coincides with the set value of the GRA by upcount, the timer B produces a compare match A. When the count coincides with values set to the compare registers GRB through GRD in the course of this processing, timer outputs are changed. The timer outputs respectively have positive-phase/negative-phase outputs. Thus, for example, a complementary three-phase PWM (Pulse Width Modulation) output can be formed. The complementary three-phase PWM output has been described in the "H8/3003 Hardware Manual" pp. 374–381 or the like. A counter for setting a non-overlap time interval during the formation of the positive-phase/negative-phase output may be added.

Figure 2:
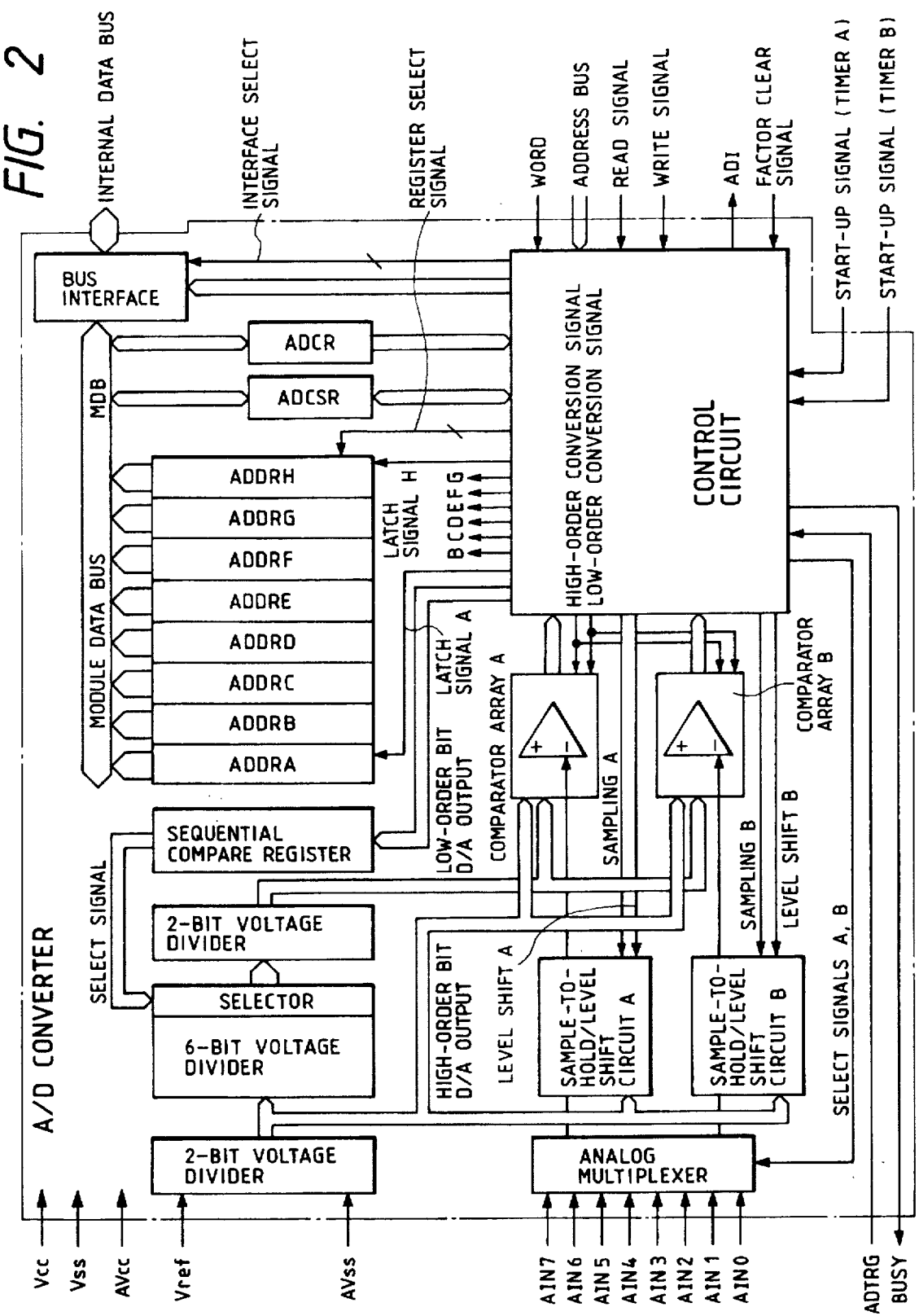
FIG. 2 is a block diagram illustrating one example of an A/D converter mounted in the single chip microcomputer shown in FIG. 1.

FIG. 2 is a block diagram showing one example of the A/D converter mounted in the single chip microcomputer to which this invention is applied. The A/D converter comprises a control circuit, a bus interface, control registers ADCSR and ADCR, data registers ADDRA through ADDRH, resistance type potential divider circuits for performing 2-bit potential or voltage divider, 6-bit voltage divider and 2-bit voltage divider (D/A conversion), an analog multiplexer, sample-to-hold/level shift circuits A and B, comparator arrays (differential amplifiers) A and B, and a sequential compare register.

The power supplies (Vcc, Vss, AVcc, AVss and Vref), analog inputs AIN0 through AIN7, and an external trigger signal ADTRG are supplied to the A/D converter as the inputs supplied from the outside of the single chip microcomputer. The start-up signals outputted from the timers A and B, the address signal from the address bus, the read signal, the write signal, the bus size signal, and a factor clear signal are supplied to the A/D converter as internal signals for the single chip microcomputer. The input and output of data between the A/D converter and the internal data bus are made through the bus interface. Further, the A/D converter outputs an interrupt signal ADI. The interrupt signal ADI is supplied to the interrupt controller INT as the start-up signal for the data transfer controller DTC or the interrupt request for the central processing unit CPU.

The control circuit performs the input and output of data between the internal data bus, and the control registers ADCSR, ADCR and the data registers ADDRA through ADDRH based on the address signal from the address bus, the read signal and the write signal, which are supplied from the central processing unit CPU. The control circuit is supplied with the external trigger signal ADTRG and the start-up signals outputted from the timers A and B. The control circuit controls an analog input operation based on the contents stored in the control registers ADCSR and ADCR. Further, the control circuit outputs the above interrupt signal ADI therefrom.

The central processing unit CPU allows the control registers ADCSR and ADCR to perform read/write operations through the internal data bus and the bus interface and instructs the control registers ADCSR and ADCR to activate the control circuit, whereby the control registers display the state of the analog inputs. Namely, the data stored in the control registers ADCSR and ADCR show selection of analog input terminals (hereinafter called "input channels"), selection of conversion modes for the A/D converter, etc. The A/D conversion modes include a select mode for converting one channel to another, a group mode for converting a plurality of channels to others, a single mode for performing one channel conversion and a scan mode for repeatedly performing channel conversion as will be described later.

The control register ADCSR is of an A/D control/status register, which is also called a register capable of performing a 8-bit read R or write W operation. This register controls the operation for A/D conversion and displays the status of the operation for A/D conversion. Upon resetting, the register ADCRS is initialized to H'00 (initial value). Its bit configuration will be shown in the following table 1.

TABLE 1

| | bits | | | | | | | |
|---|---|---|---|---|---|---|---|---|
| | 7<br>ADF | 6<br>ADIE | 5<br>ADST | 4<br>CKS | 3<br>GRP | 2<br>CH2 | 1<br>CH1 | 0<br>CH0 |
| Initial-value | 0 | 0 | 0 | 0 | 0 | 0 | 0 | 0 |
| R/W | R/(W)* | R/W | R/W | R/W | R/W | R/W | R/W | R/W |

The ADF of the bit 7 is of a status flag indicative of the completion or end of A/D conversion. A clear condition is met when "0" is written into an ADF flag after the ADF flag has been read in a state of ADF="1" or when the data transfer controller DTC or DMAC is started up in accordance with an interrupt developed incident to the interrupt signal ADI. A set condition is met when analog signals supplied to all the designated channels have been A/D-converted upon the single mode and when all the designated channels have been A/D-converted round upon the scan mode.

The ADIE of the bit 6 selects permission to or prohibition against the interrupt (ADI) request made incident to the completion of the A/D conversion. When the ADIE="0", the interrupt (ADI) request made incident to the end of the A/D conversion is prohibited. On the other hand, when the ADIE="1", the interrupt (ADI) request made based on the completion of the A/D conversion is allowed.

The ADST of the bit 5 selects the start or stop of the A/D conversion. While the A/D conversion is being made, the ADST is maintained at "1". The ADST is set to "1" based on the external trigger signal ADTRG supplied through an A/D external trigger input terminal or the trigger signal outputted from the timer. When the ADST="0", the A/D conversion remains stopped. If the single mode is selected when the ADST="1", then the A/D conversion is started. When the conversion of the specified channels is finished, the ADST is automatically cleared to "0". If the scan mode is selected when the ADST="1", the A/D conversion is started and the central processing unit CPU continuously performs the A/D conversion until the ADST is cleared to "0" by software.

The CKS of the bit 4 is of a clock select signal for selecting a cycle or period of a clock signal ($\phi$ or $\phi/2$) generated from the clock generating circuit CPG and sets an A/D conversion time. The switching of the A/D conversion time is made while the A/D conversion is at a stop. When the CKS="0", the A/D conversion time is brought to 20 states (the reference clock $\phi$ is selected), whereas when the CKS="1", the A/D conversion time becomes 40 states (the reference clock $\phi/2$ is selected).

The GRP of the bit 3 is of a group mode signal and designates the selection of the A/D conversion channel to either the select mode or the group mode. The GRP bit is set while the A/D conversion is at a stop. When the GRP="0", the select mode is specified, whereas when the GRP="1", the group mode is specified.

The bits 2 through 0 are respectively of channel select signals. Each of the bits serves so as to select an analog input channel together with the GRP bit. The input channel is set during the stop of the A/D conversion. When the GRP="0" and the select mode is designated, any one of the analog input signals AIN0 through AIN7 is selected by the combination of the above 3 bits CH2 through CH0. When the GRP="1" and the group mode is designated, each individual combination of the AIN0 through AIN7 is determined by a combination of the bits CH1 and CH2 of the above 3 bits CH2 through CH0. Simultaneous sampling is performed by a combination of the analog signals AIN0 and AIN1 at the time CH2=0 and CH1=0, a combination of the analog input signals AIN2 and AIN3 at the time CH2=0 and CH1=1, a combination of the analog signals AIN4 and AIN5 at the time CH2=1 and CH1=0, and a combination of the analog input signals AIN6 and AIN7 at the time CH2=1 and CH1=1.

The control register ADCR is of an A/D control register, which is also called a register capable of performing a 8-bit read R or write W operation. This register controls the operation for A/D conversion. The register ADCR is initialized to H' 00 (initial value) upon resetting. Its bit configuration will be shown in the following table 2.

TABLE 2

| | bits | | | | | | | |
|---|---|---|---|---|---|---|---|---|
| | 7 INF | 6 PWR | 5 TRGS1 | 4 TRGS0 | 3 SCAN | 2 DSMP | 1 BUFE1 | 0 BUFE2 |
| Initialvalue | 0 | 0 | 0 | 0 | 0 | 0 | 0 | 0 |
| R/W | R/W | R/W | R/W | R/W | R/W | R/W | R/W | R/W |

The INF of the bit 7 is of an interval bit and designates or specifies an interval operation. When a BUSY signal is in an active state during the interval operation, a new A/D conversion operation is not started. By clearing the ADF flag to "0", the BUSY signal can be brought into the active state so as to start the new A/D conversion operation. The INF="0" shows a normal operation, whereas the INF="1" represents the above interval operation.

The PWR of the bit 6 is of a power-supply bit and sets a conversion start mode. As will be described in detail later, a high-speed conversion mode and a low power consumption mode are included as the conversion start mode.

The TRGS1 and TRGS0 of the bits 5 and 4 are respectively of timer trigger select bits. Each of the TRGS1 and TRGS0 selects permission to or prohibition against the start for A/D conversion based on the trigger signal. The TRGS1 and TRGS0 are set when the A/D conversion is at a stop. The following four case are selected by the combination of the above 2 bits TRGS1 and TRGS0. Namely, (1) only the start for A/D conversion is permitted by the central processing unit CPU (software), (2) the start for A/D conversion is allowed by the timer trigger (timer B), (3) the start for A/D conversion is permitted by the timer trigger (timer A) and (4) the start for A/D conversion is permitted through the external trigger terminal.

The SCAN of the bit 3 is of a scan mode and selects either the single mode or the scan mode as an operation mode for A/D conversion. The single mode and the scan mode will be described in detail later. When the SCAN="0", the single mode is selected. On the other hand, when the SCAN="1", the scan mode is selected.

The DSMP of the bit 2 is of a simultaneous sampling mode and permits or prohibits a simultaneous sampling operation for two channels. The simultaneous sampling operation will be described in detail later. When the DSMP="0", a normal sampling operation is selected. On the other hand, when the DSMP="1", the simultaneous sampling operation is selected.

The BUFE1 and BUFE0 of the bits 1 and 0 respectively show buffer enables and select whether the data registers ADDRA through ADDRD are used as buffer registers. Their buffer operations will be described later.

The central processing unit CPU allows the data registers ADDRA through ADDRH to perform read/write operations through the internal data bus and the bus interface. The data registers ADDRA through ADDRH respectively store analog input data, in other words, the results of A/D conversion therein. Although no particular limitations are imposed on the data registers ADDRA through ADDRH, they are respectively composed of 16 bits. When data A/D-converted as will be described later is 10 bits, the low-order 8 bits or the eight rightmost bits are transferred to and held at the low-order bytes (bits 7 to 0) and the two leftmost bits are transferred to and held at the high-order bytes (bits 9 and 8). Although bits 15 to 10 of the high-order bytes are not used, "0" is always read when they are read. In the present embodiment, the data is read so that any of bytes or words can be selected. Namely, an A/D converted output of a 10-bit resolution is read as a word mode and each of the 8 leftmost bits (bits 9 to 2) is read with an A/D converted output of a 8-bit resolution as a byte mode. The central processing unit CPU reads the data about the results of A/D conversion stored in the data registers ADDRA through ADDRH and executes predetermined operations. For example, the central processing unit CPU reads the values of motor drive currents corresponding to two phases, which are stored in predetermined data registers of the data registers ADDRA through ADDRH as a result of A/D conversion, and calculates the value of a current corresponding to a third phase.

The analog multiplexer selects any one of the analog inputs AIN0 through AIN7 in accordance with select signals A and B outputted from the control circuit based on data represented by the bits 0 to 2 (CH0 to CH2) of the control register ADCSR and the GRP. Further, the analog multiplexer takes in an analog signal corresponding to the selected one. The analog multiplexer may be included in the input/output port IOP9 shown in FIG. 1.

The sample-to-hold/level shift circuit samples an analog input signal selected by the analog multiplexer based on a sampling signal outputted from the control circuit and holds (stores) it therein. In the present embodiment, the two sample-to-hold/level shift circuits A and B are provided and are respectively supplied with sampling signals independent of each other. Therefore, the sample-to-hold/level shift circuits can sample the analog input signals in timings separated by the sampling signals A and B and simultaneously sample them.

Figure 4:
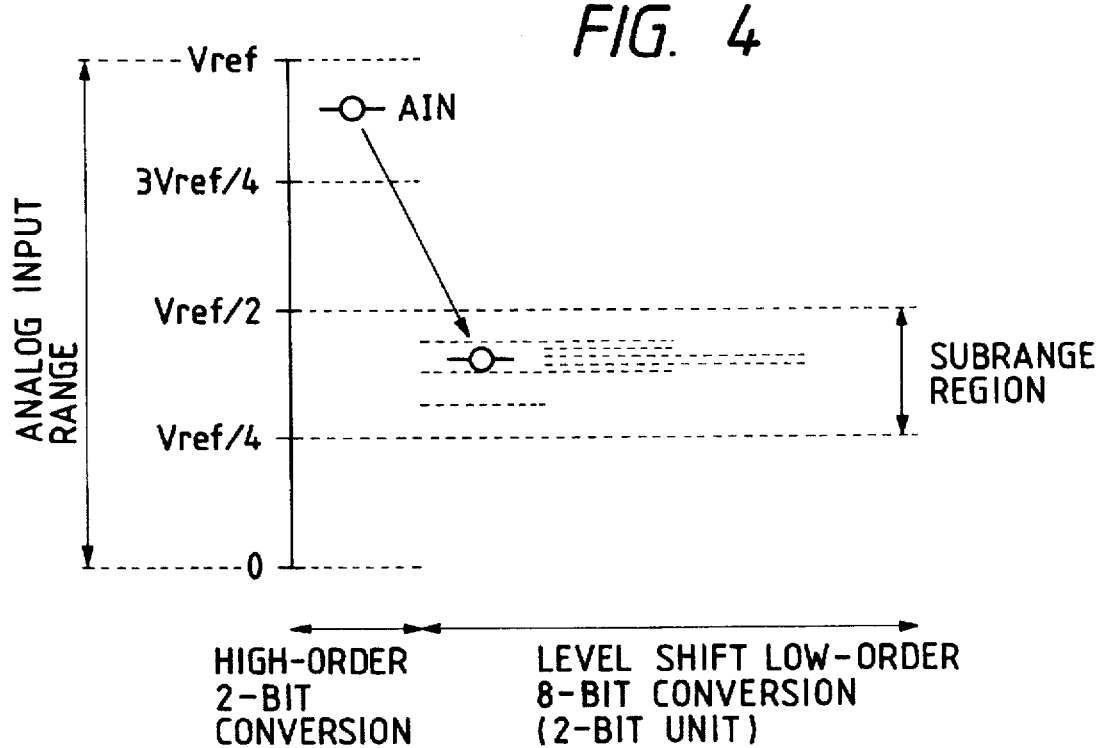
FIG. 4 is a voltage distribution diagram for describing a subrange voltage-conversion mode of the A/D converter shown in FIG. 2.

As shown in FIG. 4, the sample-to-hold/level shift circuits A and B respectively by-level shift the held input signals in response to level shift signals A and B outputted from the control circuit. Each level shift operation is performed based on the first result of A/D conversion. For example, each of the held input signals is shifted so as to fall within a subrange region between Vref/4 and Vref/2 of voltage ranges obtained by dividing an analog input range corresponding to the reference voltage Vref into quarters as will be described later.

Figure 5:
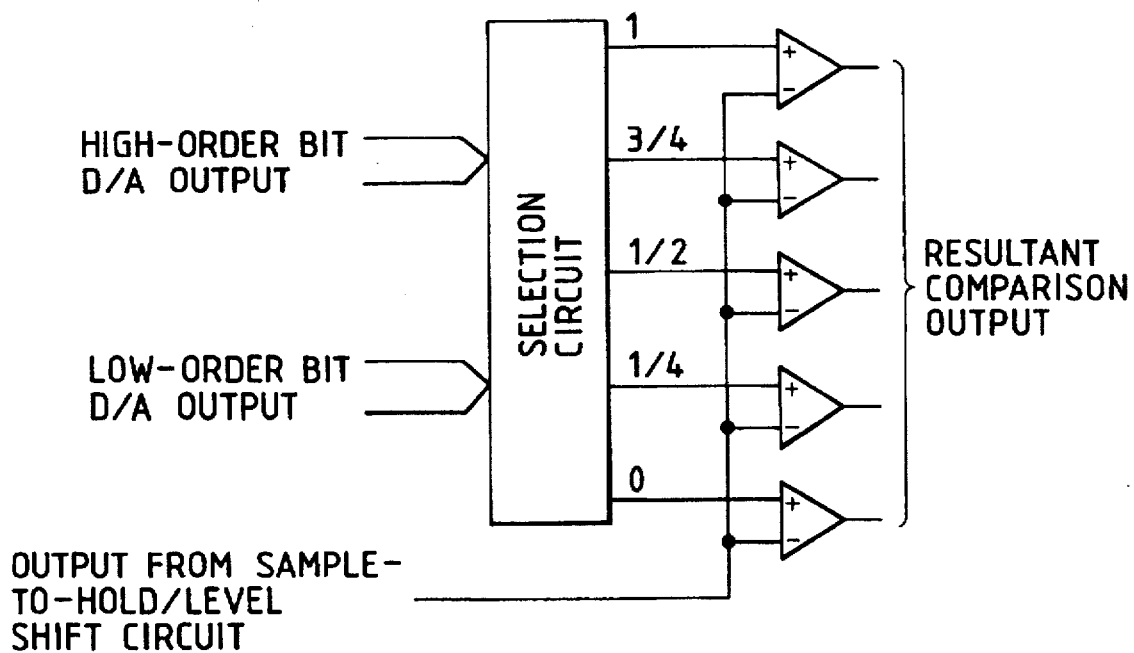
FIG. 5 is a schematic block diagram showing a comparator array of the A/D converter shown in FIG. 2.

As shown in FIG. 5, the comparator arrays A and B are respectively composed of five differential amplifier circuits. The comparator arrays A and B respectively compare the input signals held in the sample-to-hold/level shift circuits A and B with a plurality of reference voltages (five in the present embodiment) produced by the local resistance type voltage divider circuits and respectively output the results of comparison therefrom. Namely, comparisons corresponding to two bits can be simultaneously performed. The results of comparison outputted from the comparator arrays A and B are brought to binary-value signals, which are in turn stored in the sequential compare register.

Upon first comparison, the reference voltages are compared with the two leftmost bits of the resistance type voltage divider circuit. The level shift signals A and B are respectively formed based on the results of comparison. Each of the sample-to-hold/level shift circuits A and B by-level shifts the input signal held within the subrange region as described above. Conversion operations subsequent to a second conversion operation are performed in the following manner. Namely, 1/64 fractions or divided voltages are formed by the local voltage divider circuit (6-bit voltage divider) and the divided voltages of the 64 fractions, which correspond to two bits, are selected by the corresponding selector. A voltage obtained by making a further fraction between the selected divided voltages under 2-bit voltage divider is supplied to the comparator array A or B. By repeating such an operation, the conversion operation up to the least significant bit is carried out. Upon completion of the A/D conversion operation, the converted data held in the control circuit (sequential compare register) is transferred to any one of the data registers ADDRA through ADDRH.

When it is desired to set a 10-bit resolution, for example, it is necessary for the resistance type voltage divider circuits (D/A conversion) to make divided-voltages or fractions of a voltage range between the reference voltage Vref and the analog ground voltage AVss by 1024 resistances. In doing so, the number of resistances increases. Thus, in the present embodiment, the number of resistances is greatly reduced by separately providing the three voltage divider circuits of high-order 2-bit voltage division type, 6-bit voltage division type and low-order 2-bit voltage division type as described above. Namely, the resistance type voltage divider circuits employed in the present embodiment are made up of the high-order 2-bit voltage divider circuit and the local voltage divider circuits divided into the 6 bits and 2 bits. The high-order 2-bit voltage divider circuit form voltages Vref, 3Vref/4, Vref/2 and Vref/4, and 0V, which are respectively supplied to the level shift circuits and the comparator arrays.

The 6-bit local voltage divider circuit forms 64 divided-voltages obtained by making 1/64 fraction of a voltage range between the voltages Vref/4 and Vref/2. The selector is controlled based on the designation according to the contents in the sequential compare register so that the divided-voltages corresponding to respective two bits in order from the leftmost bit are outputted from the 6-bit local voltage divider circuit. The divided-voltage corresponding to each of the respective two bits is further voltage-divided by the low-order 2-bit voltage divider, followed by supply to each comparator array where they are used for the A/D conversion operation. The analog voltages AVcc and AVss are used as power supplies for analog units (multiplexer, sample-to-hold/level shift circuits, comparator arrays, etc.).

Figure 3:
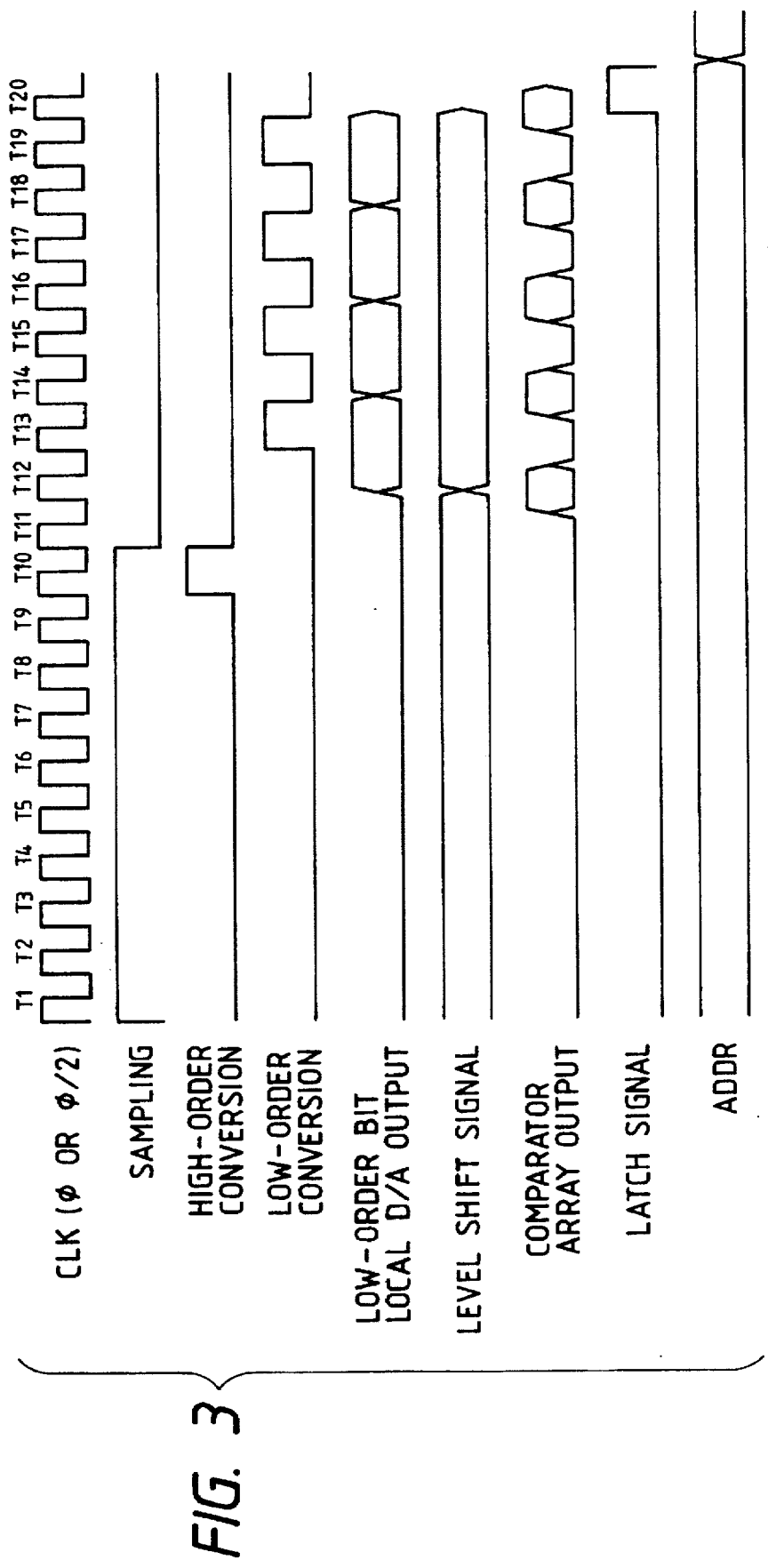
FIG. 3 is a basic timing chart for describing the operation of the A/D converter shown in FIG. 2.

FIG. 3 shows a basic timing chart for describing the operation of the A/D converter. The A/D converter employed in the present embodiment is activated in synchronism with an internal clock signal CLK of the selected one of $\phi$ and $\phi/2$ outputted from the clock generating circuit CPG in accordance with data stored at the bit 4 (CKS) of the control register ADCSR. During periods or time intervals from T1 to T10 of the clock signal CLK, a sampling signal is rendered active high in level and hence the analog input signal selected by the analog multiplexer is stored in its corresponding capacitor of the sample-to-hold/level shift circuit. The stored input signal is supplied to its corresponding comparator array.

A high-order conversion signal outputted from the control circuit in synchronism with the period of T10 of the clock signal CLK is brought to a high level and is then compared with the two leftmost bits. The result of comparison is outputted in synchronism with the next period T11 of the clock signal CLK. A Level shift signal is generated in synchronism with the period T12 of the clock signal CLK, based on the result of comparison referred to above and is transferred to its corresponding level shift circuit. Thus, a level shift operation is performed so that the above input signal falls within the subrange region from Vref/4 to Vref/2. Further, the subrange region of Vref/4 to Vref/2 is by-resistance divided based on a low-order 2-bit D/A output from the period T12 of the clock signal CLK and reference voltages of 5 levels (0, ¼, ½, ¾ and 1) necessary to divide it into four are generated.

During the period T13 of the clock signal CLK, a low-order conversion signal is rendered high in level and is compared with each of the third and fourth bits. The result of comparison is outputted from the period T13. Based on the result of comparison, a select signal is changed to change a local D/A output, whereby the voltage across the low-order 2-bit D/A is changed. If the result of comparison falls within a range of from 5Vref/16 to 6Vref/16, for example, then a voltage range from 5Vref/16 to 6Vref/16 is applied across the high-order 2-bit voltage divider (D/A) and reference voltages of 5 levels necessary to divide it into four are generated. During the period T15 of the clock signal CLK, the low-order conversion signal is brought to a high level and is compared with each of the fifth and sixth bits. The result of comparison is outputted from the period T15.

The above operations are repeatedly carried out. Thus, during the period T20 of the clock signal CLK, a latch signal is rendered active high in level and the result of conversion is stored in a predetermined register of the data registers ADDRA through ADDRH. Further, the conversion end flag ADF is set to "1" according to a predetermined condition.

FIG. 4 illustrates a voltage distribution for describing a subrange voltage transformation system of the A/D converter. The analog input range is from 0 to Vref, whereas the subrange region is defined as a region of one quarter the analog input range as in the case of Vref/4 to Vref/2. An A/D conversion operation providing higher resolution is performed in the subrange region. Namely, assuming now that an input signal AIN falls within a voltage range of 3Vref/4 to Vref, for example, from the first result of conversion, the corresponding level shift circuit by-level shifts the input signal AIN so as to fall within the voltage region of Vref/4 to Vref/2. Described specifically, the level shift circuit by-level shifts the input signal AIN so that the input signal AIN is subtracted by Vref/2 from the Vref. Subsequently, as shown in the timing diagram of FIG. 3, the remaining 8 bits are A/D-converted by 2 bits in order from the high order at four different times in the subrange region.

Figure 6:
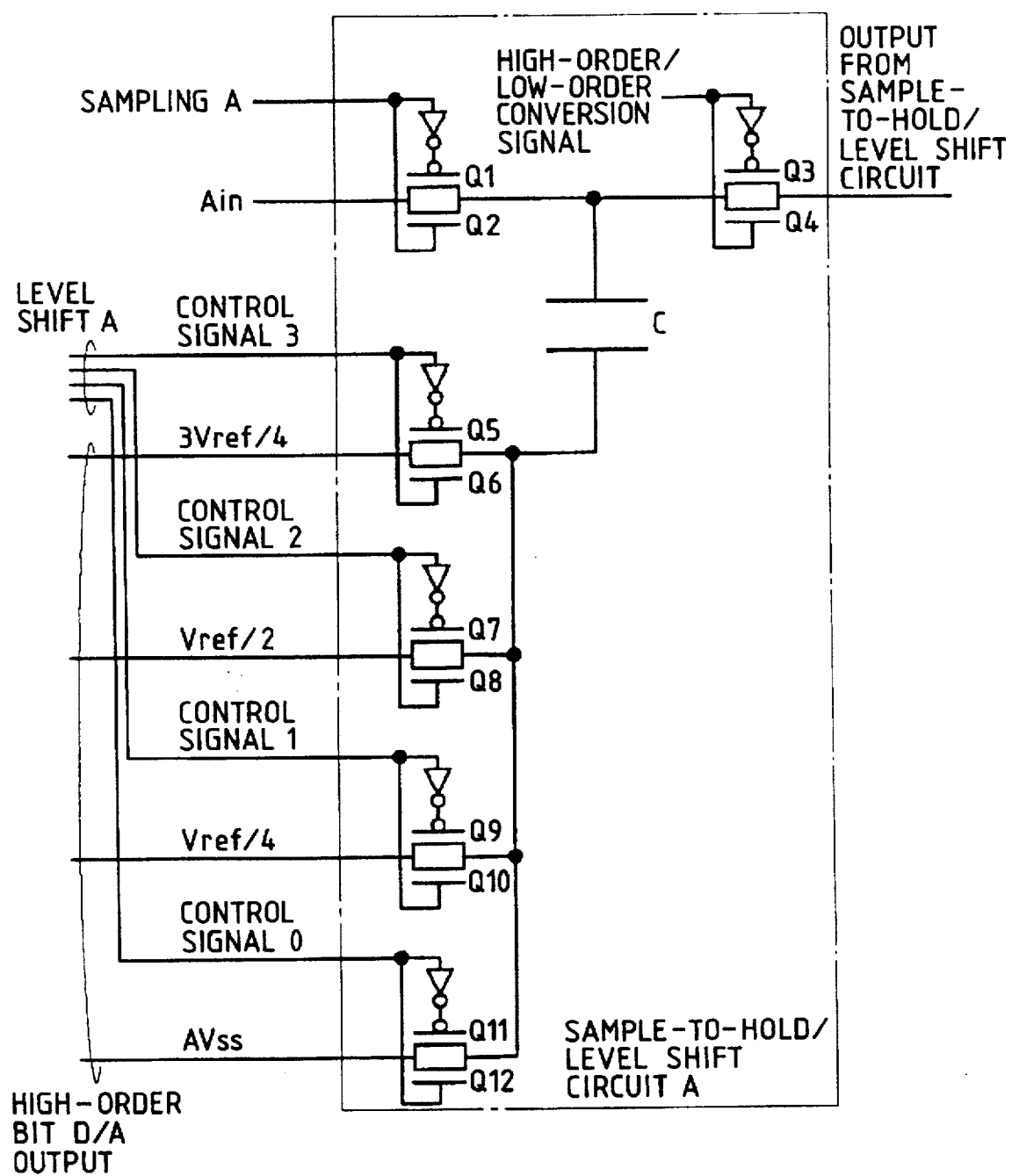
FIG. 6 is a circuit diagram illustrating one example of a sample-to-hold/level shift circuit of the A/D converter shown in FIG. 2.

FIG. 6 is a circuit diagram of one example of the sample-to-hold/level shift circuit A. The sample-to-hold/level shift circuit A comprises a combination of CMOS switches such as a P channel type MOSFET Q1 and an N channel type MOSFET Q2, etc. and a capacitor C.

When the sample-to-hold/level shift circuit A is in an sampling operation, a sampling signal A is brought to a high level so that the above switches MOSFETs Q1 and Q2 are turned on. As a result, an input signal Ain is supplied to one of electrodes of the capacitor C. At this time, a control signal 2 included in a level shift A outputted from the control circuit is rendered active high in level to thereby turn on the P channel type MOSFET Q7 and the N channel type MOSFET Q8, whereby the other electrode of the capacitor C is supplied with a voltage of Vref2. Namely, a signal charge stored in the capacitor C is equivalent to a voltage obtained by subtracting Vref/2 from a voltage Vin corresponding to the input signal Ain.

When the high-order and low-order conversion signals are activated so as to become rendered high in level, the P channel type MOSFET Q3 and the N channel type MOSFET Q4 are turned on. As a result, the input voltage Vin is supplied to its corresponding comparator array as the output of the sample-to-hold/level shift circuit, where it is compared with each of Vref/4, 3Vref/4, Vref/2, Vref/4 and 0V (AVss) corresponding to the high-order 2-bit divided voltages (D/A output). If Vref>Vin (AIN)>3Vref/4 as shown in FIG. 4, for example, from the result of comparison, then the control signal 2 is brought to a low level equivalent to deactivation, so that a control signal 0 is rendered active so as to reach a high level. Thus, the switches MOSFETs Q11 and Q12 are turned on so that 0V (AVss) is supplied to the capacitor C. As a result, the input signal Vin is by-level shifted by −Vref/2 so as to correspond to the subrange region.

If the Vin is of a low voltage like Vref/4>Vin (AIN)>0V, then the control signal 2 is rendered inactive low in level and a control signal 3 is rendered active high in level to turn on the switches MOSFETs Q5 and Q6. As a result, the voltage of 3Vref/4 is supplied to the capacitor C. Therefore, the input signal Vin is by-level shifted by +Vref/4 so as to reach the above subrange region.

If 3Vref/4>Vin (AIN)>Vref/2, then the control signal 2 is brought to the low level indicative of deactivation and a control signal 1 is rendered active high in level to thereby turn on the switches MOSFETs Q9 and Q10. As a result, the voltage of Vref/4 is supplied to the capacitor C. Therefore, the input signal Vin is by-level shifted by −Vref/4 so as to be brought to the subrange region. If the input signal Vin falls within a subrange region like Vref/2>Vin (AIN)>Vref/4, it is then needless to say that the level shift operation is not performed as it is. The sample-to-hold/level shift circuit A has been described with reference to FIG. 6. Since, however, the sample-to-hold/level shift circuit B is identical in circuit configuration and operation to the sample-to-hold/level shift circuit A, the sample-to-hold/level shift circuit B will not be described below.

FIG. 5 is a schematic block diagram of each of the comparator arrays. Each of the comparator arrays comprises a selection circuit and the five differential amplifier circuits. The selection circuit selects either one of a high-order bit D/A output (such as Vref, 3Vref/4, Vref/2, Vref/4, AVss) and a low-order bit D/A output. However, an output indicative of the result of comparison corresponding to each of Vref and AVss is neglected. Namely, a high-order 2-bit (9 and 8 bits) converted output and a level shift control signal corresponding to the output are formed from three results of compared output, which correspond to 3Vref/4, Vref/2 and Vref/4.

As the low-order bit D/A converted output, five voltages obtained by dividing the subrange region into four equal parts of 1 to 0 are selected upon first A/D conversion. Thus, the results of decision of six regions inclusive of the outside of the range are obtained. When the output falls outside the range, the converted high-order bits are corrected. Although no particular limitation is imposed on the number of differential amplifier circuits, eight differential amplifier circuits may be provided without providing the selection circuit. If no correction is made, then the number of differential amplifier circuits can be set to three through six. Incidentally, a buffer or the like for supplying each of 3Vref/4, Vref/2 and Vref/4 is provided with an arithmetic amplifying circuit.

Figure 7:
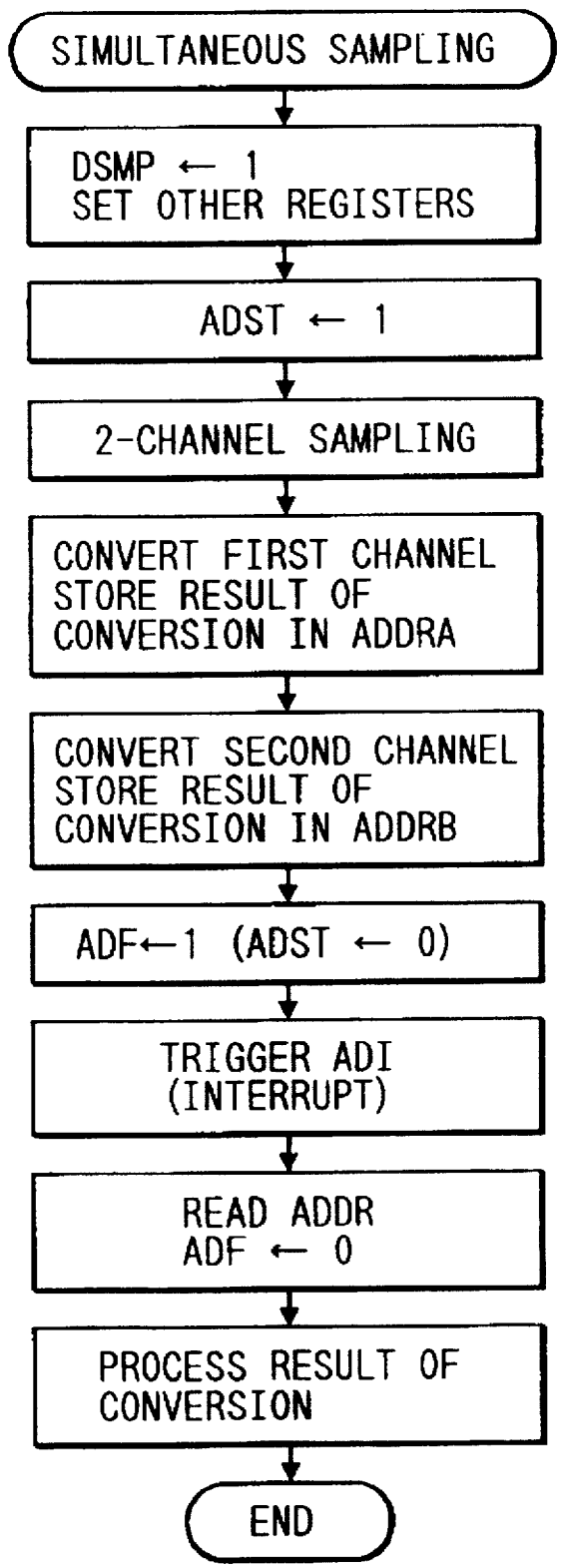
FIG. 7 is a flowchart for describing one example of a typical A/D conversion operation under simultaneous sampling made according to the present invention.

FIG. 7 is a flowchart for describing one example of a typical A/D conversion operation made under the simultaneous sampling. The central processing unit CPU sets a DSMP bit of the control register ADCR to "1" and sets respective bits of the other control registers to a predetermined value. Next, the central processing unit CPU sets an ADST bit of the control register ADCR to "1" and causes the A/D converter to start an A/D conversion operation. With the commencement of the A/D conversion operation, the simultaneous sampling operation is effected on analog signals inputted from designated or specified two channels. The analog signal inputted from the first channel is A/D-converted and the result of conversion is stored in a data register (e.g., ADDRA). Next, the simultaneously-sampled analog signal inputted from the second channel is A/D-converted and the result of conversion is stored in another data register (e.g., ADDRB. The ADST bit is cleared to "0" to stop the A/D conversion.

When an ADF bit of the control register ADCR is set to "1" by the control circuit and the end or completion of the A/D conversion operation is displayed, an interrupt signal ADI is triggered from the control circuit. The interrupt controller INT supplied with the interrupt signal ADI makes a start-up request to the data transfer controller DTC and the reading of the data from the data registers ADDRA and ADDRB is performed by the data transfer controller DTC under the control shown in FIG. 19 to be described later. The ADF bit is cleared by executing a bit clear instruction or command (BCLR) with the central processing unit CPU or by the data transfer controller DTC when a data transfer operation of the data transfer controller DTC is completed. Processing on the converted data is carried out by the central processing unit CPU or the like.

Figure 8:
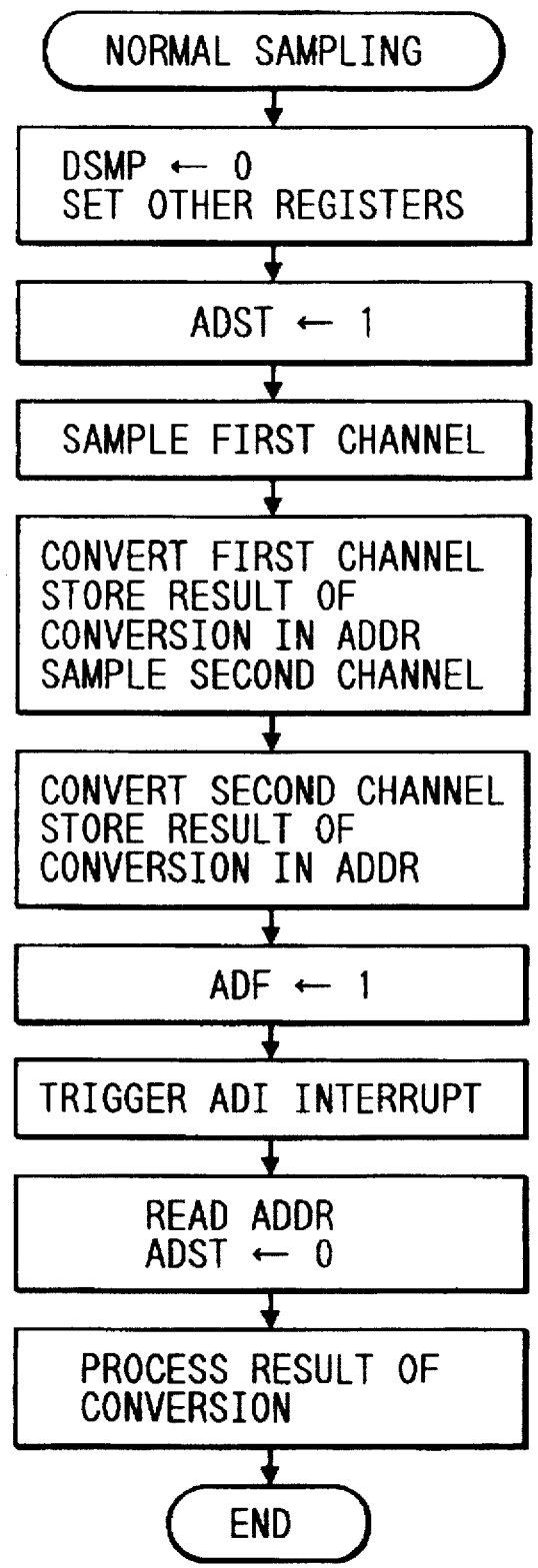
FIG. 8 is a flowchart for describing one example of a typical A/D conversion operation under normal sampling executed according to the present invention.

FIG. 8 is a flowchart for describing one example of a typical A/D conversion operation made under normal sampling. The central processing unit CPU sets the DSMP bit of the control register ADCR to "0" and sets each of the bits in other control registers to the predetermined value. Next, the central processing unit CPU sets the ADST bit of the control register ADCSR to "1" and allows the A/D converter to start the A/D conversion operation. With the start of the A/D conversion operation, a sampling operation is made to an analog signal inputted from a specified first channel. When the first-channel conversion operation is carried out and the result of conversion is stored in a data register ADDR, a sampling operation is made to an analog signal inputted from a specified second channel in tandem with this. Next, the operation for A/D-converting the sampled second channel is carried out and the result of conversion is stored in another data register ADDR.

When the ADF bit of the control register ADCSR is set to "1" by the control circuit and the completion of the A/D conversion operation is displayed, the interrupt signal ADI is outputted to the interrupt controller INT. Thus, the data register ADDR is read and the ADST bit is cleared to "0" to stop the A/D conversion. Processing on the converted data is carried out by the central processing unit CPU or the like.

The outline of the above A/D converter is as follows: The A/D converter has a 10-bit resolution. An operation mode can be set by combining four modes comprised of select and/or group and single and/or scan with a buffer operation and a simultaneous sampling operation. The select mode selects one channel and the group mode selects a plurality of channels. In the single mode, all the selected channels are A/D-converted at one start-up. In the scan mode, the A/D conversion operation is repeated until it is caused to stop by the central processing unit CPU (software).

In regard to the buffer operation, the previous result of conversion is saved in a buffer register upon completion of conversion of the corresponding channel. In the simultaneous sampling mode, analog input voltages input from two channels are simultaneously sampled and successively A/D-converted. By setting a PWR bit, two operation modes: a high-speed start mode and a low power consumption mode can be selected. When the operation mode or the input channel is switched to another, the control registers ADCSR and ADCR are renewed in a state in which the ADST bit has been cleared to "0". When the ADST bit is set to "1" after the renewal of the control registers ADCSR and ADCR, the A/D conversion is started again. The clearing of the ADST bit to "0" permits the stop of the A/D conversion.

Figure 9:
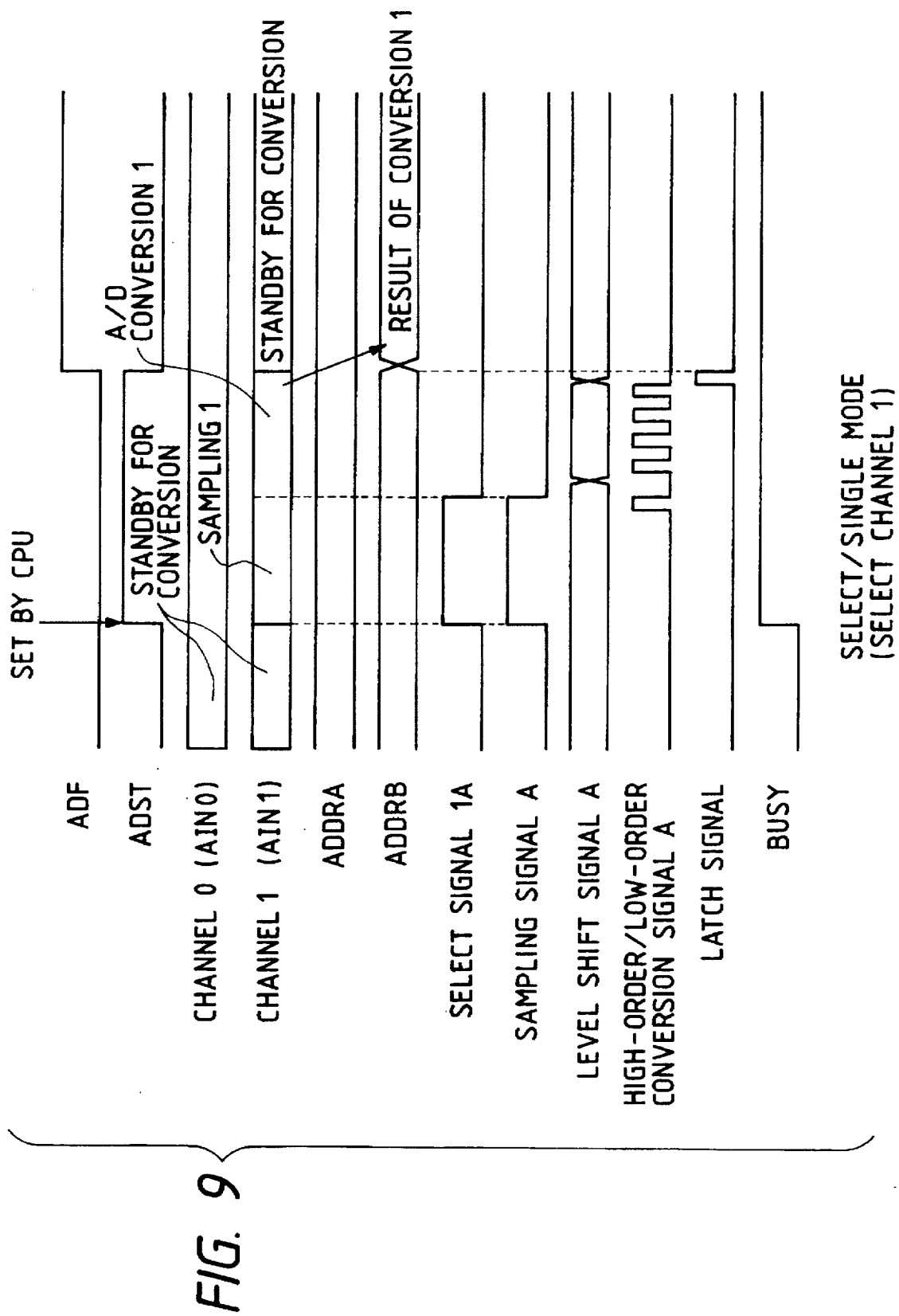
FIG. 9 is a timing chart for describing a select/single mode employed in the present invention.

FIG. 9 is a timing chart for describing a select/single mode. The same drawing illustrates a case in which a channel 1 has been selected by 0 to 2 bits (CH0 to CH2) of the control register ADCSR. The select/single mode (GRP=0 and SCAN=0) is selected where A/D conversion is effected on an analog signal supplied to one channel alone. When an ADST bit is set to "1" in accordance with a conversion start condition under which predetermined values have been set to TRGS1 and TRGS0 respectively, the A/D conversion is started. During the A/D conversion, the ADST bit is maintained at "1" and when the A/D conversion is finished, the ADST bit is cleared to "0" by the control circuit. Upon completion of the A/D conversion, an ADF flag is set to "1". At this time, an interrupt is triggered in accordance with an interrupt signal ADI when an ADIE bit is set to "1". When the control register ADCSR is read and "0" is thereafter written therein, an ADF flag is cleared. Further, the ADF flag can be also cleared in accordance with a bit clear (BCLR) command.

Referring to FIG. 9, when the ADST bit is set to "1" by the central processing unit CPU, the channel 1 (AIN1) is selected based on a select signal 1A outputted from the control circuit and the sampling signal A is generated during the periods ranging from T1 to T10 of the clock signal CLK shown in FIG. 3. Thereafter, the sample-to-hold/level shift circuit A takes in the sampling signal A and a high-order 2-bit conversion operation is performed during the final period T10. From the result of conversion, a level shift signal A is generated as described above and a low-order conversion signal A is then generated, whereby A/D conversion operation divided into four different times is performed in groups of 2 bits. A latch signal is generated from the control circuit in synchronism with the final period T20 of the clock signal CLK and hence the result of conversion is captured in the data register ADDRB. With the completion of the aforementioned A/D conversion, the ADF flag is set to "1".

Figure 10:
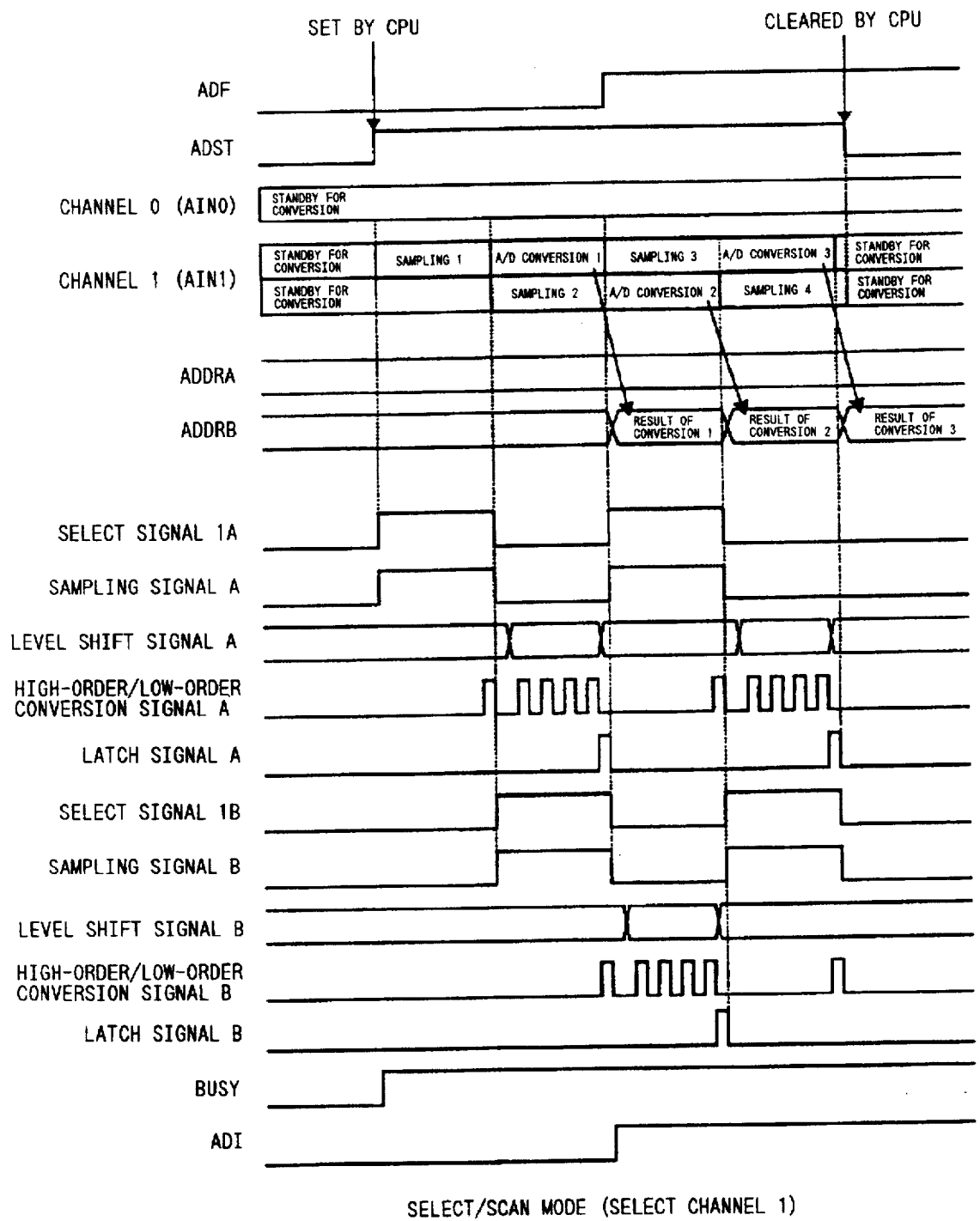
FIG. 10 is a timing chart for describing a select/scan mode employed in the present invention.

FIG. 10 is a timing chart for describing a select/scan mode. The same drawing shows a case in which a channel 1 has been selected by 0 to 2 bits (CH0 to CH2) of the control register ADCSR. The select/scan mode (GRP=0 and SCAN=1) is selected where A/D conversion is repeatedly effected on an analog signal supplied to one channel. When an ADST bit is set to "1" in accordance with a conversion start condition under which predetermined values have been set to TRGS1 and TRGS0 respectively, the A/D conversion is started. During the A/D conversion, the ADST bit is maintained at "1". The ADST bit holds "1" until it is cleared to "0" by the central processing unit CPU. During this period, the A/D conversion of each selected input channel is repeated. When the first A/D conversion is finished, an ADF flag is set to "1". When, at this time, an ADIE bit is set to "1", an interrupt is triggered in accordance with an interrupt signal ADI. When the central processing unit CPU reads the control register ADCSR and thereafter writes "0" therein, the ADF flag is cleared. Further, the ADF flag can be also cleared by executing a bit clear (BCLR) command by the central processing unit CPU.

Referring to FIG. 10, when the ADST bit is set to "1", the channel 1 (AIN1) is selected based on a select signal 1A and a sampling signal A is generated in the same manner as described above. Thereafter, the sample-to-hold/level shift circuit A takes in the sampling signal A. A high-order 2-bit conversion operation is performed in the final timing. From the result of conversion, a level shift signal A is generated as described above and a low-order conversion signal A is then produced, whereby A/D conversion operation divided into four different times is executed by 2 bits. A latch signal is generated in synchronism with the final period of the conversion operation and hence the result of conversion is captured in the data register ADDRB. With the completion of such first A/D conversion, an ADF flag is set to "1". The sample-to-hold/level shift circuit A performs a second sampling operation 2 simultaneously with the first A/D conversion 1 described above.

While the ADST bit is being maintained at "1", A/D conversion 2 is effected on an input signal captured in accordance with the sampling operation 2. At the same time, the sample-to-hold/level shift circuit A performs a third sampling operation. Thus, the sampling operations and the A/D conversion operations are carried out in accordance with a pipeline system. The results of conversion are successively captured in the data register ADDRB. Namely, the previous result of conversion is replaced by the next result of conversion.

Figure 11:
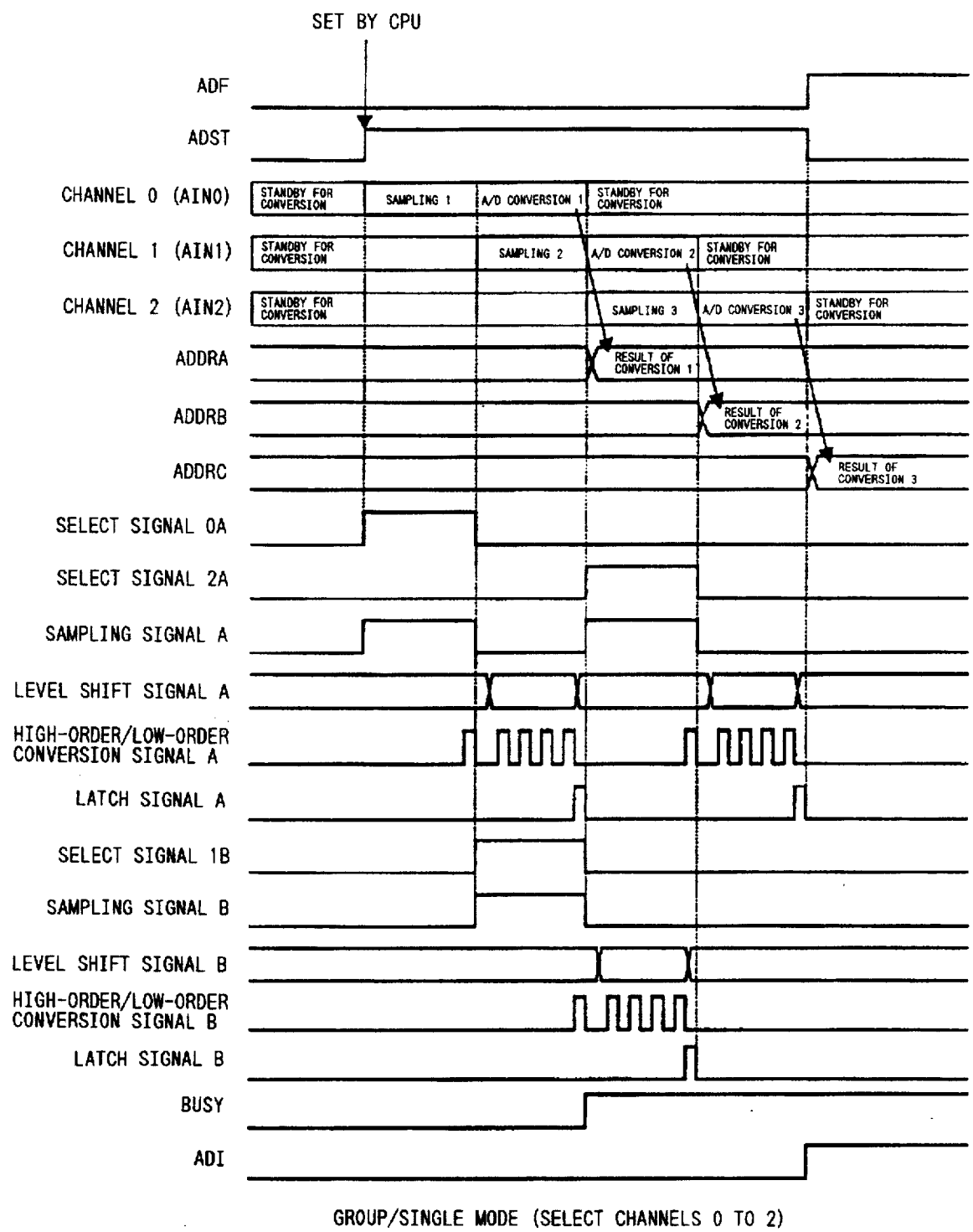
FIG. 11 is a timing chart for describing a group/single mode employed in the present invention.

FIG. 11 is a timing chart for describing a group/single mode. The same drawing shows a case in which channels 0 to 2 are respectively selected by 0 to 2 bits (CH0 to CH2) of the control register ADCSR. The group/single mode (GRP=1 and SCAN=0) is selected where analog signals inputted from a plurality of channels are A/D-converted. When an ADST bit is set to "1" in accordance with a conversion start condition under which predetermined values have been set to TRGS0 and TRGS1 respectively, the A/D conversion is started. While the A/D conversion is being made, the ADST bit holds "1". When all A/D conversion of each designated input channel is finished, the ADST bit is cleared to "0" by the control circuit. Upon completion of all A/D conversion of each designated input channel, an ADF flag is set to "1". When an ADIE bit is set to "1" at this time, an interrupt is triggered in accordance with an interrupt signal ADI. When the central processing unit CPU reads the control register ADCSR and thereafter writes "0" therein, the ADF flag is cleared. By executing a bit clear (BCLR) command with the central processing unit CPU, the ADF flag can be also cleared.

Referring to FIG. 11, when the ADST bit is set to "1", the channel 0 (AIN0) is selected based on a select signal 0A outputted from the control circuit and a sampling signal A is generated in the same manner as described above. Thereafter, the sample-to-hold/level shift circuit A takes in the sampling signal A. At the final timing thereof, a high-order 2-bit conversion operation is performed. From the result of conversion, a level shift signal A is generated as described above and a low-order conversion signal A is next generated, whereby the operation for A/D conversion 1 divided into four times is performed by 2 bits. Upon completion of the A/D conversion operation, a latch signal A is generated so that the result of conversion 1 is captured in the data register ADDRA. Paralleling the operation for A/D conversion 1, the channel 1 (AIN1) is selected based on a select signal 1B. Further, a sampling signal B is generated and captured in the sample-to-hold/level shift circuit B.

Paralleling the operation for low-order 8-bit A/D conversion 2 associated with the channel 1, a select signal 2A is generated and hence the channel 2 (AIN2) is selected. Further, the sampling signal A is generated and captured in the sample-to-hold/level shift circuit A. The result of A/D conversion 2 relative to the channel 1 is stored in the data register ADDRB and the operation for A/D conversion 3 associated with the channel 2 (AIN2) is performed. With the completion of the A/D conversion operation with respect to the final channel, the ADF flag is set to "1". Thus, the sampling made under the plurality of channels and their A/D conversion operations are carried out by a pipeline system.

Figure 12:
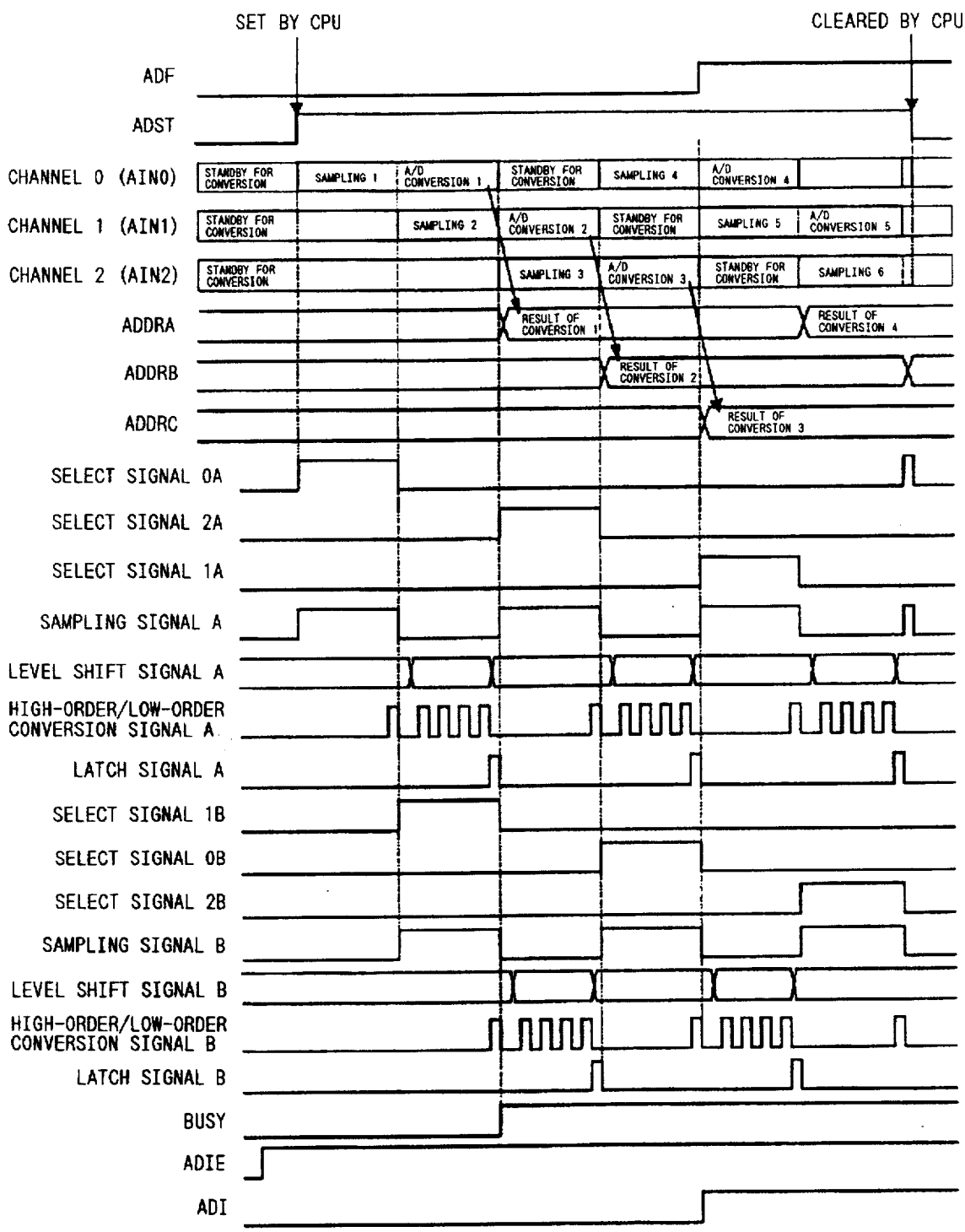
FIG. 12 is a timing chart for describing a group/scan mode employed in the present invention.

FIG. 12 is a timing chart for describing a group/scan mode. The same drawing shows a case in which channels 0 to 2 have been respectively selected by 0 to 2 bits (CH0 to CH2) of the control register ADCSR. The group/scan mode (GRP=1 and SCAN=1) is selected when A/D conversion is repeatedly effected on analog signals supplied to a plurality of channels. When an ADST bit is set to "1" in accordance with a conversion start condition under which predetermined values have been set to TRGS1 and TRGS0 respectively, the A/D conversion is started. During the A/D conversion, the ADST bit holds "1". The ADST bit is maintained at "1" until it is cleared to "0" by the central processing unit CPU. When the first all A/D conversion of designated input channel is completed, an ADF flag is set to "1". When an ADIE bit is set to "1" at this time, an interrupt is triggered based on an interrupt signal ADI. When the central processing unit CPU reads the control register ADCSR and then writes "0" therein, the ADF flag is cleared. Further, the ADF flag can be also cleared by executing a bit clear (BCLR) command with the central processing unit CPU.

Referring to FIG. 12, when the ADST bit is set to "1" by the central processing unit CPU, the channel 0 (AIN0) is selected based on a select signal 0A and a sampling signal A is generated in the same manner as described above. Thereafter, the sample-to-hold/level shift circuit A takes in the sampling signal A (sampling 1) and a high-order 2-bit conversion operation is performed in the final timing thereof. Based on the result of conversion, a level shift signal A is generated as described above and a low-order conversion signal A is next produced, whereby the operation for A/D conversion 1 divided into four times is performed by 2 bits. Upon completion of the conversion operation, a latch signal A is generated from the control circuit so that the result of conversion 1 is captured in the data register ADDRA. Paralleling the operation for A/D conversion 1, the channel 1 (AIN1) is selected based on a select signal 1B and a sampling signal B is generated and thereafter captured in the sample-to-hold/level shift circuit B (sampling 2).

Paralleling the operation for low-order 8-bit A/D conversion 2 associated with the channel 1, a select signal 2A is generated to select the channel 2 (AIN2). Further, the sampling signal A is generated and thereafter captured in the sample-to-hold/level shift circuit A (sampling 3). The result of A/D conversion 2 associated with the channel 1 is captured in the data register ADDRB and the operation for A/D conversion 3 relative to the channel 2 (AIN2) is performed. Paralleling the operation for A/D conversion 3, a select signal 0B is generated to select the channel 0 (AIN0). Further, a sampling signal B is generated and thereafter captured in the sample-to-hold/level shift circuit B (sampling 4). With the completion of the A/D conversion operation associated with the final channel, the ADF flag is set to "1". Thus, the sampling made under the plurality of channels and their conversion operations are repeated in accordance with a pipeline system. When the ADST is cleared to "0" by the central processing unit CPU, the A/D conversion operation is stopped.

Figure 13:
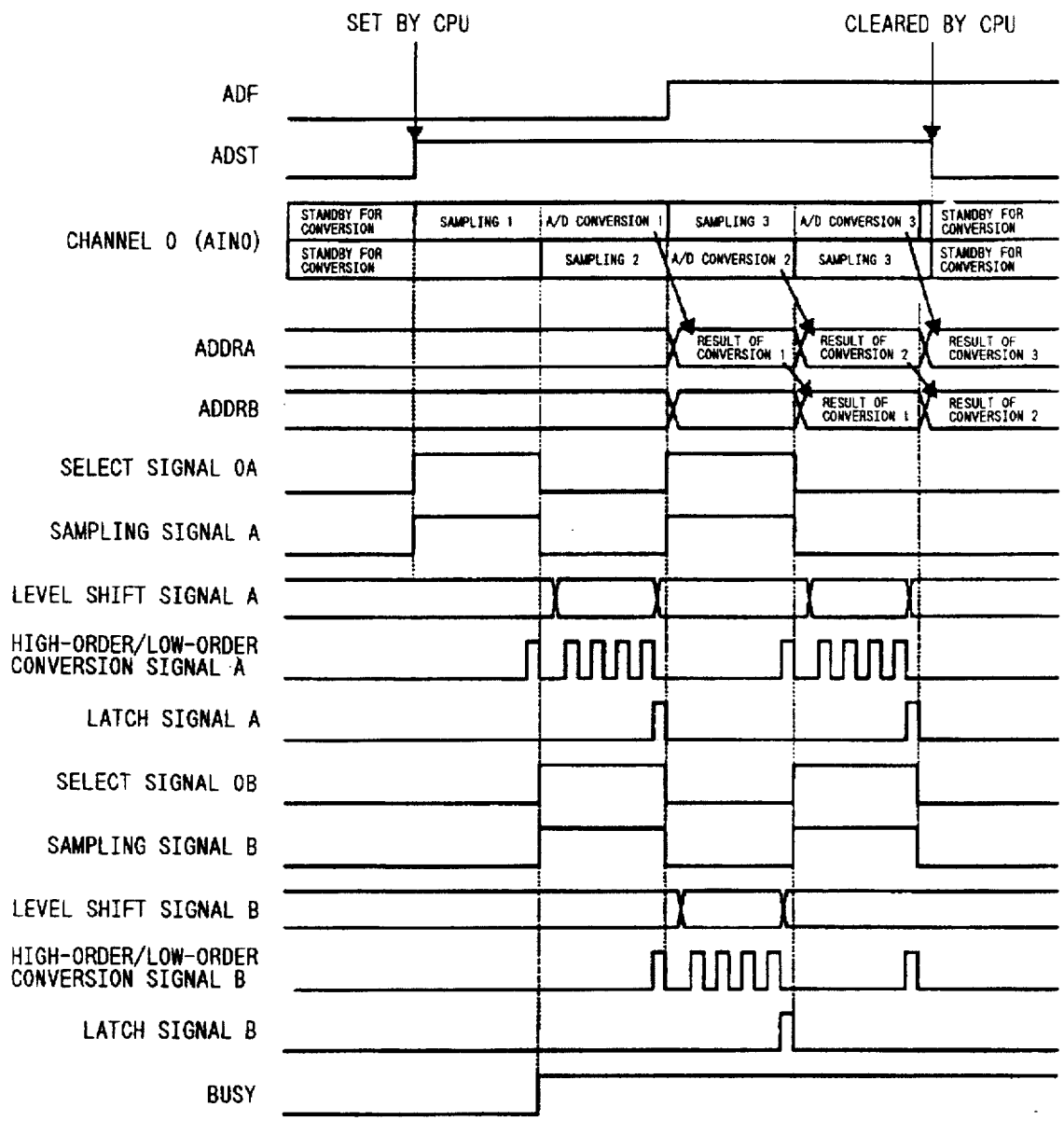
FIG. 13 is a timing chart for describing one example of a buffer operation employed in the present invention.

FIG. 13 is a timing chart for describing a buffer operation. A select/scan mode (GRP=0 and SCAN=1) is shown in the same drawing by way of example. When A/D conversion of an analog signal supplied to the corresponding channel is finished under the buffer operation, the result of A/D conversion is stored in the data register ADDRA and at the same time the result of A/D conversion previously stored therein is transferred to another data register. As the buffer operation, any one of a two-stage transfer type operation of AIN0→ADDRA→ADDRB, two-stage transfer type two sets of operations of AIN0→ADDRA→ADDRC, AIN1→ADDRB→ADDRD, and a four-stage transfer type one set of operations of AIN0→ADDRA→ADDRB→ADDRC→ADDRD can be selected in accordance with the data stored in bits 0 and 1 (BUFE0 and BUFE1) of the control register ADCR. Even in this case, the normal A/D conversion operation can be effected on each of channels 4 to 7. Further, when the result of A/D conversion is stored in each buffer register and the register is saturated (when A/D-converted data are written into all the pre-designated registers), an ADF flag is set to "1" by the control circuit. When an ADIE bit is set to "1" at this time, an interrupt is triggered based on an interrupt signal ADI. When the central processing unit CPU reads the control register ADCSR and thereafter writes "0" therein, the ADF flag is cleared. Further, the ADF flag can be also cleared by executing a bit clear (BCLR) command with the central processing unit CPU.

FIG. 13 illustrates the two-stage transfer type operation of AIN0→ADDRA→ADDRB. Under the select/scan mode (GRP=0 and SCAN=1), the result of A/D conversion 1 is stored in the data register ADDRA in accordance with a latch signal A. When the result of A/D conversion 2 is formed, the result of A/D conversion 1 is transferred to the data register ADDRB in accordance with a latch signal B and the result of A/D conversion 2 is stored in the data register ADDRA in accordance with the latch signal A. Thus, when the results of A/D conversion are stored in the buffer registers and the registers are saturated, the ADF flag is set to "1". When an ADST bit is cleared to "0" by the central processing unit CPU after completion of the operation for third A/D conversion 3, the A/D conversion operation is stopped and hence the result of A/D conversion 3 and the result of A/D conversion 2 are respectively stored in the data registers ADDRA and ADDRB.

Figure 14:
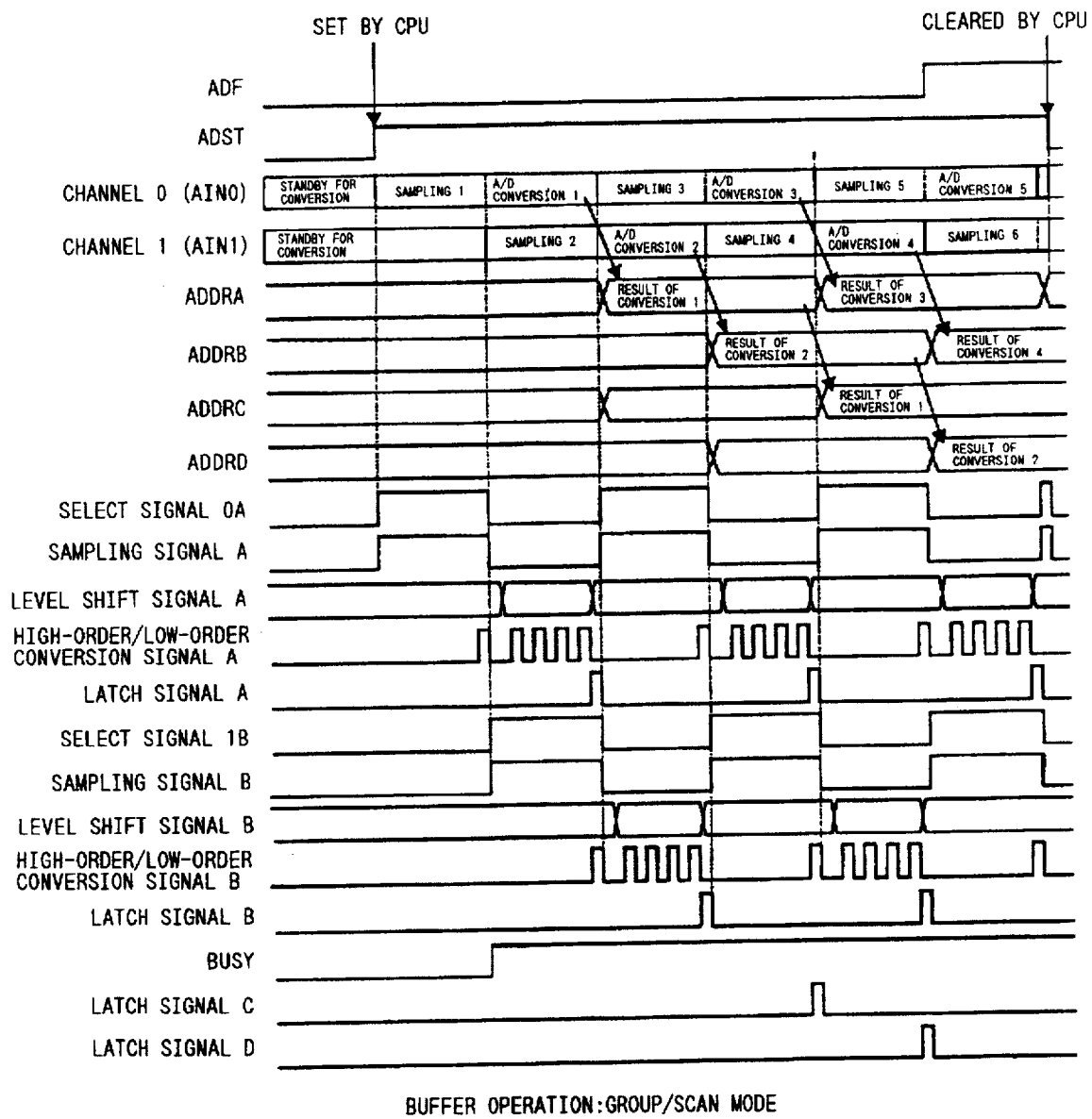
FIG. 14 is a timing chart for describing another example of the buffer operation shown in FIG. 13.

FIG. 14 illustrates the two-stage transfer type two sets of operations of AIN0→ADDRA→ADDRC, AIN1→ADDRB→ADDRD. Under the group/scan mode (GRP=1 and SCAN=1), the result of A/D conversion 1 is stored in the data register ADDRA in accordance with a latch signal A and the result of A/D conversion 2 is stored in the data register ADDRB in accordance with a latch signal B. When the result of A/D conversion 3 is formed, the result of A/D conversion 1 is transferred to the data register ADDRC in accordance with a latch signal C and the result of A/D conversion 3 is stored in the data register ADDRA in accordance with the latch signal A. Similarly, when the result of A/D conversion 4 is formed, the result of A/D conversion 2 is transferred to the data register ADDRD in accordance with a latch signal D and the result of A/D conversion 4 is stored in the data register ADDRB in accordance with the latch signal B. Thus, when the results of A/D conversion are stored in the buffer registers and the registers are saturated, the ADF flag is set to "1" by the control circuit.

Input voltages supplied to two channels are simultaneously sampled and continuously A/D-converted in the case of the simultaneous sampling operation. When the simultaneous sampling operation (DSMP=1) is specified, A/D conversion is performed in groups of two channels in accordance with the designation of CH2 and CH1 bits of the control register ADCSR. A method of selecting channels under the simultaneous sampling operation will be shown in the following Table 3. A CH0 bit is ineffective.

TABLE 3

| CH2 | CH1 | Select mode | Group mode |
|---|---|---|---|
| 0 | 0 | AN0, AN1 | AN0, AN1 |
| 0 | 1 | AN2, AN3 | AN0–AN3 |
| 1 | 0 | AN4, AN5 | AN0–AN5 |
| 1 | 1 | AN6, AN7 | AN0–AN7 |

Figure 15:
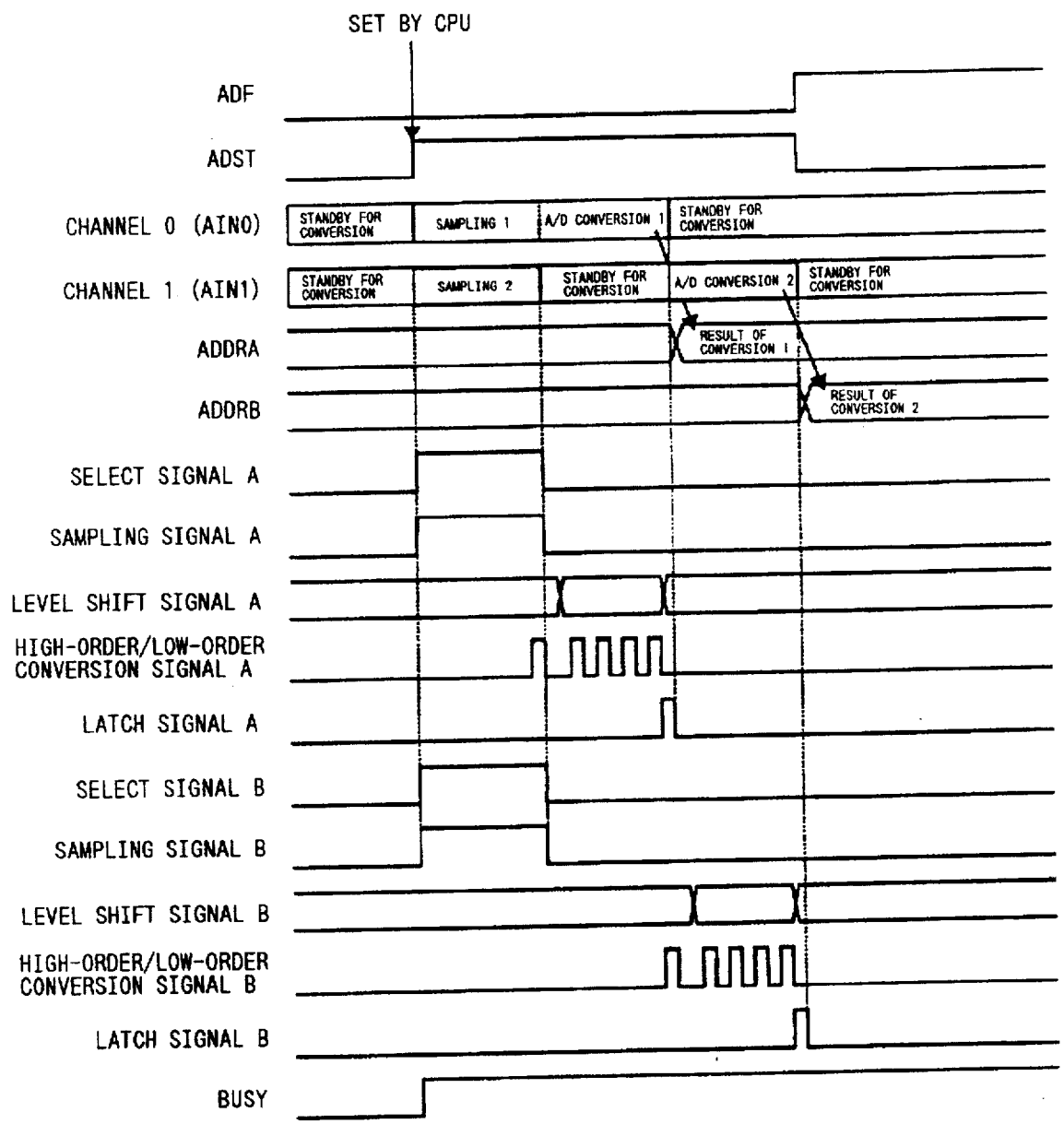
FIG. 15 is a timing chart for describing one example of a simultaneous sampling operation employed in the present invention.

FIG. 15 is a timing chart for describing a simultaneous sampling operation. The same drawing illustrates a group/single mode as an example. When a DSMP is set to "1" and an ADST is set to "1" by the central processing unit CPU in the same drawing, channels 0 and 1 (AIN0 and AIN1) are respectively selected based on select signals A and B outputted from the control circuit. Further, sampling signals A and B are generated and simultaneously captured in the sample-to-hold/level shift circuits A and B respectively. At their final timing, a high-order 2-bit conversion operation is performed on the channel 0 side. Based on the result of conversion, a level shift signal A is generated as described above and a low-order conversion signal A associated with the channel 0 is next generated from the control circuit, whereby the operation for A/D conversion 1 divided into four times is performed by 2 bits. Upon completion of the A/D conversion operation, a latch signal A is produced from the control circuit and hence the result of A/D conversion 1 is captured in the data register ADDRA. Subsequently to the completion of the operation for A/D conversion 1, an A/D conversion operation on the channel 1 is performed and the result of A/D conversion 2 associated therewith is captured in the data register ADDRB. With the completion of the operation for A/D conversion 2, an ADF flag is set to "1" by the control circuit.

Figure 16:
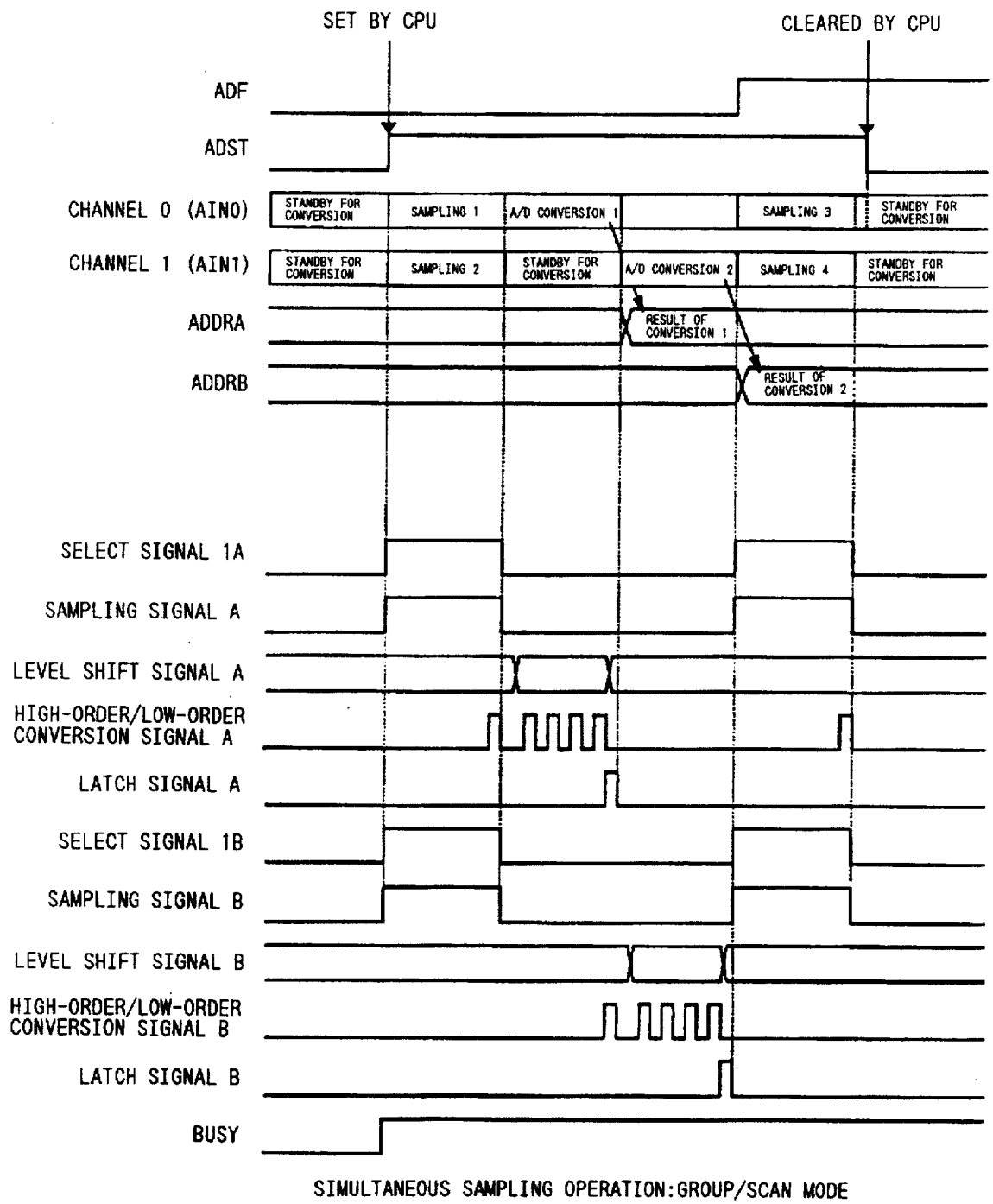
FIG. 16 is a timing chart for describing another example of the simultaneous sampling operation shown in FIG. 15.

FIG. 16 is a timing chart for describing a simultaneous sampling operation. The same drawing illustrates a group/scan mode as an example. When an ADST is set to "1" in the same drawing (DSMP=1, GRP=1 and SCAN=1), channels 0 and 1 (AIN0 and AIN1) are respectively selected based on select signals 1A and 1B. Further, sampling signals 1A and 1B are generated and simultaneously captured in the sample-to-hold/level shift circuits A and B respectively. At their final timing, a high-order 2-bit conversion operation is performed on the channel 0 side. Based on the result of conversion, a level shift signal A is produced from the control circuit as described above and a low-order conversion signal A associated with the channel 0 is next generated, whereby the operation for A/D conversion 1 divided into four times is performed by 2 bits. Upon completion of the A/D conversion operation, a latch signal A is generated from the control circuit and hence the result of A/D conversion 1 is captured in the data register ADDRA. After completion of the operation for A/D conversion 1, an A/D conversion operation on the channel 1 is performed and the result of A/D conversion 2 obtained in this way is captured in the data register ADDRB. With the completion of the first operation for A/D conversion 2, an ADF flag is set to "1" by the control circuit.

When the operation for A/D conversion 2 is completed, the select signals 1A and 1B are consecutively generated to select the channels 0 and 1 (AIN0 and AIN1) again. Further, the sampling signals 1A and 1B are generated and simultaneously captured in the sample-to-hold/level shift circuits A and B respectively. When the ADST is thereafter cleared to "0" by the central processing unit CPU, the A/D conversion operation is not performed and hence the A/D converter enters into an A/D conversion standby state.

Figure 17:
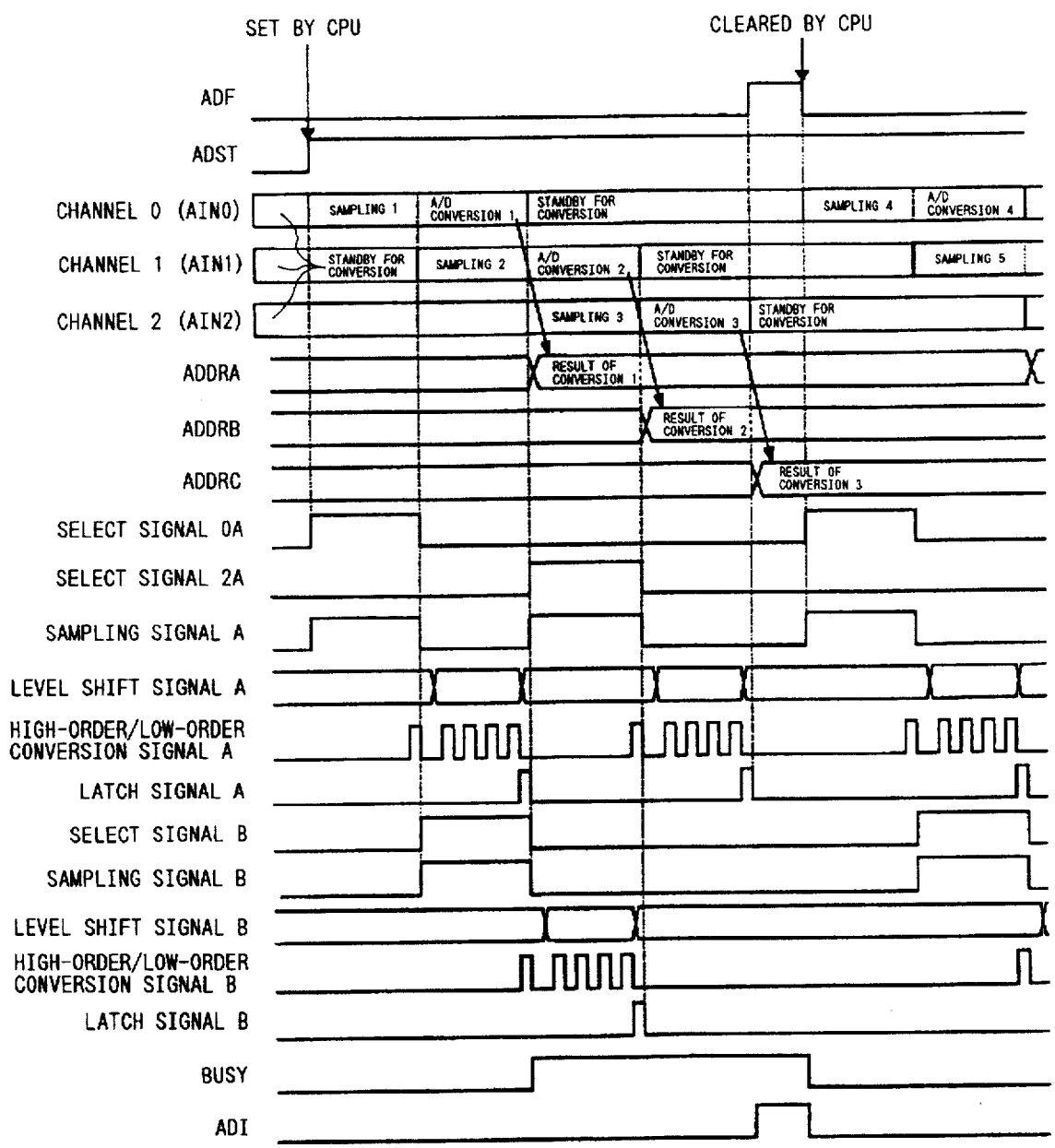
FIG. 17 is a timing chart for describing interval operations employed in the present invention.

FIG. 17 is a timing chart for describing an interval operation. When an INT bit of the control register ADCR is set to "1" by the central processing unit CPU, the following interval operation is carried out. A description will be made of, as an example, a case where a group/scan mode is set and 010 is set in accordance with CH2 to CH0 of the control register ADCSR to thereby select input signals AIN0 to AIN2.

First sampling/conversion is successively effected on the input signals AIN0 through AIN2 in accordance with the aforementioned pipeline system. Upon sampling of the input signal AIN2, a BUSY signal is brought into an active state. Subsequently, no new conversion is started. The A/D conversion of the input signal AIN2 is completed and an ADF flag is set to "1". Further, an interrupt request is made based on an interrupt signal ADI. In response to the interrupt request, the central processing unit CPU or the data transfer controller DTC reads the result of A/D conversion and clears the ADF flag to "0".

In particular, the clearing of the ADF flag by the data transfer controller DTC is performed after completion of the transfer of all the designated data. When the central processing unit CPU clears the ADF flag to "0", its clearing is executed in accordance with a bit clear (BCLR) command. This operation is made as follows: The control register ADCSR is read in byte units. Further, only a bit 7 is cleared to "0" and other bits are held in the control register ADCSR. A bit write operation is performed in byte units. The above command is similar to that executed by the CPU described in the "H8/3003 Hardware Manual". When the ADF flag is cleared to "0", the BUSY signal is brought into an inactive state. Since an ADST bit is maintained at "1", new A/D conversion is started.

Figure 18:
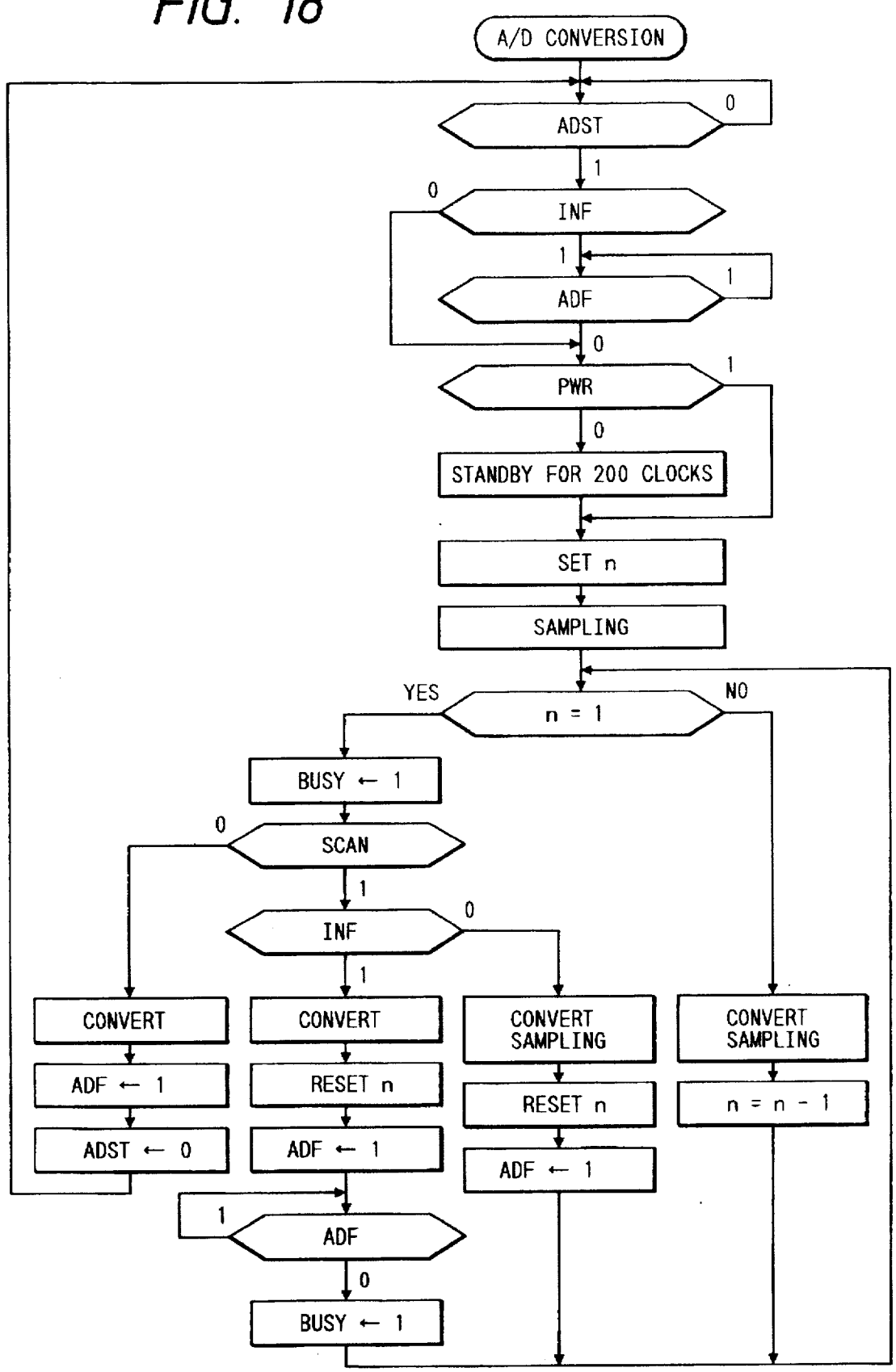
FIG. 18 is a schematic flowchart for describing the operation of the A/D converter employed in the present invention.

FIG. 18 is a schematic flowchart for describing the operation of the A/D converter employed in the present invention. The schematic operation of the aforementioned A/D converter will be collectively described as follows:

The A/D converter is held in a standby state until the ADST is set to "1". In the case of the interval operation during which the INF has been set to "1", the A/D converter is placed in the standby state until the ADF flag is cleared to "0". The number n of data to be converted is selected by the control registers ADCSR and ADCR. When the operations are taken other than the buffer operation and the simultaneous sampling operation in the select mode, n=1. On the other hand, when the four-stage transfer operation is taken in the select mode, n=4.

Sampling is effected on the first channel. If n=1, then sampled data is A/D-converted and the next sampling operation is performed. The control circuit decrements the value of n. If n=1, i.e., the final data conversion is made, then the control circuit sets the BUSY to "1". In the case of the single mode, the A/D conversion is performed. Further, the control circuit sets the ADF flag to "1" and clears the ADST bit to "0", followed by returning to a standby state.

If the interval operation is not selected in the scan mode, then the sampled data is A/D-converted and the next sampling operation is performed. The control circuit resets the value of n (recovers an initial value). The control circuit sets the ADF flag to "1" and continues to operate. If the interval operation is taken in the scan mode, then the sampled data is A/D-converted. The control circuit resets the value of n (recovers the initial value). The control circuit is placed in the standby state until the ADF flag is set to "1" and cleared to "0". The simultaneous sampling operation is substantially similar to the interval operation except that a CHS0 bit is regarded as "1" and two-channel-per-once sampling operations are simultaneously performed upon conversion of two channels.

The PWR bit selects the conversion start mode of the A/D converter. When the PWR bit is cleared to "0", an analog circuit (such as A/D converter, described more specifically, analog multiplexer, sample-to-hold/level shift circuits A and B, comparator arrays A and B, 2-bit voltage divider, 6-bit voltage divider) is brought into an inactive state except for the A/D conversion operation. When the PWR bit is set to "1", the analog circuit is set to a high-speed start mode. Hence the analog circuit is set to an active state at all times.

In the low power consumption mode in which the PWR bit is of "0", the ADST is set to "1" and at the same time the power supply for the analog circuit is turned on. When 200 cycles of the reference clock selected based on the CKS bit of the control register ADCSR have elapsed, the analog circuit enters into an A/D convertible state and starts a first A/D conversion operation. When it is desired to continuously perform the A/D conversion, A/D conversion operations including and subsequent to a second A/D conversion operation are performed in 10 cycles. When the designated A/D conversion operations are finished, the power supply for the analog circuit is automatically turned off, thereby providing less power consumption.

The bus interface is of an interface provided between the data registers ADDRA through ADDRD and a bus master (internal data bus). The internal data bus has a 16-bit width. The reading of the data registers ADDRA through ADDRD from the bus master through the bus interface can be carried out in either word units or byte units. In the case of the reading of the data register ADDR in the word units, the contents of the data register ADDR are transferred to the bus master in the form of 16 bits by one operation. In the case of the reading of the data register ADDR in the byte units, the contents of high-order bits (AD9 through AD2) of converted data (AD9 through AD0) are transferred to the bus master. Low-order 8 bits cannot be read in the byte units.

Figure 19:
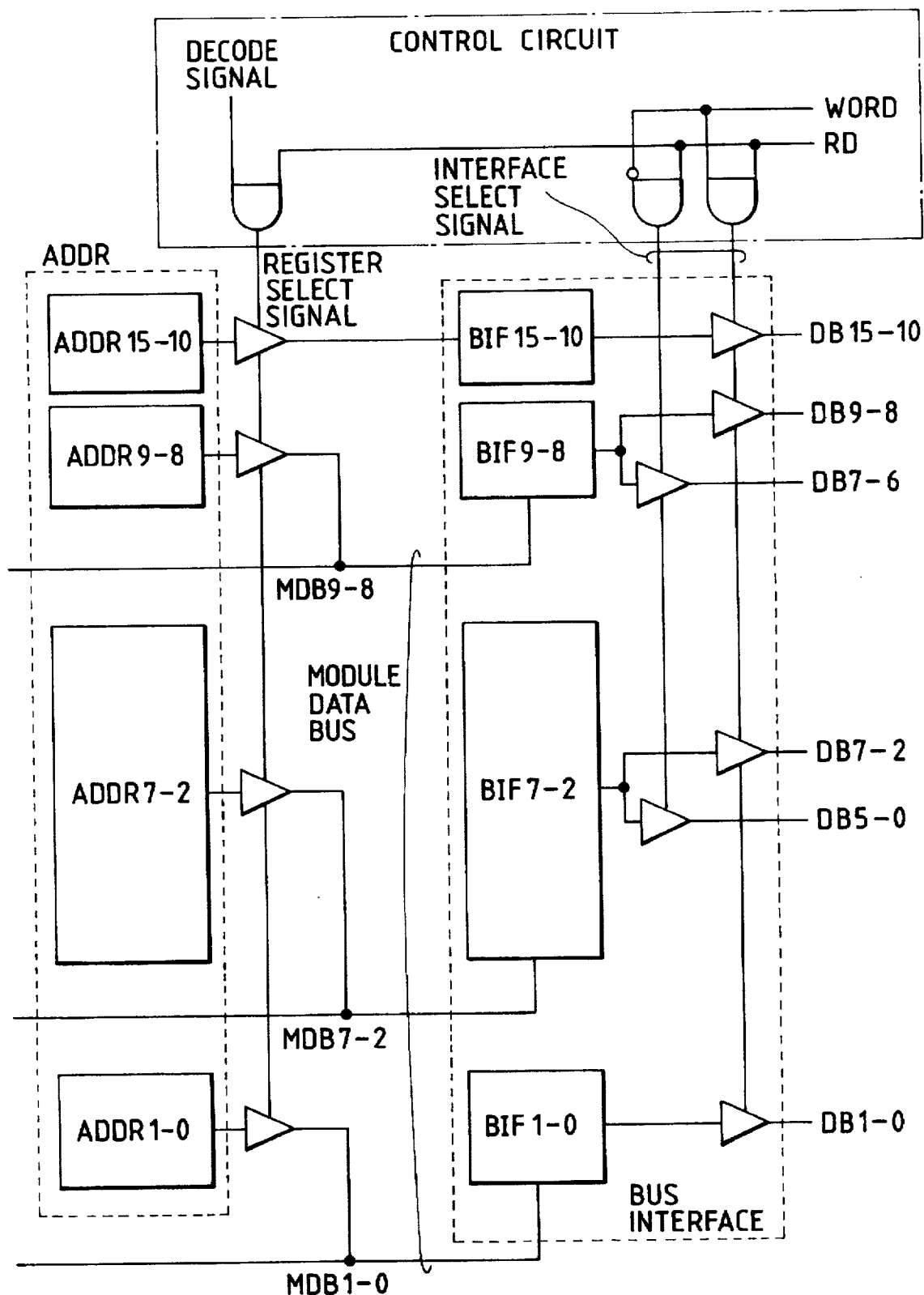
FIG. 19 is a block diagram showing a major portion of a read control circuit including a bus interface shown in FIG. 2.

FIG. 19 is a block diagram showing a principal portion of a read control circuit including the bus interface. A data register ADDR, module-in data buses MDBs and bus interfaces BIFs are respectively of 10-bit configurations. In the same drawing, 10-bit data is divided into three: bits 9 to 8, bits 7 to 2 and bits 1 to 0. The result of A/D conversion is stored so that the most significant bit of the data register ADDR corresponds to the bit 9.

The reading of data from the central processing unit CPU or the data transfer controller DTC is controlled based on the result (decode signal) of decoding of an address signal, a read signal RD and a word signal (WORD) so that the data is read therefrom. Upon reading, the decode signal and the read signal RD are respectively outputted through AND gates so that any one of the data registers ADDRA through ADDRH or either one of the control signals ADCR and ADCSR is selected. Namely, any one of output buffers corresponding to the respective registers is activated based on the decode signal so that data stored in the selected one is outputted to the module-in bus MD9-0, followed by transfer to the bus interface BIF9-0 through the module-in bus MD9-0.

Data taken in or captured in the bus interface BIF9-0 is outputted through the two-system output buffers. The 10-bit data divided into three are outputted from one output buffer as they are so as to correspond to the internal data buses DB9 to DB0. 8 bits of the high-order bit BIF9-2 are outputted from the other output buffer so as to correspond to the internal data bus DB7-0. The reading of the 10 bits activates a buffer circuit for outputting the above 10-bit data through an AND gate circuits when the read signal RD and the word signal WORD are active. At this time, "0" is outputted to a DB15-11 of the 16-bit width internal buses. The reading of one byte activates a buffer circuit corresponding to the 8 bits through the AND gate circuit when the read signal RD and the word signal WORD are inactive. Upon this byte-size read, the eight leftmost bits of the result of A/D conversion related to a 10-bit resolution are regarded as effective. In other words, the 2 bits are shifted in the downward direction and outputted to the corresponding internal data bus.

According to this construction, the central processing unit CPU or the data transfer controller DTC can designate or specify the word signal WORD whenever necessary to thereby designate the resolution of the A/D converter. When the central processing unit CPU desires to obtain the result of A/D conversion on the 10-bit resolution, the central processing unit CPU may activate and read the word signal WORD. For example, transfer commands such as MOV, W @ADDR, R0, etc. are used. On the other hand, when the central processing unit CPU desires to obtain the result of A/D conversion on a 8-bit resolution, the central processing unit CPU may deactivate and read the word signal WORD. For example, transfer commands such as MOV, W @ADDR, R0H, etc. are used. By performing data alignment through the bus interface in this way, an increase in logic scale can be reduced with an alignment circuit used as common. Further, as compared with the data alignment by software, a shift process or the like becomes unnecessary and a burden imposed to the central processing unit CPU can be greatly reduced.

In addition to the designation of the word signal by the above bus size, addresses may be disposed so as to differ from each other. As represented by an address map of FIG. 20, for example, addresses at which the result of conversion on the 10-bit resolution can be read and addresses at which the result of conversion on the 8-bit resolution can be read, may be provided independent of each other. It is convenient to continuously provide, in word (16-bit) units, addresses of the data register ADDRA through ADDRH from each of which the result of conversion on the 10-bit resolution can be read and to continuously provide, in byte (8-bit) units, addresses of the data registers ADDRA through ADDRH from each of which the result of conversion on the 8-bit resolution can be read. Particularly when the result of conversion on the 8-bit resolution is read by the data transfer controller DTC, no useless read cycle is generated.

Figure 20:
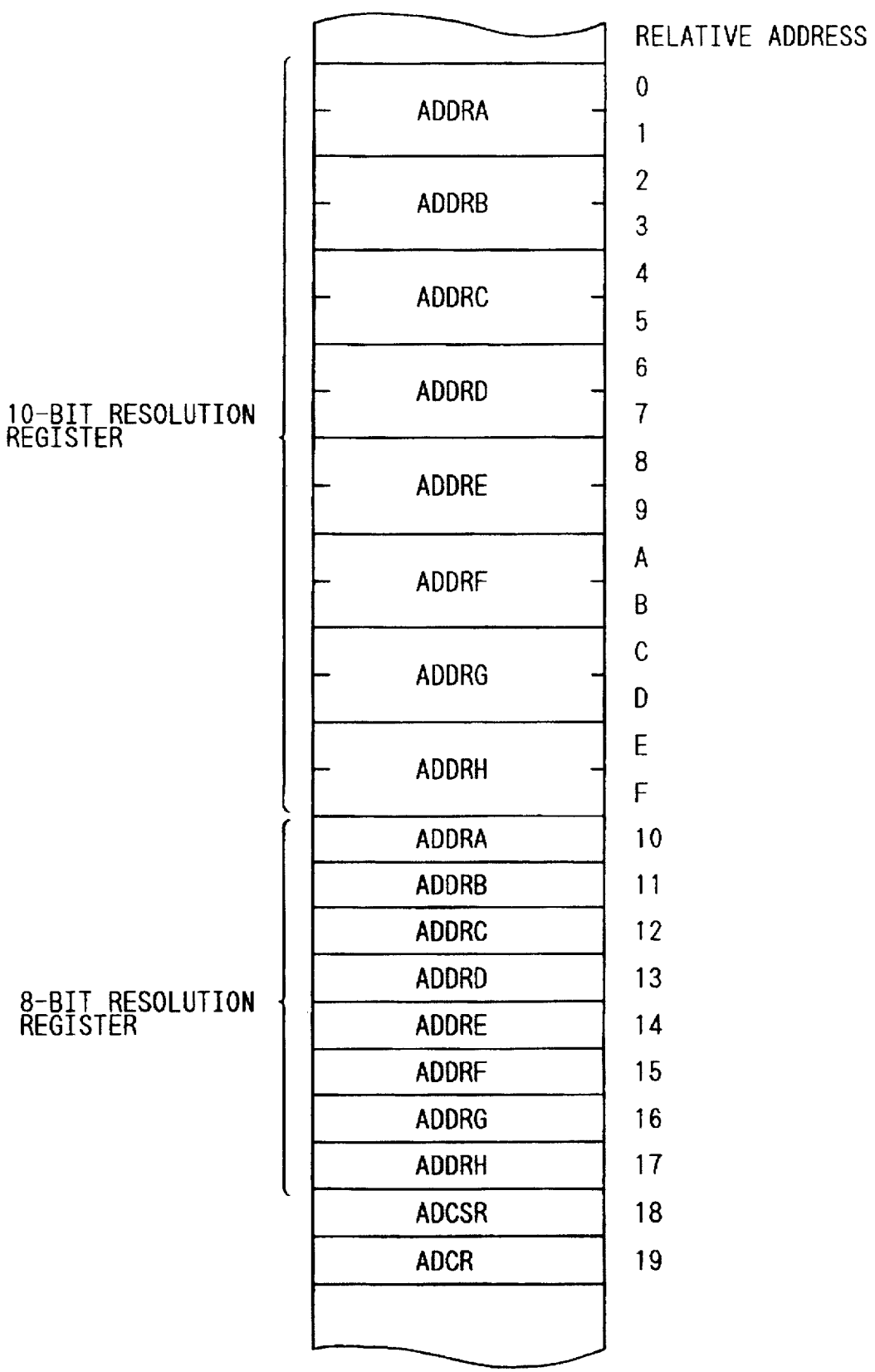
FIG. 20 is a relative address map of a data register shown in FIG. 2.

FIG. 20 illustrates relative addresses. The addresses ADDRA through ADDRH comprise both addresses (0–F) each used as a 16-bit register and addresses (10–17) each used as a 8-bit register. When word data that starts from the relative address 0, is read, the result of conversion stored at the ADDRA is read at a 10-bit resolution. When byte data at the relative address 10 is read, the result of conversion stored at the ADDRA is read at a 8-bit resolution (in the form of the low-order side data shifted to the right by two bits).

Figure 21:
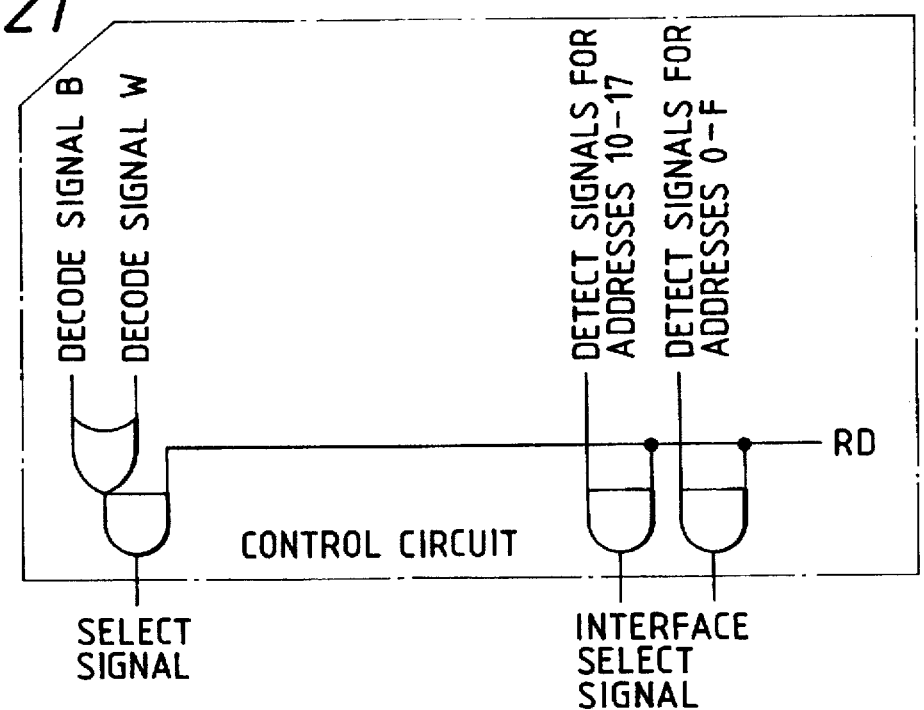
FIG. 21 is a circuit diagram showing the control circuit including the bus interface shown in FIG. 2 at the time that read control is set to an address mode.

FIG. 21 shows one example of a control circuit corresponding to the above address system. A data register applies a logical OR signal of decode signals to two addresses to read data. For example, a detect signal for the address 0, which is used as a decode signal W and a detect signal for the address 10, which is used as a decode signal B, are supplied to the ADDRA. Based on a signal, which has detected that any one of the addresses 0 through F has been given, a signal for activating the above buffer circuit including the bus interface BIF9-0 and corresponding to 16 bits in total is formed in the bus interface BIF, so that the result of conversion on the 10-bit resolution is read. In accordance with a signal, which has detected that any one of the addresses 10 through 17 has been given, a buffer circuit corresponding to a bus interface BIF9-2 and associated with a low-order byte for an internal data bus is activated so that the result of conversion on the 8-bit resolution is read.

Figure 22:
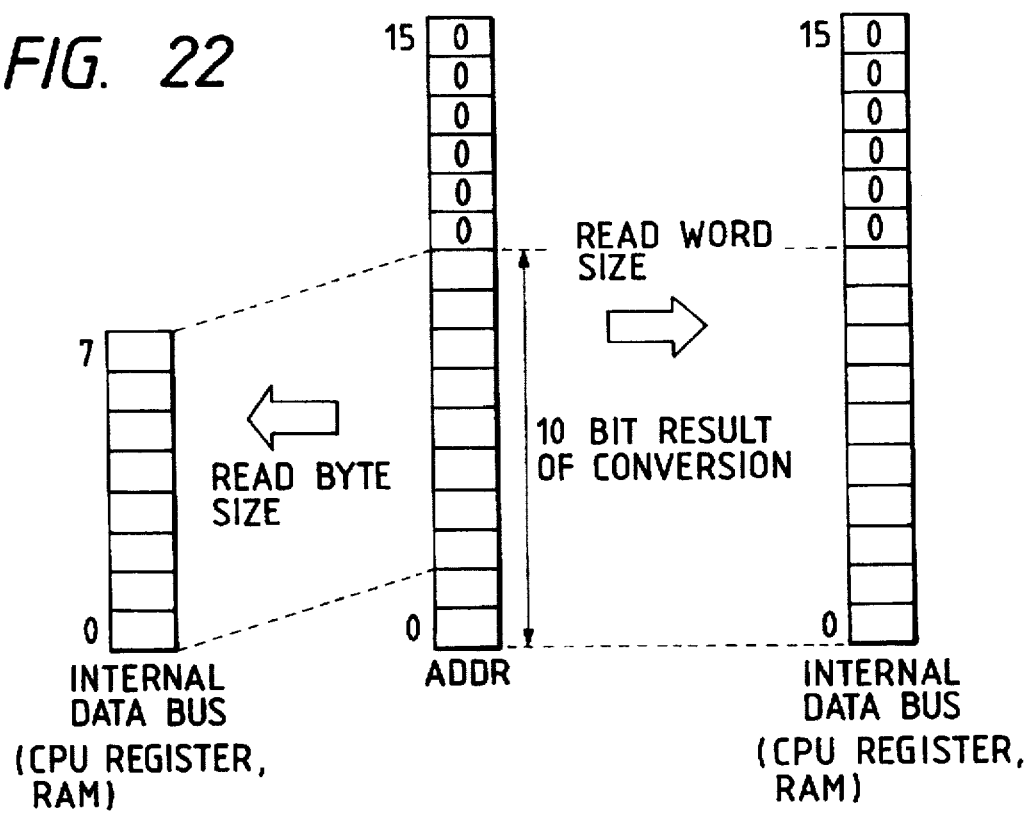
FIG. 22 is a bit layout for describing reading of word data and byte data.

FIG. 22 shows a bit layout for describing the reading of the word and byte data referred to above. The result of conversion composed of 10 bits is stored at bits 9 to 0 of a data register ADDR composed of 16 bits and "0" is stored at bits 15 to 10 thereof. When they are read as word data (10-bit resolution), the data stored at the bits 0 to 15 of the data register ADDR are outputted to their corresponding internal 16-bit data bus. On the other hand, when they are read as byte data (8-bit resolution), the data stored at the bits 2 to 9 of the data register ADDR are outputted to their corresponding internal 8-bit data bus.

Figure 23:
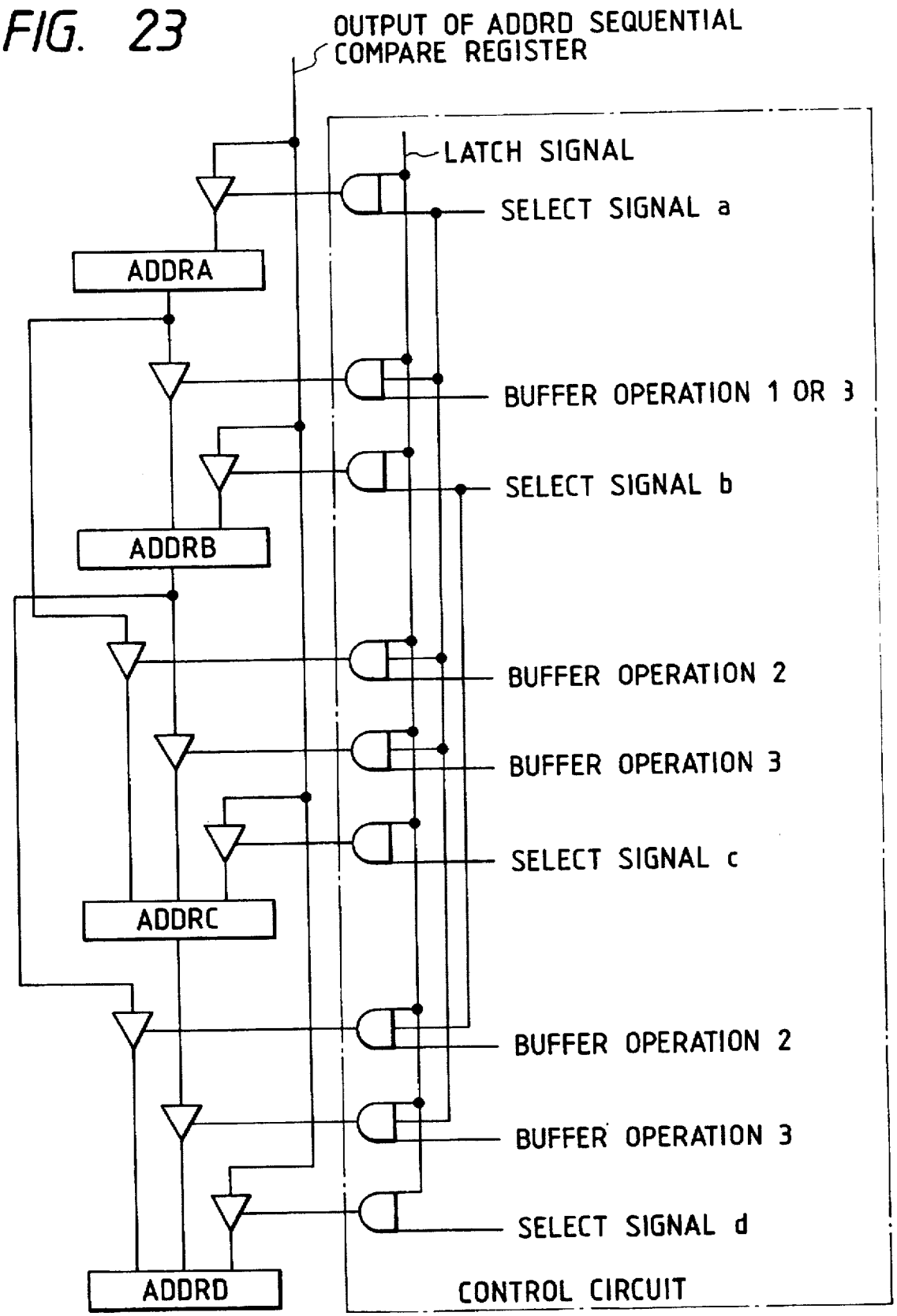
FIG. 23 is a circuit configurational view showing the mutual relationship between data registers ADDRA through ADDRD shown in FIG. 2.

FIG. 23 is a circuit configurational view showing the mutual relationship between the data registers ADDRA through ADDRD. This circuit corresponds to the above transfer operation. The respective data registers ADDRA through ADDRD can be supplied with data produced from a sequential compare register through buffer circuits. When select signals a to d for the data registers ADDRA through ADDRD are active and a latch signal at the time of the completion of conversion is brought into an active state, the contents of the sequential compare register are captured in any one of the data registers, which corresponds to the activated one of select signals a to d. The data registers ADDRA through ADDRD are set in the form of a so-called master-slave configuration.

When a BUFE1, 0 bit is of 01 in the transfer operation, a buffer operation 1 signal is brought into an active state. When the BUFE1, 0 bit is of 10, a buffer operation 2 signal is rendered active. When the BUFE1, 0 is 11, a buffer operation 3 signal becomes an active state. The buffer operation 2 and 3 signals are outputted from the control circuit based on the data set to the BUFE1, 0 of the control register ADCR.

When the select signal a and the latch signal are generated upon activation of the buffer operation 1 signal, the old data stored in the data register ADDRA is transferred to the data register ADDRB through its corresponding buffer circuit and the output of the sequential compare register is captured in the data register ADDRA.

When the select signal a and the latch signal are produced upon activation of the buffer operation 2 signal, the old data stored in the data register ADDRA is transferred to the data register ADDRC through its corresponding buffer circuit and the output of the sequential compare register is taken in the data register ADDRA. When the select signal b and the latch signal are generated, the old data stored in the data register ADDRB is transferred to the data register ADDRD through its corresponding buffer circuit and the output of the sequential compare register is captured in the data register ADDRB.

When the buffer operation 3 signals are active, the data are successively transferred in the order of the data registers ADDRA→ADDRB→ADDRC→ADDRD in synchronism with the capture of the result of A/D conversion through the corresponding buffer circuits controlled based on the signals.

Figure 24:
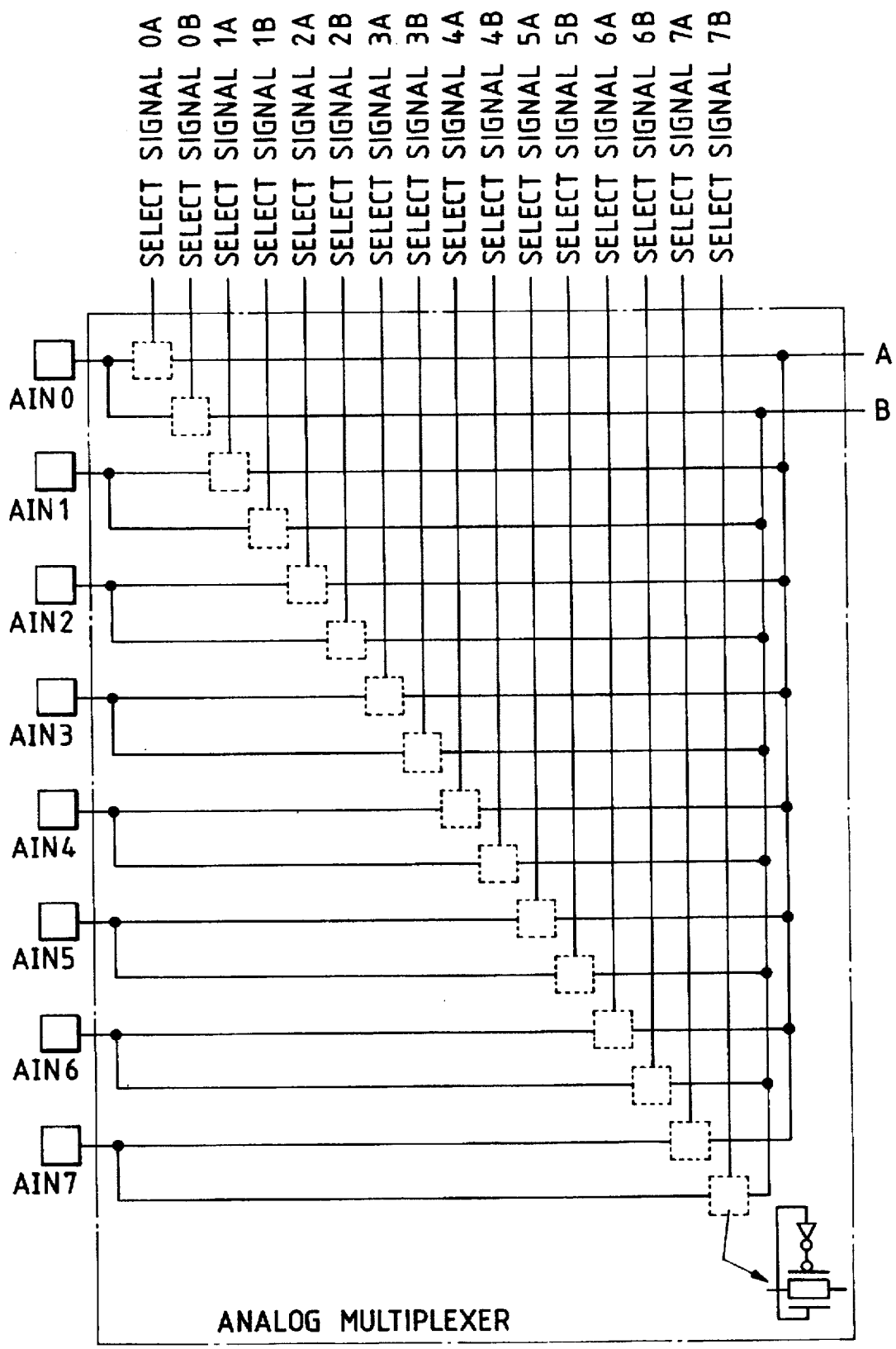
FIG. 24 is a block diagram for describing one example of an analog multiplexer shown in FIG. 2.

FIG. 24 is a block diagram showing one example of the analog multiplexer. Analog inputs AIN0 through AIN7 are respectively captured in the analog multiplexer as first and second inputs corresponding to the sample-to-hold/level shift circuits A and B through CMOS switch circuits which are respectively composed of N channel type MOSFETs and P channel type MOSFETs and are sixteen in number in total. Select signals 0A, 0B to 7A and 7B corresponding to control signals for the switch circuits are supplied from the control circuit. When, for example, the analog inputs AIN4 and AIN5 are A/D-converted in the group mode and under the simultaneous sampling, the select signals 4A and 5B are firstly rendered active so that the level of the analog input AIN4 is sampled by the sample-to-hold/level shift circuit A and the level of the analog input AIN5 is sampled by the sample-to-hold/level shift circuit B. Thereafter, the results obtained by the simultaneous sampling are successively A/D-converted.

Figure 25:
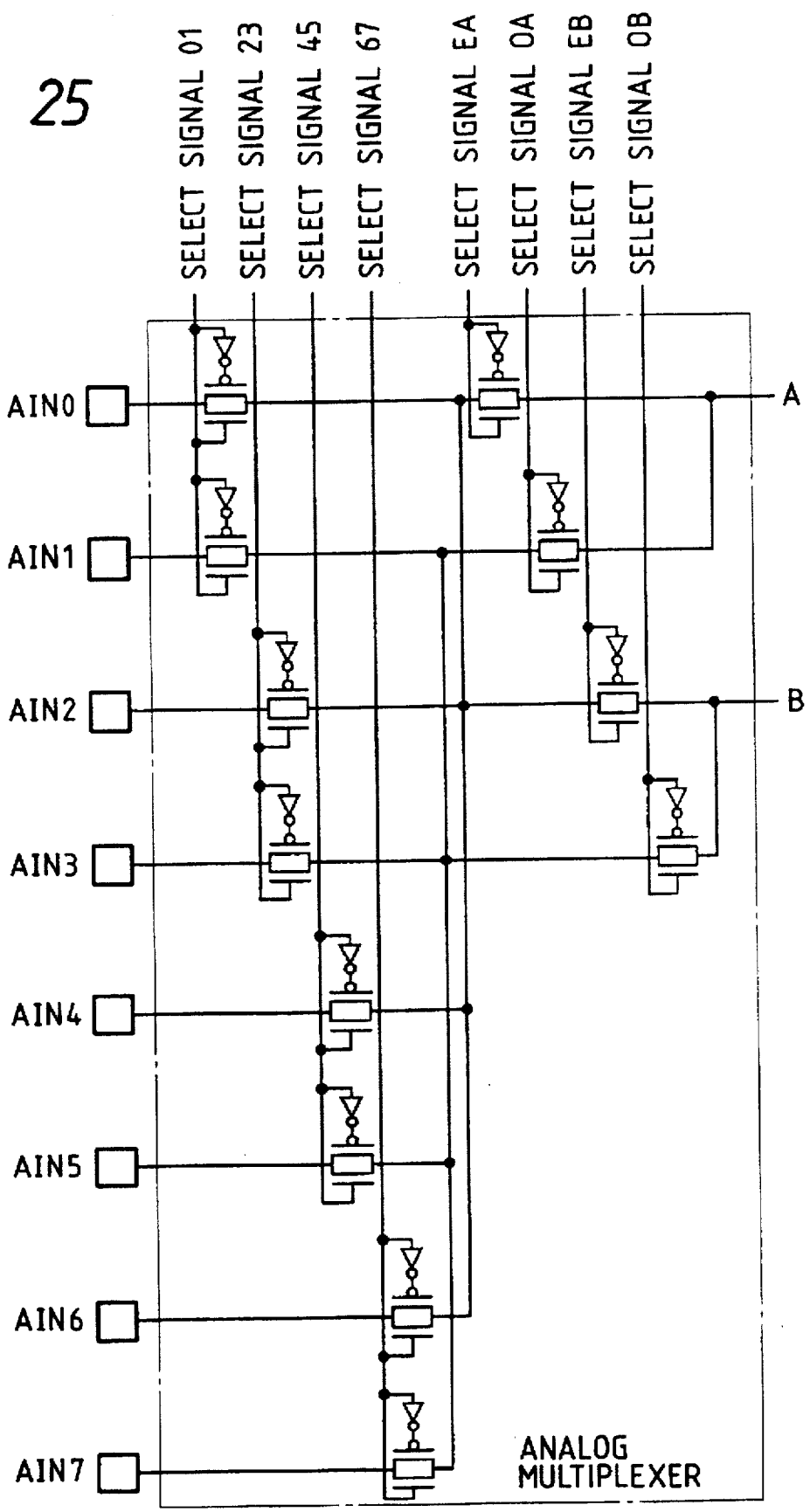
FIG. 25 is a block diagram for describing another example of the analog multiplexer shown in FIG. 2.

FIG. 25 is a circuit diagram showing another example of the analog multiplexer. Functions, which serve as input ports, protection circuits, etc. are omitted in the same manner as described above. Analog inputs AIN0 through AIN7 are respectively captured in the analog multiplexer as first and second inputs similar to the above through CMOS switch circuits each comprised of an N channel type MOSFET and a P channel type MOSFET. In the present example, one analog input is selected by the switch circuits provided in the form of two stages.

Select signals 01, 23, 45 and 67 and select signals EA, OA, EB and OB are supplied from the control circuit. The select signals 01, 23, 45 and 67 respectively select the adjacent analog inputs by two channels. The select signals 01, 23, 45 and 67 are generated by decoding CHS2 and CHS1 bits in the select mode. In the case of the group mode, they are generated based on status signals or the like employed inside the control circuit. The select signal 01 serves as an OR signal of the select signals 0A, 0B, 1A and 1B employed in the aforementioned example. Similarly, the select signal 23 serves as an OR signal of the select signals 2A, 2B, 3A and 3B, the select signal 45 serves as an OR signal of the select signals 4A, 4B, 5A and 5B, and the select signal 67 serves as an OR signal of the select signals 6A, 6B, 7A and 7B. The select signal OA serves as an OR signal of the select signals 1A, 3A, 5A and 7A. The select signal EA serves as an OR signal of the select signals 0A, 2A, 4B and 6B. The select signal EB serves as an OR signal of the select signals 0B, 2B, 4B and 6B. The select signal OB serves as an OR signal of the select signals 1B, 3B, 5B and 7B. The simultaneous sampling is set so that each odd-numbered sampling in the group mode is performed simultaneously with the immediately preceding odd-numbered sampling. Owing to this construction, the number of switches can be reduced to 12.

Figure 26:
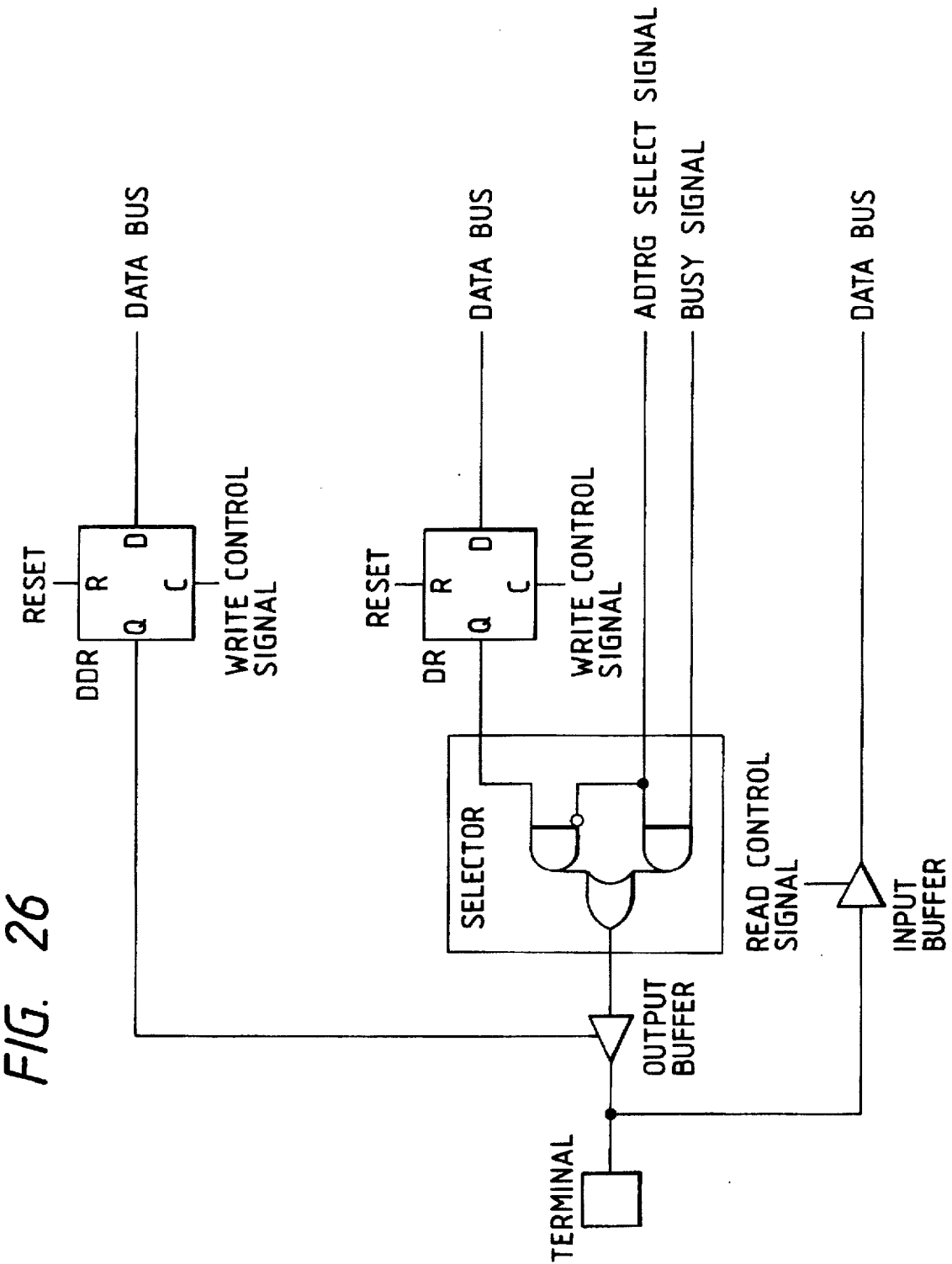
FIG. 26 is a circuit diagram illustrating one example of a BUSY output control circuit employed in the present invention.

FIG. 26 is a circuit diagram showing one example of a BUSY output control circuit included in the eighth port IOP8. A BUSY output also serves as a port for inputting and outputting data. The BUSY output control circuit comprises a terminal, an output buffer, a data direction register DDR, a data register DR, an input buffer and a selector.

The data direction register DDR comprises a flip-flop. A write control signal is supplied to the data direction register DDR based on a write signal and an address decode signal both unillustrated in the drawing so that the contents of a data bus are written therein. When the data direction register DDR is set to "1", the terminal is brought into an output state (the output buffer is brought into an enable state) and the output of the output buffer is outputted to the terminal. A control signal for the selector is regarded as a signal indicating that the A/D converter has selected an external trigger of ADTRG in the TRGS1, 0 bits. When the external trigger is selected, a BUSY signal from the A/D converter is selected. When the external trigger is not selected, the output of a data register DR is selected. The data register DR is composed of a flip-flop. A write control signal is supplied to the data register DR based on a write signal and an address decode signal both unillustrated in the drawing so that data on the data bus is written into the data register DR. Further, a read control signal is supplied based on a read signal and an address decode signal both unillustrated in the drawing so that the data supplied to the terminal is read into the data bus.

When the BUSY signal is outputted to the outside, the external trigger of ADTRG is selected and the data direction register DDR is set to "1". When a conversion start other than the ADTRG is selected, the same level as that of a BUSY state may preferably be outputted as a port output in a non-selected state of the ADTRG.

When only a storage space corresponding to one sampling exists in a data buffer upon commencement of sampling in accordance with the ADTRG, the BUSY signal is rendered active. When an ADF flag is set to "1", the BUSY signal is brought into an active state. When the ADF flag is thereafter cleared to "0", the BUSY signal is brought into an inactive state. When the BUSY output control circuit starts to operate in response to the ADTRG signal in a select mode in a state in which the ADF flag has been cleared to "0", for example, the BUSY signal is brought into the active state upon commencement of sampling. With the completion of A/D conversion, the ADF flag is set to "1". When the ADF flag is thereafter cleared to "0" by either the central processing unit CPU or the data transfer controller DTC, the BUSY signal is brought into the inactive state.

When the BUSY output control circuit starts to operate in response to the ADTRG signal in a group mode in a state in which the ADF flag has been cleared to "0", the BUSY signal enters into the active state upon commencement of sampling on the final channel. When a buffer operation of a one-input second register is designated or specified, the BUSY signal is rendered active upon the second sampling. When a buffer operations of a one-input fourth register is specified, the BUSY signal is rendered active upon the fourth sampling. When a buffer operation of a two-input fourth register is specified, the BUSY signal is rendered active upon the second sampling on a second channel.

Figure 27:
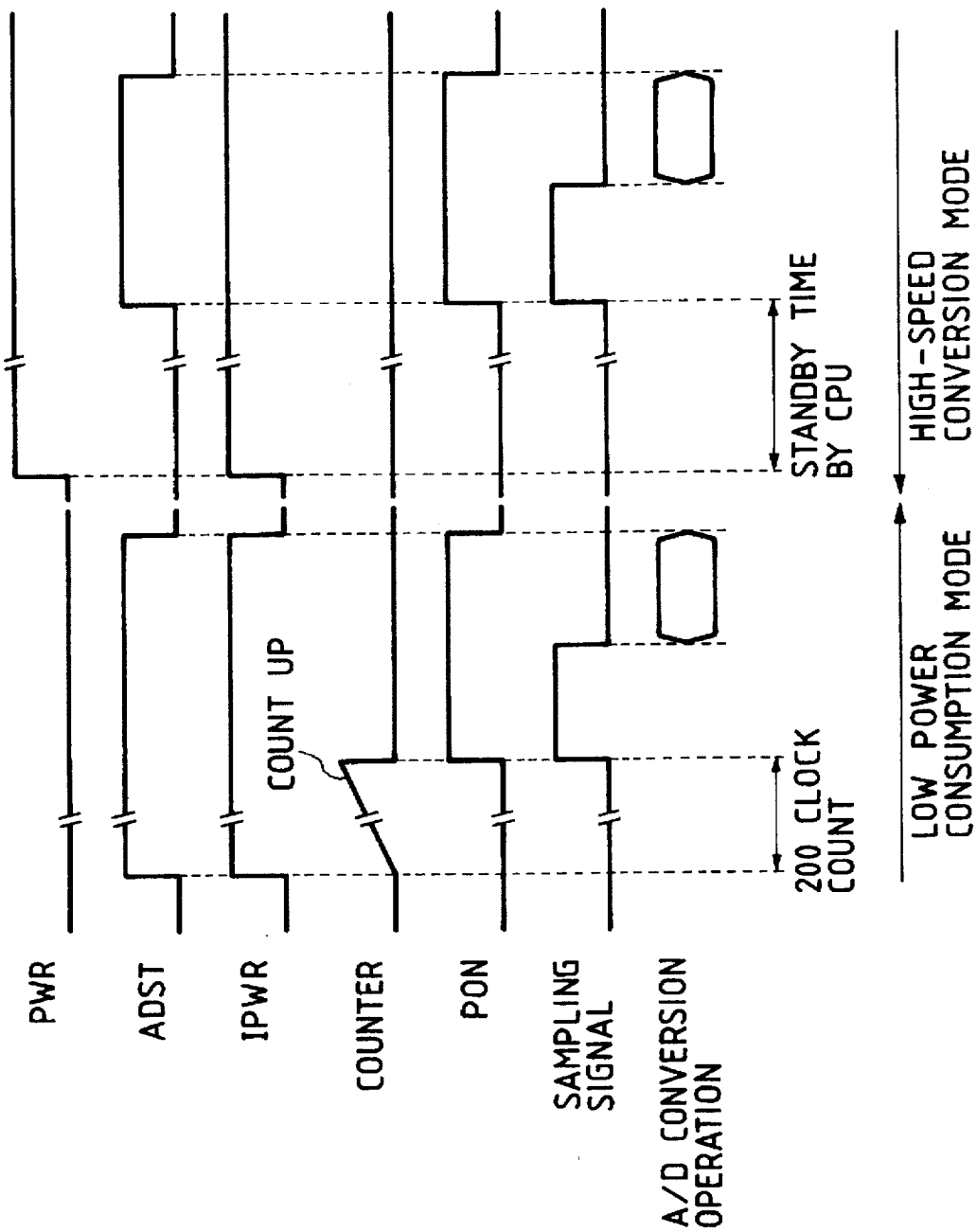
FIG. 27 is a timing chart for describing the operation of the A/D converter employed in the present invention.

FIG. 27 is a timing chart for describing the operation of the A/D converter based on a PWR bit. The PWR bit remains cleared to "0" in a conversion standby state. An analog circuit reduces a current to be consumed in an inactive state. When an ADST bit is set to "1" by software, an external trigger or a timer trigger in this condition, a flag IPWR in the control circuit is set to "1". Although the analog circuit is made active, the A/D converter is brought into a standby state during a period of 200 clocks until the analog circuit is stably activated (e.g., when a MOSFET of an arithmetic amplifier is charged). Thereafter, a PON signal outputted from the control circuit is brought to "1" to perform the initial A/D conversion operation. Subsequent operations are similar to the above. After completion of the designated A/D conversion operation, the IPWR flag is cleared to "0" so that the analog circuit is brought into the inactive state. A counter for counting the 200 clocks is included in the control circuit.

When the PWR bit is set to "1" in advance by the software, the internal IPWR flag is set to "1". At this time, the analog circuit is rendered active. When a predetermined time (corresponding to the above 200 clocks, e.g., 10 μs) has elapsed, the A/D converter is brought into a convertible state. Thereafter, when the ADST bit is set to "1" by the software, the external trigger or the timer trigger, the internal PON signal is brought to "1" so that the A/D conversion is immediately started. The internal IPWR bit is held as it is. The counter for counting the above 200 clocks is rendered ineffective.

When a monitor for monitoring a regular external input is used, e.g., when an input signal that sufficiently lags behind the 200 clocks, is A/D-converted, the PWR bit is cleared to "0". Further, when the A/D conversion is made possible, the ADST bit is set to "1" to start the A/D conversion and the PWR bit is cleared to "0" in accordance with an A/D conversion end interrupt routine. The result of A/D conversion may be processed in this way. It is unnecessary for the software to measure the 200 clocks (it is only necessary to wait for an interrupt). Further, no burden is imposed on the software. Since the analog circuit can minimize an active-state period, less current consumption can be provided.

When it is necessary to immediately start A/D conversion in predetermined timing, the PWR bit may simply be set to "1" in advance by software in accordance with a reset processing routine, for example. After a time interval longer than or equal to 200 clocks or so has elapsed, the ADST bit is set to "1" by the software at a desired point in time to thereby start the A/D conversion. Bits other than the PWR bit and the ADST bit can be arbitrarily set.

In order to initialize the system and the single chip microcomputer, 200 clocks or more are often needed. Therefore, the A/D conversion is always placed in an enable state in practical use. Since the A/D conversion is thereafter immediately started by setting the ADST bit to "1" by the software, the external trigger or the timer trigger, the accuracy of processing and real-time properties can be improved.

Figure 28:
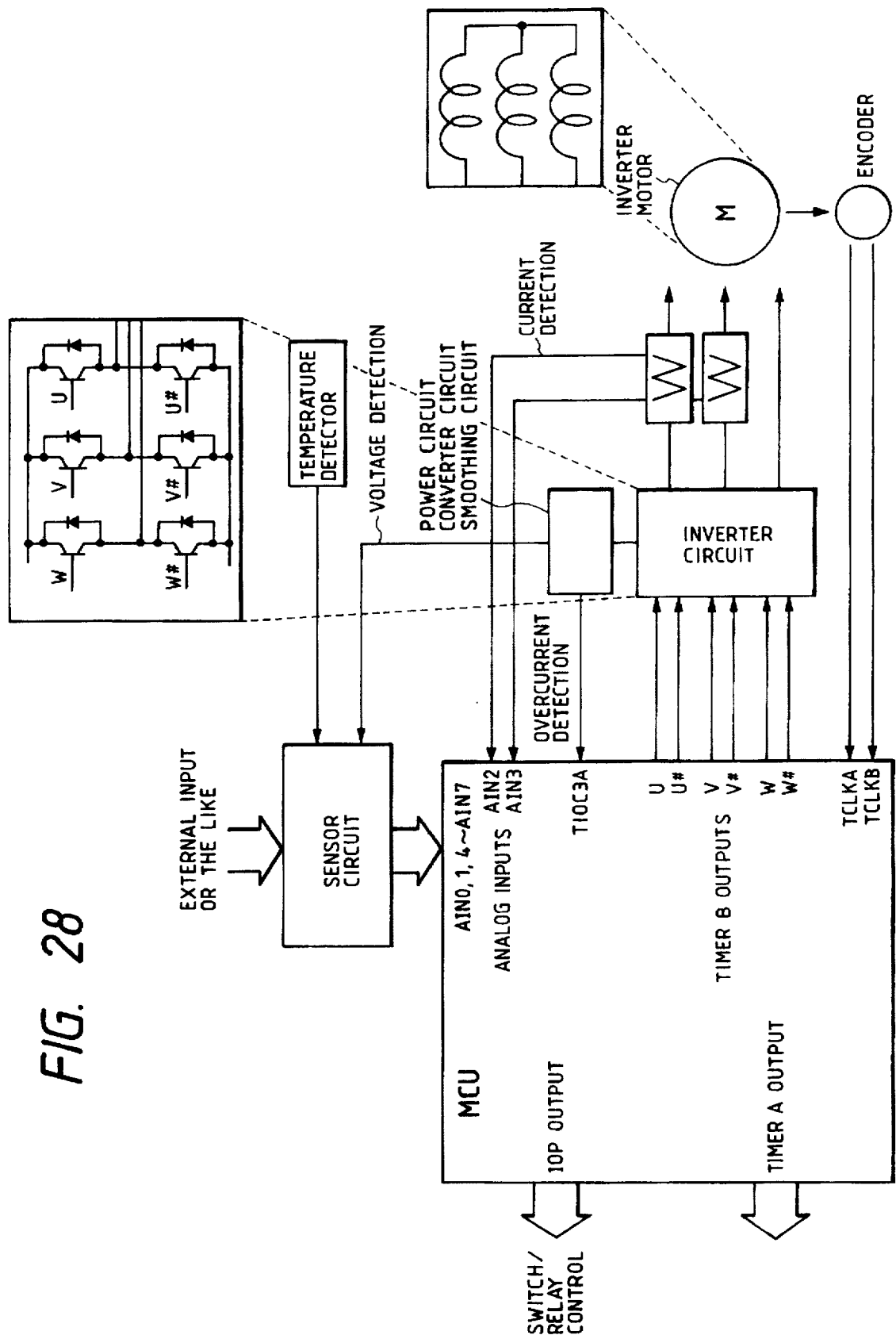
FIG. 28 is a block diagram showing one embodiment of a control system using a single chip microcomputer, according to the present invention.

FIG. 28 is a block diagram showing one embodiment of a control system using a single chip microcomputer, according to the present invention. The single chip microcomputer shown in FIG. 1 is used as the single chip microcomputer MCU shown in the same drawing. The control system shown in the same drawing is intended for control on a motor such as an AC induction motor or a brushless DC motor or the like with the single chip microcomputer.

An inverter motor M is driven through an inverter circuit, using complementary three-phase PWM outputs (U, U#, V, V#, W and W#) outputted from a timer B. The complementary three-phase PWM outputs have been described in the "H8/3003 Hardware Manual", pp. 374–381, for example. If the non-overlap time interval can be set between the positive-phase/negative-phase outputs as described above, then series-connected transistors forming the inverter circuit are simultaneously turned on, thereby making it possible to prevent a large through-current from being generated therethrough.

The output of the inverter circuit drives the motor. Although no particular limitations are made, the output of the inverter circuit is supplied to a so-called Y-connection (or star connection) or Δ-connected stator windings provided inside the motor, for example. The cycle or period (carrier period) of each of the PWM outputs is set to 4000 states (20 μs=5 KHz), for example.

Inverter drive currents corresponding to two phases are detected and inputted to analog inputs AIN4 and AIN5 of the A/D converter. Since the output of the inverter circuit is supplied to the Y-connection (or star connection) or the Δ-connected windings, the value of the sum of three-phase currents becomes 0. A current corresponding to the third phase can be determined by detecting a two-phase current. The A/D conversion on these is started up based on a compare match A and an underflow of the timer B and is performed in a group/single mode.

Namely, a control register can measure a motor current synchronized with a timer output. Since the A/D converter can be started by hardware, the time elapsed between predetermined timing of the timer and measurement of the drive current of the motor can be reduced and the accuracy of detection can be improved. Sampling is made in 20 states (1 μs) and the result of A/D conversion can be obtained in 80 states (4 μs). The simultaneous sampling of the currents corresponding to the two phases permits an improvement in current detection accuracy, enables reflection on the timer output and allows an improvement in control accuracy.

These currents need accuracy and the central processing unit CPU performs a read operation in a word size to obtain a 10-bit resolution. Since data are rightmost-aligned, the central processing unit CPU can perform operations directly to other parameters. The processing of the central processing unit CPU can be speeded up. A PWM duty is changed in such a manner that the result of measurement of the current coincides with an intended value of current, for example. The use of the A/D converter according to the present invention permits an improvement in the accuracy of measurement, a reduction in burden imposed to software and an improvement in the processing performance of the entire system.

Further, outputs such as an atmosphere temperature, a voltage, etc., which are detected by a sensor circuit, are inputted to analog inputs AIN0, 1 and 4 to 7 of the A/D converter. For example, a compare match or an overflow interrupt of a timer A is generated at each about 100 ms. The central processing unit CPU sets the control register in response to such an interrupt process. Thus, the analog inputs AIN0, 1 and 4 to 7 serve so as to sample sensor information at regular time intervals in a group/single mode, for example.

Resolution for the atmosphere temperature, power voltage, etc. are not so necessary. The central processing unit CPU can perform a read operation in a byte size to obtain data of 8-bit resolution. The central processing unit CPU determines or judges the contents of the data and changes various parameters or performs other input/output processes. For example, the PWM duty of the timer B is changed. Other outputs of the timers A and B serve so as to drive another DC motor or stepping motor through another driver circuit. input/output ports IOP1 through IOP3 serve so as to control various switches or relays or the like.

Figure 29:
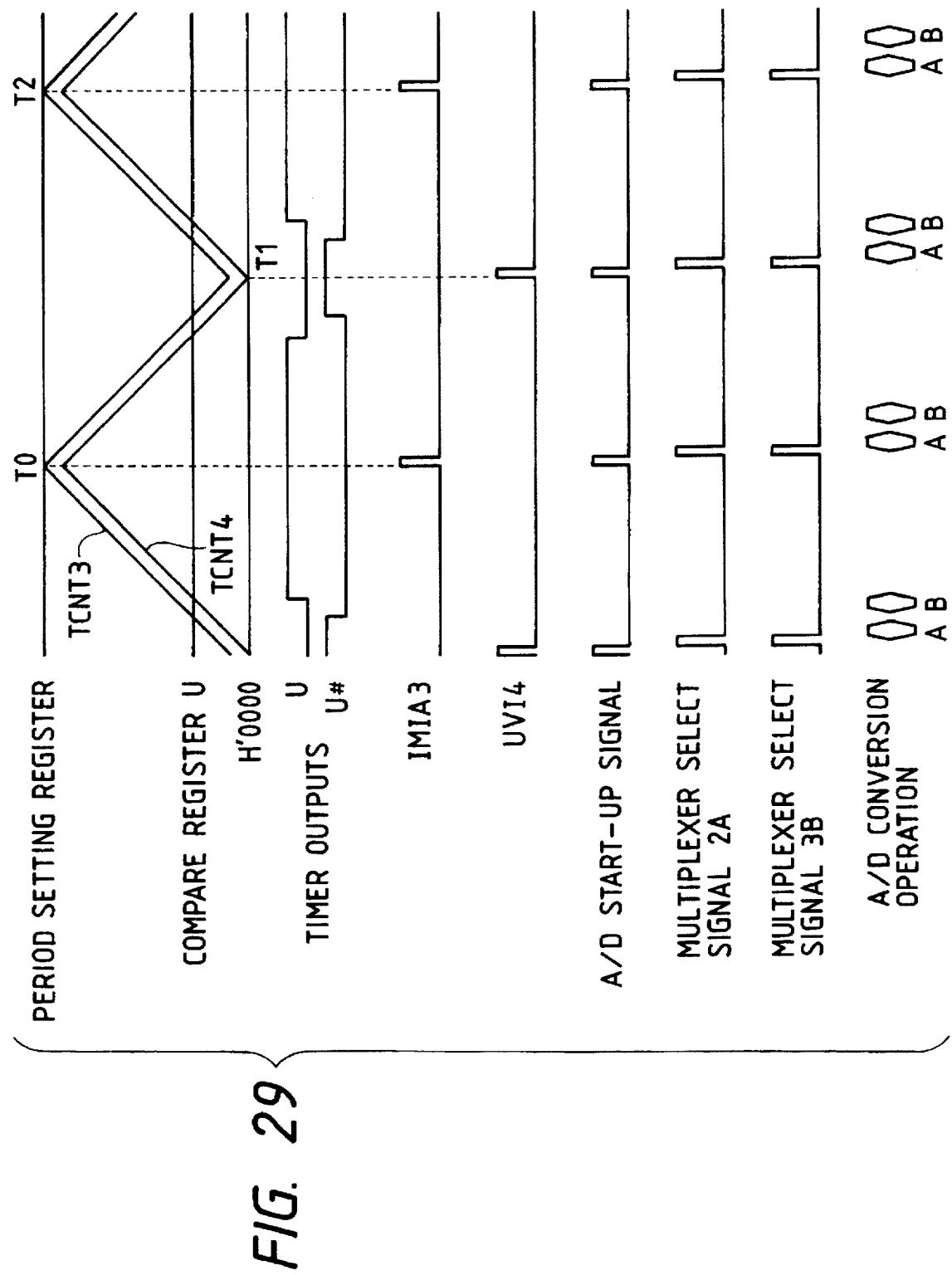
FIG. 29 is a timing chart for describing examples of both operations of a timer B and the A/D converter employed in the present invention.

FIG. 29 is a timing chart for describing examples of both operations of the timer B and the A/D converter. The timer B counts up/down of two up/down counters TCNT3 and TCNT4, which is made between 0 and a period setting register. Timer outputs U and U# are outputted based on a compare match between these counters TCNT3 and TCNT4 and a compare register U. The outputs U and U# become PWM outputs having a complementary non-overlap relationship therebetween. Similarly, timer outputs V and V# and W and W# are outputted based on a compare match between unillustrated compare registers V and W.

The central processing unit CPU starts up the A/D converter in accordance with both a compare match between the counters and the period setting register of a channel 3 in the timer B and an underflow of a channel 4. The central processing unit CPU sets the control register to the input channels AIN2 and AIN3 and holds the start-up of the A/D converter by the timer B in a selected state. The A/D converter is placed in a standby state when the above start-up factor is not generated.

The timer supplies a logical OR signal of the compare match A3 of the channel 3 and the underflow of the channel 4 to the A/D converter as a start-up signal for the A/D converter. When the selected start-up signal is generated, analog multiplexer control signals 4A and 5A are simultaneously rendered active so that the input signals of AIN2 and AIN3 are simultaneously stored in the sample-to-hold/level shift circuits A and B. Thereafter, A/D conversion operations A and B are successively performed and the results of A/D conversion on the input signals AIN2 and AIN3 are stored in their corresponding data registers. Thus, the drive current of the motor can be measured. Since these signals are simultaneously sampled, relative current values can be accurately measured. Owing to the simultaneous sampling, the result of calculation of a current value corresponding to a third phase also becomes accurate.

Figure 30:
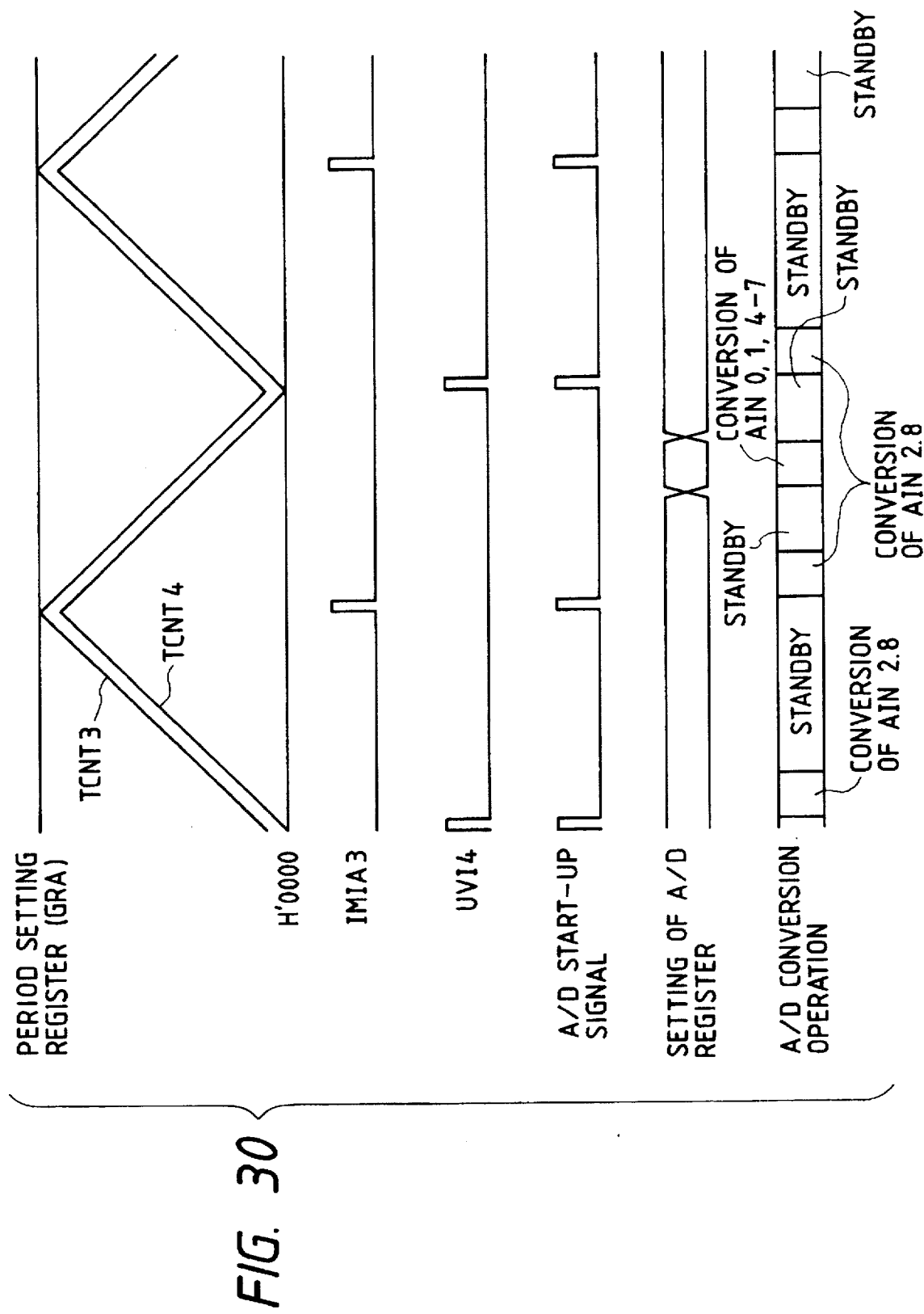
FIG. 30 is a timing chart for describing other examples of the operations of the timer B and the A/D converter employed in the present invention.

FIG. 30 is a timing chart for describing other examples of the operations of the timer B and the A/D converter. The timer B counts up/down of two up/down counters TCNT3 and TCNT4, which is made between 0 and a period setting register GRA in the timer B in the same manner as described above. Similarly, timer outputs U and U# are outputted based on a compare match between these counters TCNT3 and TCNT4 and a compare register U. The outputs U and U# become PWM outputs having a complementary non-overlap relationship therebetween. Similarly, timer outputs V and V# and W and W# are outputted based on a compare match between unillustrated compare registers V and W in the same manner as described above.

The A/D converter is started up in accordance with both a compare match between the counters and the period setting register of a channel 3 in the timer B and an underflow of a channel 4 in the same manner as described above. The central processing unit CPU sets the control register to the input channels AIN2 and AIN3 and holds the start-up of the A/D converter by the timer B in a selected state. The A/D converter is placed in a standby state when the above start-up factor is not generated.

The timer supplies a logical OR signal of the compare match A3 of the channel 3 and the underflow of the channel 4 to the A/D converter as a start-up signal for the A/D converter. When the selected start-up signal is generated, the results of A/D conversion on the input signals AIN2 and AIN3 are stored in their corresponding data registers in the same manner as described above. Thus, the drive current of the motor can be measured.

Further, when it is desired to A/D-convert other input analog signals applied to the A/D converter at regular time intervals in accordance with a compare match of a timer A and the like, the central processing unit CPU is caused to perform an interrupt process by the compare match interrupt of the timer A. In accordance with the interrupt process, the central processing unit CPU resets the control register of the A/D converter so as to A/D-convert desired analog inputs, thereby making it possible to input other sensor information or the like. For example, the central processing unit CPU performs desired processing on the result of conversion and reflects it on the setting of subsequent timer outputs as parameter information. After completion of the A/D conversion processing, the control register is set so that the A/D converter is started up based on both the compare match with the period setting register of the channel 3 in the timer B and the underflow of the channel 4, whereby the result of A/D conversion corresponding to the motor drive current resultant from the input signals AIN2 and AIN3 can be obtained. Thus, the measurement of the motor current synchronized with each of the PWM outputs and the A/D conversion of other analog inputs can be carried out with the single A/D converter.

Figure 31A:
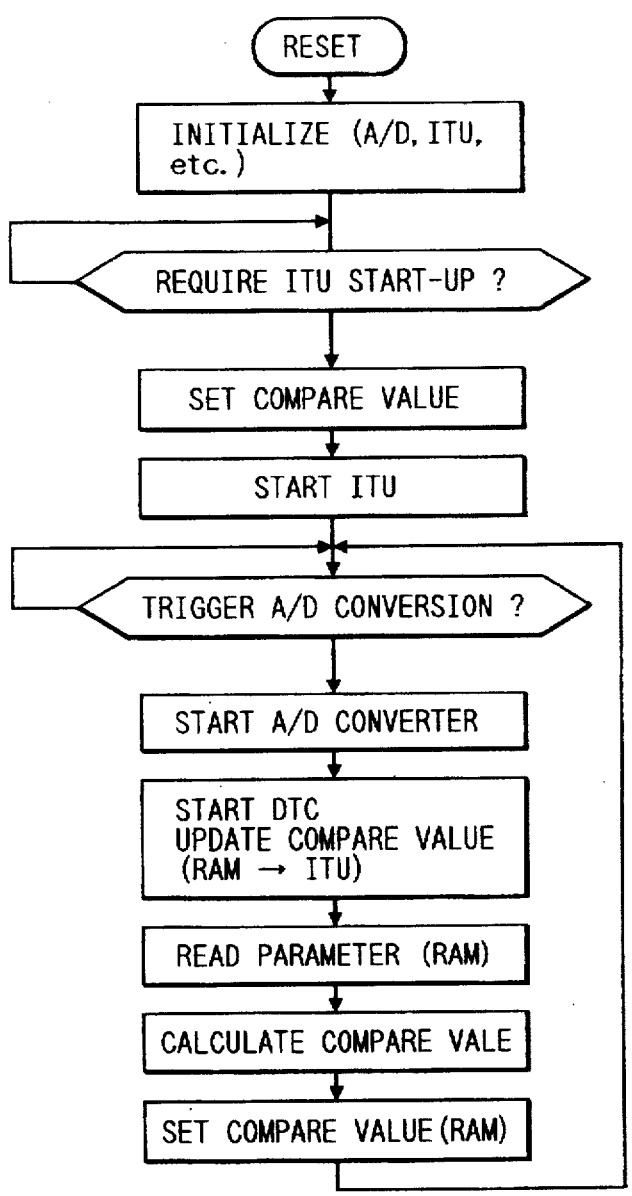
FIG. 31 is a flowchart for describing the operation of the single chip microcomputer employed in the present invention.

FIG. 31 is a flowchart for describing the operation of the single chip microcomputer. Referring to FIG. 31(A), when the reset is cleared, the microcomputer is initialized. This initialization includes initialization made to the timer ITU, A/D converter, data transfer controller DTC, I/O ports, etc. The A/D converter is set so that the input channels AIN2 and AIN3 are converted in accordance with the trigger of the timer ITU. The timer A starts operating as an interval timer.

When the above initialization is completed, the motor is placed in a start-up request waiting state. A request to start the motor is given from, for example, the host central processing unit CPU through the corresponding input/output port. When the start-up request is made, a compare value is calculated in accordance with desired processing and placed in a first region on the RAM.

The timer ITU is started up. Thus, the timer ITU produces a timer output and is placed in an interrupt waiting state. When an IMIA3 interrupt (peak; periods T0 and T2) corresponding to the compare match signal shown in FIG. 29 or a UVI4 interrupt (valley; period T1) corresponding to the underflow signal are triggered, a start-up signal is supplied to the A/D converter so that the A/D conversion on the input channels 2 and 3 is performed in accordance with the initialization on an automatic or hardware basis. Further, the data transfer controller DTC is started up in response to the IMIA3 interrupt (peak) or the UVI4 interrupt (valley) to transfer the compare value from a predetermined address on the RAM to each of buffer registers (TGB, DRGC and TRGD) of the timer ITU, whereby the PWM duty is changed.

The result of A/D conversion by the A/D converter is read in accordance with an interrupt processing routine of the central processing unit CPU to obtain motor drive currents corresponding to two phases. Further, a motor drive current corresponding to a third phase is calculated based on the motor drive currents. In addition to this, the input values of the sensor circuit, which have been held in a second region on the RAM in advance, are read. By referring to the above and unillustrated ones such as a speed command, motor position/speed, a motor drive current and sensor input values, desired processing is executed to thereby calculate a new compare value. The calculated compare value is placed in the first region on the RAM.

Figure 31B:
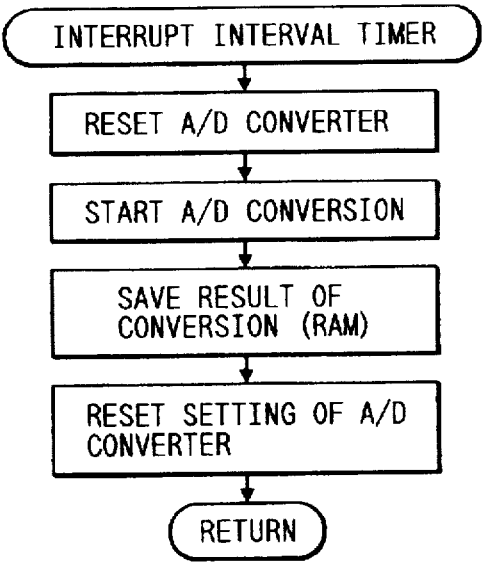

When an interval interrupt of the timer A is triggered as shown in FIG. 31(B), the values set to the A/D converter are changed and the input values of the sensor other than the motor drive currents are A/D-converted under the startup of software. The results of conversion are held in the second region on the RAM. The setting of the A/D converter is reset to its original state, followed by proceeding to Return.

Figure 33:
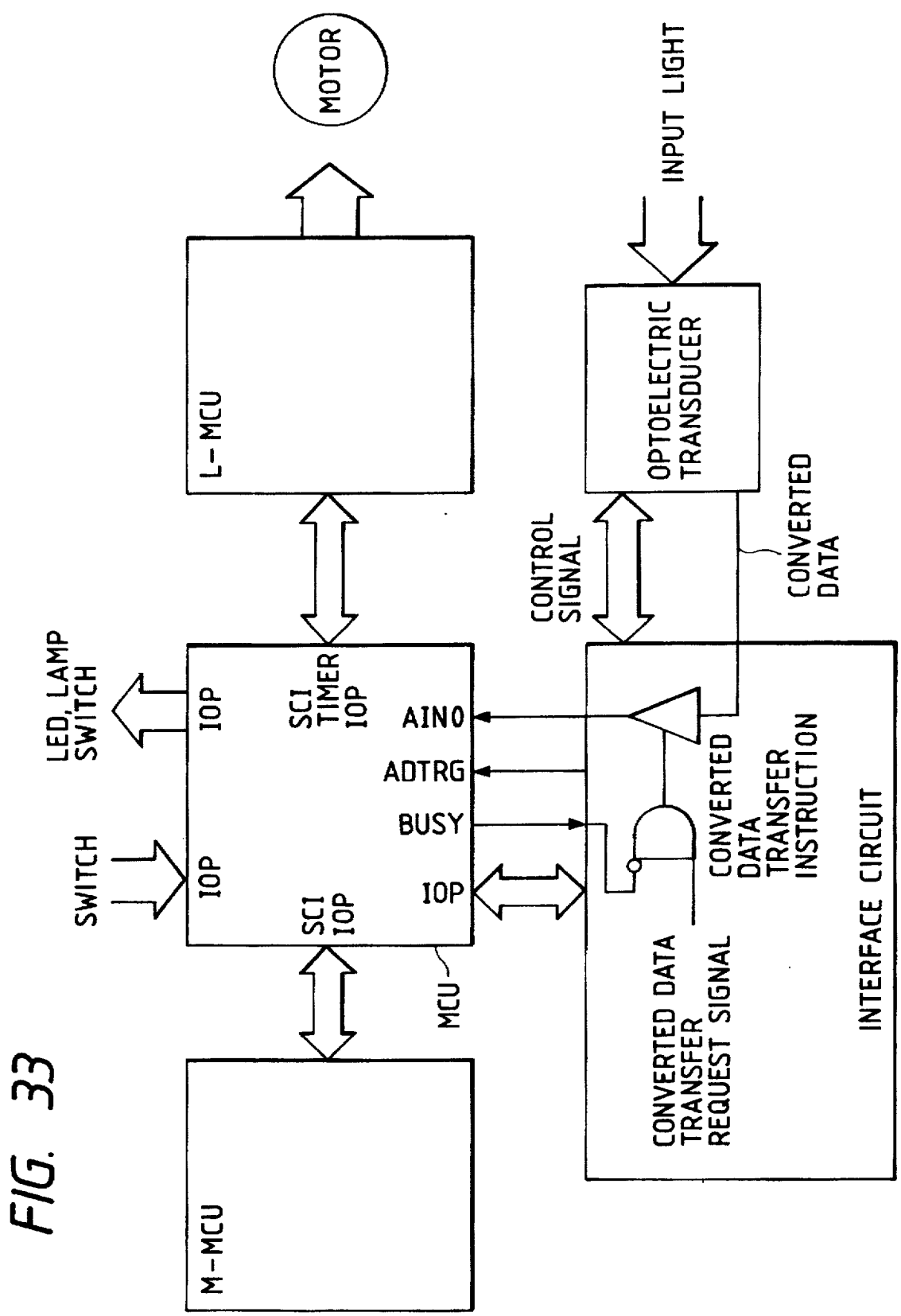
FIG. 33 is a block diagram showing another embodiment of a control system using a single chip microcomputer, according to the present invention.

FIG. 33 is a block diagram showing one embodiment of another control system using a single chip microcomputer, according to the present invention. As the single chip microcomputer MCU shown in the same drawing, the single chip microcomputer shown in FIG. 1 is used. The control system shown in the same drawing is intended for automatic focus control of a lens unit in a camera, using the single chip microcomputer.

Input light obtained through a lens and a half mirror or the like is converted into an electric signal by an optoelectric transducer such as a CCD (Charge-Coupled Device) or a BASIS or the like. The output of the optoelectric transducer is inputted to an AIN0 through an interface circuit including an amplifier, a buffer, etc. as an analog input. A trigger signal ADTRG outputted from the interface circuit is inputted to the microcomputer MCU through an external trigger terminal. The microcomputer MCU supplies a BUSY signal to a logic gate circuit provided within the interface circuit and instructs the interface circuit to discontinue the supply of the optoelectrically-converted data (AIN0) to the single chip microcomputer MCU. The interface circuit controls converting and reading operations of the optoelectric transducer. The interface circuit detects either a match or a mismatch of the focus in accordance with a secondary phase-difference detection system, for example.

The microcomputer MCU employed in the present embodiment issues or outputs a command or instructions to a lens microcomputer L-MCU so that the lens microcomputer L-MCU drives an AF motor for the lens. The command issued to the L-MCU may be executed by a serial communication interface SCI or may be one like a two-phase encoder pulse. Alternatively, the command may be executed by other digital output. Further, an encoder input of the AF motor is inputted to clock inputs (TCLKA and TCLKB) of a timer B to detect the speed and position of the AF motor. While monitoring these, the AF motor is driven.

The microcomputer MCU communicates with a main microcomputer M-MCU, the lens microcomputer L-MCU and an EEPROM (Electrically Erasable and Programmable Read Only Memory) through the serial communication interface SCI and the input/output port. The EEPROM stores various control information therein. For example, data for correcting light-receiving sensitivity for each optoelectric transducer is stored in the EEPROM. The accuracy of AF can be improved owing to this correction. The main microcomputer M-MCU inputs an operation mode command and a focus-detection start command to the microcomputer MCU and notifies the completion of the focus detection thereto. In addition, the microcomputer MCU drives an LED (Light-Emitting Diode) based on the output of the port and turns on a lamp such as auxiliary light or the like employed upon the focus detection. Otherwise, the microcomputer MCU receives inputs from various switches and the like.

An A/D converter selects an A/D conversion start according to a select/single mode, a transfer operation, and an external trigger. The data transfer controller DTC is started up based on an conversion end interrupt to save the result of conversion in a RAM. When a predetermined signal is triggered at the external trigger ADTRG, an ADST set signal is generated in synchronism with an internal clock φ. Thereafter, an ADST bit is set to "1" after a half-clock delay to start an A/D conversion operation.

On the other hand, when the motor is driven as described above, a compare match signal or an underflow signal is generated in synchronism with the internal clock φ as shown in FIG. 32(B). An ADST set signal is generated in response to the next clock. Further, an ADST bit is set to "1" after a half-clock delay in the same manner as described above to start an A/D conversion operation.

When the A/D conversion operation is completed, the result of A/D conversion is stored in a data register ADDRA and the ADST bit is cleared to "0" to place the A/D converter in an conversion waiting state. When the next external trigger signal ADTRG is generated, the ADST bit is set to "1" in the same manner as described above so that the input of AIN0 is A/D-converted. When the A/D conversion is finished, the contents of the data register ADDRA are transferred to a data register ADDRB according to the above transfer operation and the result of A/D conversion is stored in the data register ADDRA. Similarly, when four A/D conversion operations are executed in accordance with external trigger signals ADTRG generated four times so that the results of conversion are stored in their corresponding data registers ADDRA through ADDRD, an ADF bit is set to "1" so as to trigger a conversion end interrupt (output an interrupt signal ADI from the control circuit).

By starting up the data transfer controller DTC in response to the conversion end interrupt, the results of conversion corresponding to four times are saved onto the RAM in a block transfer mode. When this processing is repeated by a desired number of times (corresponding to the number of times set to a counter of the data transfer controller DTC), the central processing unit CPU collectively processes these information. By performing data alignment of the results of A/D conversion on a hardware basis upon reading it, the data alignment made by software becomes unnecessary when arithmetic operations are effected on the results of A/D conversion and the previous corrected data. Further, the central processing unit CPU can avoid a reduction in the burden imposed thereon and can be speeded up. The amount of defocus obtained by the previous processing is converted into the quantity of movement (continuous rotational quantity) of the AF motor based on lens information obtained from communications with the lens microcomputer L-MCU or the like. If the quantity of data inputted by the A/D converter is 200 pieces or so, for example, then the number of times in which data is transferred by the data transfer controller DTC, reaches 50.

Since the transfer information is held onto the RAM, the data transfer controller DTC can take an increased number of channels. It is however necessary to read the transfer information from on the RAM before the data transfer, for example. Overheads such as reading of the transfer information from the RAM, etc. can be reduced by using the transfer operation and the block transfer mode, thereby making it possible to improve the entire processing speed of the single chip microcomputer. When moving-body prediction control of focus and the like are performed, for example, the frequency with which the data transfer controller DTC and the central processing unit CPU struggle for a bus right and place restrictions on each other, can be reduced when the detection of focus by the optoelectric transducer, the A/D converter and the data transfer controller DTC and the arithmetic operation of focus by the central processing unit CPU based on the previous result of detection are performed in an overlapped state. Thus, the entire processing performance can be improved.

The interface circuit includes a timing circuit and the like provided thereinside and instructs the optoelectric transducer to transfer the result of conversion. When the BUSY signal is in an active state, the interface circuit serves so as to avoid such a transfer instruction.

FIG. 34 shows an address map for reading addresses from the A/D converter by the data transfer controller DTC under the block transfer mode thereof. The data transfer controller DTC sets the leading addresses of the RAM, for storing addresses of a data register ADDRA in a source address register SAR and storing the result of conversion in a destination address register DAR. Further, a block transfer mode in which the source side is regarded as a block area, is designated. An address counter designates or specifies increment. A word size is designated as a data size so as to obtain a 10-bit resolution. A block counter sets 4. A transfer counter designates a predetermined number (N), e.g., 50 in the previous example.

The A/D converter allows an A/D conversion interrupt and sets a DTE bit to "1" to make a request to start the data transfer controller DTC. The A/D converter A/D-converts the AIN0 input using the transfer operation. When the A/D conversion operation is performed four times, the data transfer controller DTC is started up in response to an A/D conversion operation end interrupt so as to respectively continuously transfer data from the data register ADDRA to a first address of the RAM, from the data register ADDRB to a second address of the RAM, from the data register ADDRC to a third address of the RAM and from the data register ADDRD to a fourth address of the RAM. Thereafter, the above interrupt factor flag is automatically cleared to "0". With the repetition of this processing by a specified number of times (N), the DTE bit is finally cleared to "0" without clearing the interrupt factor flag to "0", whereby the data transfer controller DTC requires the central processing unit CPU to make the A/D conversion end interrupt. The central processing unit CPU can collectively process all the results of conversion.

An A/D conversion end interrupt interval can be set to 80 states (20 states×4) or more. Overheads (reading/writing of the register information on the RAM) can be eliminated by relaxing the frequency of starting up of the data transfer controller DTC and the start-up interval thereof. Further, controls on the competition with other bus masters can be relaxed. Even when the central processing unit CPU reads the result of conversion in accordance with the interrupt processing or the like without using the data transfer controller DTC, overheads such as exceptional processes, a return command, etc. can be reduced, thereby making it possible to improve throughput of the entire system.

Figure 35:
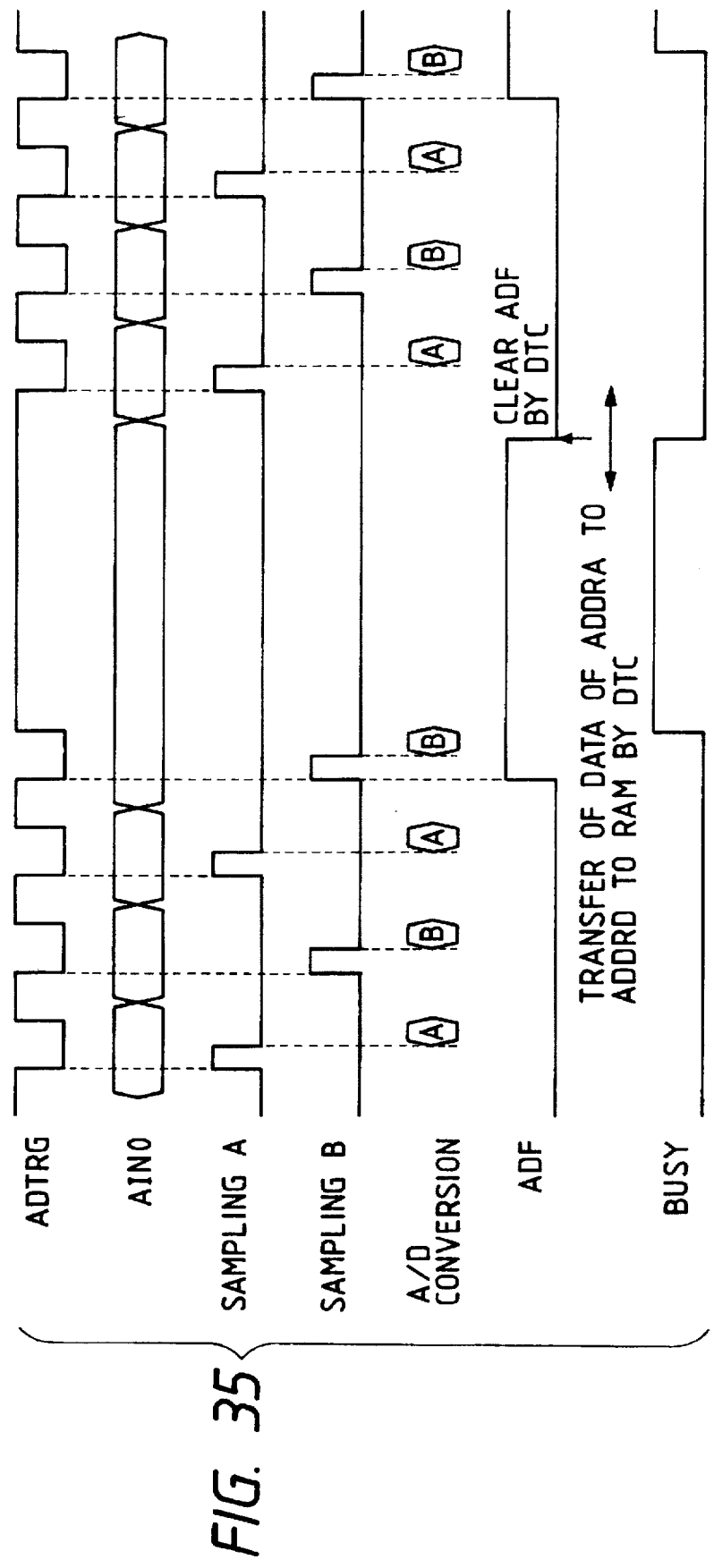
FIG. 35 is a timing chart for reading addresses from the A/D converter by the data transfer controller shown in FIG. 34 under the block transfer mode.

FIG. 35 is a timing chart for reading data from the A/D converter by the data transfer controller in the block transfer mode. When a sampling operation for A/D conversion that brings a buffer into a full condition (brings all the data registers ADDRA through ADDRH into a state of having stored A/D-converted data therein), is performed, a BUSY signal is brought into an active state. When the data transfer controller DTC or the central processing unit CPU reads the result of conversion and clears an ADF flag to "0", the BUSY signal is brought into an inactive state.

While the BUSY signal is being monitored by the external interface circuit, for example, the optoelectric transducer can be deactivated and the occurrence of triggering based on an ADTRG signal can be prevented when the BUSY signal is active. Thus, no failure to A/D-convert each analog input occurs. By continuously supplying the analog inputs when the A/D converter is in an operation enable state and stopping the supply of the analog inputs when the A/D converter is in an operation standby state, each analog input can be optimized. Namely, the delayed one no needs tuning.

Operations and effects obtained from the aforementioned embodiments are as follows:

(1) The A/D conversion can be speeded up by flash conversion made by 2 bits. Further, the division or fractioning of a voltage of a reference voltage generating circuit by high-order, intermediate-order and low-order D/A converters (voltage divider circuits) and a D/A converter (voltage divider circuit) in a circuit can reduce the number of resistances and a physical scale.

(2) A pipeline operation can be effectively utilized by performing the by-2 bits flash conversion to speed up the A/D conversion operation and equalizing the time for the A/D conversion operation to a sampling time. Namely, this is because the sampling time cannot be made shorter than a predetermined time to avoid a reduction in the sampling accuracy and a pipeline effect is less even if the A/D conversion time is made faster that this.

(3) An A/D converter has a plurality of sets of sample-to-hold circuits and comparators. In a first step, a first sampling is carried out. In a second step, A/D conversion is made using the first sample-to-hold circuit and comparator and a second sampling is performed. In a third step, A/D conversion is made using the second sample-to-hold circuit and comparator and a first sampling relative to a third channel is made. In doing so, the time between the commencement of the A/D conversion operation and the completion of conversion of all the designated channels can be shortened. Thus, the accuracy of measurement of a plurality of analog input signals in which the frequencies of their variations are high, can be improved.

(4) Since the operation of the A/D converter can be externally detected by outputting a BUSY signal in a state in which the contents of each data register for storing the result of A/D conversion therein have been not yet read, analog inputs can be successively supplied when the A/D converter is in an operation enable state and the analog inputs can be placed in a waiting state when the A/D converter is in an operation disable state (when the data register is full), thereby making it possible to perform the optimum operation of the A/D converter. Thus, the entire processing performance is not lowered from the viewpoint of margins.

(5) Since a central processing unit CPU and a data transfer controller DTC judge a data size (byte or word) at the time of reading data from the corresponding data register, automatically select read resolution and make alignment of read data (bring the least significant bit to be read to the least significant bit of a data bus or a register in the CPU), a burden imposed on software can be reduced. Thus, since it is unnecessary for the CPU to perform a shift process or detect an overflow or the like, the entire processing performance of single chip microcomputer can be improved.

(6) Since A/D conversion is automatically started after a standby time upon commencement of the A/D conversion at the time of PWR="0" (upon low-speed start), no burden is imposed on the central processing unit CPU and less current consumption can be provided. Less power consumption can be further provided by returning the central processing unit CPU to a less power consumption state after completion of the A/D conversion.

(7) Upon commencement of the A/D conversion at the time of PWR="1" (upon high-speed start), the time between the instruction of the A/D conversion start and the completion of the sampling can be shortened and the accuracy of measurement of each input can be improved. Further, the time up to the completion of the A/D conversion can reduced to improve the processing performance and a real-time property can be improved. Since the standby time can be set up by the central processing unit CPU, the standby time can be optimized in accordance with an absolute time.

(8) Allowing the switching between the high-speed start and the low-speed start can cope with various using methods and can provide ease of usage.

(9) A reference voltage generating circuit and a control circuit can be placed under common use by providing two A/D converters, thereby making it possible to reduce a physical scale. Correspondingly, less current consumption can be provided.

(10) The processing performance of the entire system can be improved by enabling the execution of the A/D conversion during an A/D conversion time equivalent to the number of command execution states of the central processing unit and making it easy to read and process the result of conversion.

(11) An A/D converter incorporated in a single chip microcomputer can respond to diverse applications. Further, the A/D conversion and reading at each input channel can be diversely done.

The invention made by the present inventors has been described specifically by the embodiments. However, the invention of the present application is not necessarily limited to the aforementioned embodiments. It is needless to say that many changes and modifications can be made without departing the scope of the invention. For example, the number of analog input channels is not necessarily limited to 8 but may be set to 16, for example. The number of data registers may be set to desired numbers. Various changes can be made even to an operation mode and the configuration of each control register.

It is unnecessary to provide a plurality of sample-to-hold circuits, for example. Further, the width of data to be read is not necessarily limited to a 9/16 bit. A desired bit width may be set. It is however necessary to define or determine an output format and condition of data with respect to the desired bit width. Since the control circuit performs only one A/D conversion operation at a time as described above, the comparator array may be provided commonly to a plurality of sample-to-hold/level shift circuits in FIG. 2. Namely, the output of each sample-to-hold/level shift circuit may be time-divisionally transferred to the common comparator array through switches.

It is desirable that each of the comparator arrays is provided in a one-to-one correspondence with the sample-to-hold/level shift circuit as in the case of the above embodiment in order to perform an A/D conversion operation with high accuracy. This is because since an input signal is held by a capacitor having a relatively low capacitance value, which is formed in a semiconductor integrated circuit, the level of the input signal compared with a parasitic capacitance between the capacitor and the comparator array by charge distribution varies when the value of the parasitic capacitance therebetween increases. When the capacitance value of the capacitor is increased, an area to be occupied increases correspondingly and time is spent in taking in the input signal, thus causing interference with a high-speed sampling operation.

No restrictions are imposed on other functional blocks of a single chip microcomputer. Various changes can be made to configurations of a timer and a data transfer controller in conformity of an application system. It is needless to say that the application system is not limited to motor control, the automatic detection of camera's focus, etc.

The above description has been made of the case where the invention made by the present inventors has been principally applied to the single chip microcomputer used in the field of the utilization which leads to the background thereof. The present invention is not necessarily limited to this case. The invention can be also applied to other semiconductor integrated circuit device or data processing unit. The present invention can be widely used at least in a semiconductor integrated circuit device incorporating a data transfer processing unit such as a CPU and an A/D converter therein and a control system using the semiconductor integrated circuit device.

Advantageous effects obtained by typical ones of the invention disclosed in the present application will be briefly described as follows: (1) In a semiconductor integrated circuit device having an A/D converter incorporated therein, a plurality of input channels are provided and analog signals input to the input channels are held by a plurality of sample-to-hold circuits. In this condition, the simultaneous sampling is performed by using both a pipeline operation that the analog signals held by performing a first sampling are A/D-converted and the analog signals sampled by performing a second sampling are next A/D-converted and the plurality of sample-to-hold circuits. Since the A/D converter can perform parallel processing on a plurality of input data and effectively eliminate a sampling time by performing such a pipeline process, an A/D conversion operation can be speeded up when the plurality of analog input signals are continuously A/D-converted. By simultaneously holding the plurality of analog input signals and thereafter successively A/D-converting them, the reliability of a control operation that relative values of a plurality of analog values are regarded as important, can be increased without increasing a circuit scale.

(2) In the semiconductor integrated circuit device having the A/D converter incorporated therein, the A/D converter has a normal mode for performing an A/D conversion operation immediately in response to a start-up signal and a standby mode for causing only the necessary minimum bias current to flow and performing an A/D conversion operation after the elapse of a predetermined time interval between the input of the start-up signal and its stable operation. Thus, less power consumption can be provided by a reasonable A/D conversion operation commensurate with a converted input signal without imposing any burden on a central processing unit CPU.

(3) In the semiconductor integrated circuit device incorporating the A/D converter therein, the result of A/D conversion can be efficiently captured Without imposing any burden on the central processing unit CPU by bringing data outputted to an internal bus into alignment with the most significant bit so as to correspond to an internal bus upon reading the result of A/D conversion.

(4) In the semiconductor integrated circuit device having the A/D converter incorporated therein, when a repeated conversion operation is performed, the mutual relationship between a plurality of converted data can be maintained by stopping a new A/D conversion operation till the completion of the reading of data about the result of A/D conversion when the repeated A/D conversion operation is made.

What is claimed is:

1. A motor control system comprising:
   a three-phase motor having Y-connection or Δ-connection windings;
   an inverter circuit coupled to the three-phase motor and providing drive current to the three-phase motor in response to complementary three-phase PWM signals;
   a current detector detecting the drive current on first and second phases of the three-phase motor;
   a single chip microcomputer providing the complementary three-phase PWM signals, the single-chip microcomputer comprising:
      at least first and second analog input terminals coupled to receive first and second outputs of the current detection circuit;

an A/D converter including:
   at least first and second sample-to-hold circuits receiving first and second analog input signals from the first and second analog input terminals;
   a control circuit controlling the first and second sample-to-hold circuits to perform sampling operations such that a sampling period of the first sample-to-hold circuit overlaps with a sampling period of the second sample-to-hold circuit; and
   an A/D converting unit for converting analog signals held by the first and second sample-to-hold circuits into digital signals, respectively;
an internal bus, and
a central processing unit coupled to the A/D converting unit through the internal bus, wherein the central processing unit reads the digital signals and calculates the drive current on a third phase of the three-phase motor, wherein the central processing unit controls the three-phase motor by controlling the complementary three-phase PWM signals.

2. A motor control system according to claim 1, wherein the A/D converter further comprises:
   comparator arrays each comparing the input analog signal held in the first and second sample-to-hold circuits with reference voltages,
   a sequential compare register supplied with a binary-value signal corresponding to an output of the corresponding comparator array,
   a D/A converting unit for converting output of the sequential compare register into an analog voltage, wherein analog voltages from the D/A converting unit are used to form the reference voltages, and
   wherein the control circuit is coupled to the comparator arrays, the sequential compare register and the D/A converting unit, and
   wherein the control circuit successively performs:
      a first operation for sampling first and second input signals by the first and second sample-to-hold circuits by the sampling operations;
      a second operation for converting the first input signal taken in the first sample-to-hold circuit under the first operation into a digital signal by the A/D converter; and
      a third operation for converting the second input signal taken in the second sample-to-hold circuit under the first operation into a digital signal by the A/D converter.

3. A motor control system according to claim 2, wherein the A/D converter further includes high-order, middle-order and low-order reference voltage generating circuits for generating the reference voltages, the high-order reference voltage generating circuit generating an output-to-output voltage regarded as a reference voltage of a local voltage-dividing circuit forming the middle-order reference voltage generating circuit, and the middle-order reference voltage generating circuit generating an output-to-output voltage regarded as a reference voltage of a local voltage-divided circuit forming the low-order reference voltage generating circuit,
wherein the first and second sample-to-hold circuits respectively include level shift circuits for levelshifting input signals captured in specific subrange regions in response to the output of the high-order reference voltage generating circuit,
wherein each of the comparator arrays includes a plurality of comparators and a selection circuit, the plurality of comparators respectively comparing the output of each of the first and second sample-to-hold circuits with a plurality of reference voltages corresponding to digital values associated with upper, middle and lower voltages outputted from the selection circuit, and
wherein output signals of the comparators are respectively converted into binary signals and stored in the sequential compare register, wherein an output-to-output voltage supplied from the middle-order reference voltage generating circuit to the low-order reference voltage generating circuit is selected in accordance with the contents of the sequential compare register.

4. A motor control system according to claim 3, wherein the A/D converter further includes:
   data registers for storing the results of A/D conversion by the A/D converting unit; and
   means for detecting whether the data registers are full and outputting the result of the detection outside of the A/D converter.

5. A control system comprising:
   a three-phase motor having Y-connection or Δ-connection windings,
   a semiconductor integrated circuit device including:
      a plurality of analog input terminals;
      an A/D converter comprising at least first and second sample-to-hold circuits receiving at least first and second analog signals on the plurality of analog input terminals,
      a control circuit controlling the at least first and second sample-to-hold circuits to perform a sampling of the at least first and second analog signals such that sampling periods of the at least first and second sample-to-hold circuits overlap, and
      an A/D converting unit for converting the analog signals sampled by the sample-to-hold circuits into digital signals respectively;
      an internal bus; and
      a central processing unit coupled to the A/D converter through the internal bus,
   wherein the semiconductor integrated circuit device forms desired control signals for controlling rotation of the motor based on digital signals corresponding to the two or more analog input signals sampled by the at least first and second sample-to-hold circuits,
   wherein the analog input signals correspond to drive currents of first and second phases of the motor, and
   wherein the semiconductor integrated circuit device controls first, second and third phase drive currents of the motor based on the digital signals corresponding to the drive currents of the first and second phases of the motor.

6. A control system according to claim 5, wherein the semiconductor integrated circuit device includes timer circuits which respectively output signals for specifying timing for the sampling operation.

* * * * *

UNITED STATES PATENT AND TRADEMARK OFFICE
CERTIFICATE OF CORRECTION

PATENT NO. : 5,736,948
DATED : April 7, 1998
INVENTOR(S) : Naoki Mitsuishi; Hiroyuki Kobayashi; Hiroshi Saito; Mitsumasa Satoh It is certified that error appears in the above-identified patent and that said Letters Patent is hereby corrected as shown below:

Column 36, line 67, delete "detection circuit" and insert --detector--.

Signed and Sealed this

Twenty-eighth Day of July, 1998

Attest:

BRUCE LEHMAN

Attesting Officer                Commissioner of Patents and Trademarks